(12) United States Patent
Kodama et al.

(10) Patent No.: US 7,919,849 B2
(45) Date of Patent: Apr. 5, 2011

(54) PACKAGE SUBSTRATE AND DEVICE FOR OPTICAL COMMUNICATION

(75) Inventors: Hiroaki Kodama, Ibi-gun (JP);
 Kazuhito Yamada, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 795 days.

(21) Appl. No.: 11/696,436

(22) Filed: Apr. 4, 2007

(65) Prior Publication Data

US 2008/0247704 A1    Oct. 9, 2008

(51) Int. Cl.
 *H01L 23/04* (2006.01)
 *H01L 29/22* (2006.01)

(52) U.S. Cl. .......................................... 257/698; 257/98

(58) Field of Classification Search .............. 257/80–84, 257/98, 686, 698, 700–703, 778, E25.012, 257/25.013, E25.013
 See application file for complete search history.

(56) References Cited

U.S. PATENT DOCUMENTS

| | | | |
|---|---|---|---|
| 6,838,702 B1 * | 1/2005 | Ho | 257/79 |
| 6,858,872 B2 * | 2/2005 | Kondo | 257/80 |
| 7,009,195 B2 * | 3/2006 | Nakano et al. | 250/551 |
| 7,070,207 B2 | 7/2006 | Asai | |
| 2005/0185880 A1 | 8/2005 | Asai | |
| 2006/0012967 A1 | 1/2006 | Asai et al. | |
| 2006/0263003 A1 | 11/2006 | Asai et al. | |

FOREIGN PATENT DOCUMENTS

| | | |
|---|---|---|
| JP | 2002-329891 | 11/2002 |
| JP | 2006-91744 | 4/2006 |

OTHER PUBLICATIONS

U.S. Appl. No. 11/763,670, filed Jun. 15, 2007, Kodama, et al.
U.S. Appl. No. 11/623,923, Jan. 17, 2007, Kodama, et al.
U.S. Appl. No. 11/693,188, Mar. 29, 2007, Kodama, et al.
U.S. Appl. No. 11/696,434, filed Apr. 4, 2007, Kodama, et al.
U.S. Appl. No. 11/733,361, filed Apr. 10, 2007, Asai, et al.
U.S. Appl. No. 11/737,792, filed Apr. 20, 2007, Asai, et al.
U.S. Appl. No. 11/750,625, filed May 18, 2007, Yamada, et al.

* cited by examiner

*Primary Examiner* — Hung Vu
(74) *Attorney, Agent, or Firm* — Oblon, Spivak, McClelland, Maier & Neustadt, L.L.P.

(57) ABSTRACT

A package substrate includes a laminated body having a conductor circuit and an insulating layer formed and laminated, solder resist layers formed and laminated on both sides of the laminated body, respectively, an optical element, and an optical path for transmitting an optical signal. One or more of the solder resist layers formed and laminated on the laminated body is an outermost layer which has a transmittance for light having a wavelength for communication of about 60% or more at a thickness of 30 μm.

39 Claims, 20 Drawing Sheets

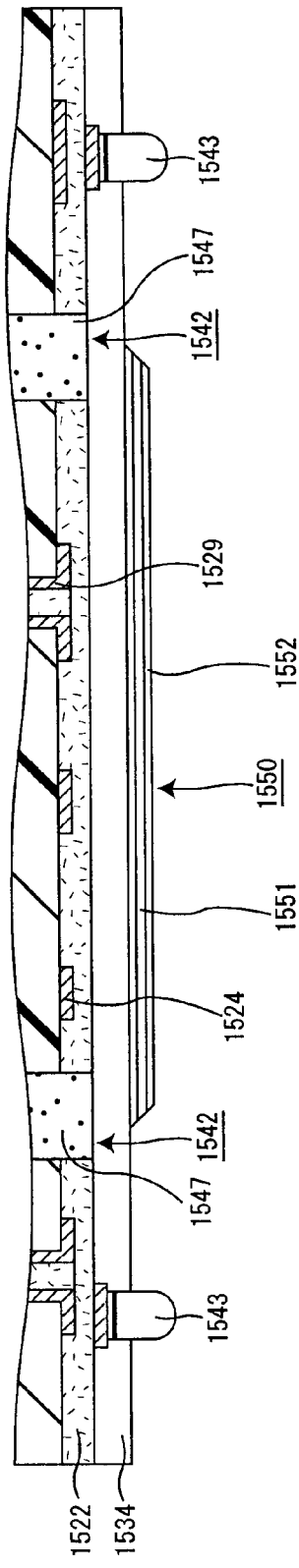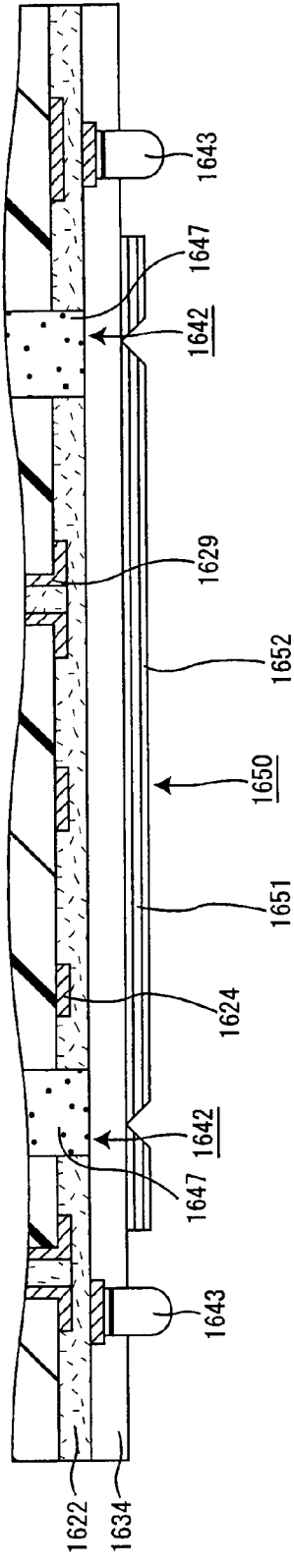
Fig. 9A
Fig. 9B

PACKAGE SUBSTRATE AND DEVICE FOR OPTICAL COMMUNICATION

CROSS-REFERENCE TO RELATED APPLICATIONS

This application relates to JP-A 2006-91744 published on Apr. 6, 2006. The contents of this application are incorporated herein by reference in their entirety.

BACKGROUND OF THE INVENTION

1. Field of the Invention

The present invention relates to a package substrate and a device for optical communication.

2. Discussion of the Background

In recent years, optical fibers have been drawing attention mainly in the telecommunications field. In particular, in the field of IT (information technology), communication technology using optical fibers has been necessary for the development of high-speed Internet networks.

Then, it has been proposed for such network communication, including the Internet, that optical communication using optical fibers be used for communication between a basic network and terminal devices (personal computers, mobile devices, games and the like) and communication between terminal devices, in addition to communication in a basic network.

The present applicant has previously proposed a substrate for mounting an IC chip where a conductor circuit and an insulating layer are formed and laminated on both sides of a substrate, solder resist layers are formed as outermost layers, an optical element is mounted, and an optical path for transmitting an optical signal is formed so as to penetrate through this substrate for mounting an IC chip, as a substrate for mounting an IC chip that can be used in a terminal apparatus for optical transmitter/receiver system as those described above (see for example JP-A 2002-329891).

The contents of JP-A 2002-329891 are incorporated herein by reference in their entirety.

SUMMARY OF THE INVENTION

A package substrate of the present invention comprises: at least a conductor circuit and an insulating layer formed and laminated to form a laminated body; at least one solder resist layer further formed and laminated on both sides of the laminated body; an optical element; and an optical path for transmitting an optical signal, wherein at least one outermost layer of the solder resist layers formed and laminated on the laminated body has a transmittance for light having a wavelength for communication of about 60% or more at a thickness of 30 µm.

In the above-described package substrate, desirably, a refractive index of the solder resist layer having a transmittance for light having a wavelength for communication of about 60% or more at a thickness of 30 µm and a refractive index of the optical path for transmitting an optical signal are almost the same.

In the above-described package substrate, desirably, the solder resist layer has a thickness of at least about 10 µm and at most about 40 µm.

In the above-described package substrate, desirably, the solder resist layer having a transmittance for light having a wavelength for communication of about 60% or more at a thickness of 30 µm contains inorganic particles. Here, desirably, the inorganic particles comprise silica, titania, or alumina.

In the above-described package substrate, desirably, the solder resist layer is formed by using a solder resist composition comprising at least one kind selected from the group consisting of a polyphenylene ether resin, a polyolefin resin, a fluorine resin, a thermoplastic elastomer, an epoxy resin, a polyimide resin and an acrylic resin, as a resin component.

In the above-described package substrate, desirably two or more solder resist layers are formed and laminated per one side of the laminated body.

In the above-described package substrate, desirably, two or more solder resist layers are formed and laminated per one side of the laminated body, the outermost solder resist layers have a transmittance for light having a wavelength for communication of about 60% or more at a thickness of 30 µm, and the optical path for transmitting an optical signal is formed in the solder resist layers except the outermost solder resist layer so as to penetrate through the solder resist layers.

In the above-described package substrate, desirably, the solder resist layers formed and laminated as the outermost layer on both sides of the laminated body have a transmittance for light having a wavelength for communication of about 60% or more at a thickness of 30 µm.

In the above-described package substrate, desirably, the laminated body comprises a substrate; and the conductor circuit and the insulating layer formed and laminated on both sides of the substrate, the conductor circuits having the substrate therebetween are connected to each other via a through hole, the conductor circuits formed and laminated on the insulating layer, and the conductor circuits having the insulating layer therebetween are connected to each other via a via hole.

A package substrate of the present invention comprises: at least a conductor circuit and an insulating layer formed and laminated to form a laminated body; at least one solder resist layer further formed and laminated on both sides of the laminated body; an optical element; and an optical path for transmitting an optical signal, wherein a gap between the optical element and the solder resist layer is filled in with an underfill, and at least one outermost layer of the solder resist layers formed and laminated on the laminated body has a transmittance for light having a wavelength for communication of about 60% or more at a thickness of 30 µm.

In the above-described package substrate, desirably, the underfill has a transmittance for light having a wavelength for communication of about 70%/mm or more.

In the above-described package substrate, desirably, the outermost solder resist layer formed and laminated on the side where the optical element is mounted has a transmittance for light having a wavelength for communication of about 60% or more at a thickness of 30 µm, and a refractive index of the outermost solder resist layer and a refractive index of the underfill are almost the same.

In the above-described package substrate, desirably particles are mixed in the underfill. Here, an amount of the mixed particles is at least about 20% by weight and at most about 70% by weight.

In the above-described package substrate, desirably, both of the outermost solder resist layers formed and laminated on the laminated body have a transmittance for light having a wavelength for communication of about 60% or more at a thickness of 30 µm.

A package substrate of the present invention comprises: at least a conductor circuit and an insulating layer formed and laminated to form a laminated body; at least one solder resist layer further formed and laminated on both sides of the laminated body; an optical element; and an optical path for transmitting an optical signal, wherein an end portion of the optical path for transmitting an optical signal is covered with the solder resist layer, and at least one outermost layer of the solder resist layers formed and laminated on the laminated body has a transmittance for light having a wavelength for communication of about 60% or more at a thickness of 30 μm.

In the above-described package substrate, desirably, the optical path for transmitting an optical signal has a collective through hole structure, an individual through hole structure, or a recess shape.

In the above-described package substrate, desirably, the optical path for transmitting an optical signal has a transmittance for light having a wavelength for communication of about 70%/mm or more.

In the above-described package substrate, desirably, a conductor layer is formed on the wall surface of the optical path for transmitting an optical signal.

In the above-described package substrate, desirably, the optical path for transmitting an optical signal has a collective through hole structure, and a planar shape of the optical path for transmitting an optical signal is an almost rectangle, an almost racetrack or an almost ellipse, the planar shape having a size of at least about 100 μm and at most about 5 mm with respect to each of the length and width thereof.

In the above-described package substrate, desirably, the optical path for transmitting an optical signal has an individual through hole structure, and a planar shape of the optical path for transmitting an optical signal is an almost circle with a diameter of at least about 100 μm and at most about 500 μm.

In the above-described package substrate, desirably the optical element is a multi-channel optical element having a pitch between respective channels of 250 μm, the optical path for transmitting an optical signal has the individual through hole structure, and the planar shape of the optical path for transmitting an optical signal is an almost circle with a diameter of at least about 150 μm and at most about 200 μm in diameter.

In the above-described package substrate, desirably, the optical element is a multi-channel optical element having a pitch between respective channels of 500 μm, the optical path for transmitting an optical signal has the individual through hole structure, and the planar shape of the optical path for transmitting an optical signal is an almost circle having a size of at least about 150 μm and at most about 450 μm in diameter In the above-described package substrate, desirably, the solder resist layers formed and laminated as the outermost layer on both sides of the laminated body have each a transmittance for light having a wavelength for communication of about 60% or more at a thickness of 30 μm.

A package substrate of the present invention comprises: at least a conductor circuit and an insulating layer formed and laminated to form a laminated body; at least one solder resist layer further formed and laminated on both sides of the laminated body; an optical element; and an optical path for transmitting an optical, wherein a portion or the entirety of the optical path for transmitting an optical signal is formed of a resin composite, an end portion of the optical path for transmitting an optical signal is covered with the solder resist layer, and at least one outermost layer of the solder resist layers formed and laminated on the laminated body has a transmittance for light having a wavelength for communication of about 60% or more at a thickness of 30 μm.

In the above-described package substrate, desirably, the optical path for transmitting an optical signal has a transmittance for light having a wavelength for communication of about 70%/mm or more.

In the above-described package substrate, desirably, both of the outermost solder resist layers formed and laminated on the laminated body have a transmittance for light having a wavelength for communication of about 60% or more at a thickness of 30 μm.

A package substrate of the present invention comprises: at least a conductor circuit and an insulating layer formed and laminated to form a laminated body; at least one solder resist layer further formed and laminated on both sides of the laminated body; an optical element; and an optical path for transmitting an optical signal, wherein at least one outermost layer of the solder resist layers formed and laminated on the laminated body has a transmittance for light having a wavelength for communication of about 60% or more at a thickness of 30 μm, and a microlens is provided on the solder resist layer having a transmittance for light having a wavelength for communication of about 60% or more at a thickness of 30 μm.

In the above-described package substrate, desirably, the solder resist layer having a transmittance for light having a wavelength for communication of about 60% or more at a thickness of 30 μm is formed and laminated as the outermost layer on the opposite side of the side where the optical element is mounted, and the microlens is provided on the solder resist layer.

In the above-described package substrate, desirably, the microlens has a transmittance for light having a wavelength for communication of about 70%/mm or more.

In the above-described package substrate, desirably, the solder resist layer having a transmittance for light having a wavelength for communication of about 60% or more at a thickness of 30 μm is formed and laminated as the outermost layer on the side where the optical element is mounted, a gap between the optical element and the solder resist layer is filled in with an underfill, and a refractive index of the microlens is greater than a refractive index of the underfill.

In the above-described package substrate, desirably, the microlens is provided on the solder resist layer directly or by interposing an adhesive agent.

In the above-described package substrate, desirably, the microlens is provided on the solder resist layer by interposing a lens marker processed with a water repellent treatment or a hydrophilic treatment.

In the above-described package substrate, desirably, the optical element is a multi-channel optical element having a pitch between respective channels of 250 μm, the optical path for transmitting an optical signal has a collective through hole structure, and the diameter of the microlens is at least about 100 μm and at most about 240 μm.

In the above-described package substrate, desirably, the optical element is a multi-channel optical element having a pitch between respective channels of 500 μm, the optical path for transmitting an optical signal has a collective through hole structure, and the diameter of the microlens is at least about 100 μm and at most about 490 μm.

In the above-described package substrate, desirably, the optical element is a multi-channel optical element having a pitch between respective channels of 250 μm, the optical path for transmitting an optical signal has an individual through hole structure, and the diameter of the microlens is at least about 100 μm and at most about 190 μm.

In the above-described package substrate, desirably the optical element is a multi-channel optical element having a pitch between respective channels of 500 μm, the optical path for transmitting an optical signal has an individual through hole structure, and the diameter of the microlens is at least about 100 µm and at most about 490 µm.

In the above-described package substrate, desirably, both of the outermost solder resist layers formed and laminated as the outermost layer on the laminated body have a transmittance for light having a wavelength for communication of about 60% or more at a thickness of 30 µm.

A device for optical communication of the present invention comprises: a substrate for a motherboard comprising at least a conductor circuit and an insulating layer formed and laminated to form a laminated body, at least one solder resist layer further formed and laminated at least on one side of the laminated body, an optical path for transmitting an optical signal, and an optical waveguide; and a package substrate having an optical element mounted thereon and/or an optical element, the package substrate and/or the optical element mounted on the substrate for a motherboard, wherein at least one outermost layer of the solder resist layers formed and laminated on the laminated body has a transmittance for light having a wavelength for communication of about 60% or more at a thickness of 30 µm In the above-described device for optical communication, desirably, a refractive index of the solder resist layer having a transmittance for light having a wavelength for communication of about 60% or more at a thickness of 30 µm and a refractive index of the optical path for transmitting an optical signal are almost the same.

In the above-described device for optical communication, desirably, the solder resist layer has a thickness of at least about 10 µm and at most about 40 µm.

In the above-described device for optical communication, desirably, the solder resist layer having a transmittance for light having a wavelength for communication of about 60% or more at a thickness of 30 µm contains inorganic particles. Here, desirably, the inorganic particles comprise silica, titania, or alumina.

In the above-described device for optical communication, desirably, the solder resist layer is formed by using a solder resist composition comprising at least one kind selected from the group consisting of a polyphenylene ether resin, a polyolefin resin, a fluorine resin, a thermoplastic elastomer, an epoxy resin, a polyimide resin and an acrylic resin, as a resin component.

In the above-described device for optical communication, desirably, two or more solder resist layers are formed and laminated per one side of the laminated body.

In the above-described device for optical communication, desirably, two or more solder resist layers are formed and laminated per one side of the laminated body, the outermost solder resist layer has a transmittance for light having a wavelength for communication of about 60% or more at a thickness of 30 µm, and the optical path for transmitting an optical signal is formed in the solder resist layers except the outermost solder resist layer so as to penetrate through the solder resist layers.

In the above-described device for optical communication, desirably, a solder resist layer is formed and laminated on both sides of the laminated body, and both of the outermost solder resist layers formed and laminated on the laminated body have a transmittance for light having a wavelength for communication of about 60% or more at a thickness of 30 µm.

In the above-described device for optical communication, desirably, the laminated body comprises a substrate; and the conductor circuit and the insulating layer formed and laminated on both sides of the substrate, the conductor circuits having the substrate therebetween are connected to each other via a through hole, the conductor circuits formed and laminated on the insulating layer, and the conductor circuits having the insulating layer therebetween are connected to each other via a via hole.

In the above-described device for optical communication, desirably, an optical signal is transmitted between the package substrate's having an optical element mounted thereon, between the optical elements, or between the package substrate having an optical element mounted thereon and the optical element, the package substrates and/or the optical elements mounted on the substrate for a motherboard.

Moreover, in the above-described device for optical communication, desirably, an optical signal is transmitted with an external substrate (other device for optical communication).

In the above-described device for optical communication, desirably, the package substrate having an optical element mounted thereon is mounted, and the optical path for transmitting an optical signal is formed in the package substrate.

In the above-described device for optical communication, desirably, the optical path for transmitting an optical signal has a collective through hole structure or an individual through hole structure.

A device for optical communication of the present invention comprises: a substrate for a motherboard comprising at least a conductor circuit and an insulating layer formed and laminated to form a laminated body, at least one solder resist layer further formed and laminated on both sides of the laminated body, an optical path for transmitting an optical signal, and an optical waveguide; and a package substrate having an optical element mounted thereon and/or an optical element, the package substrate and/or the optical element mounted on the substrate for a motherboard, wherein the optical waveguide is formed on the insulating layer as an outermost layer on the side opposite to the side where the package substrate having an optical element mounted thereon and/or the optical element is mounted, and the outermost solder resist layer formed and laminated on the side where the package substrate having an optical element mounted thereon and/or the optical element is mounted has a transmittance for light having a wavelength for communication of about 60% or more at a thickness of 30 µm.

In the above-described device for optical communication, desirably, a solder resist layer is formed and laminated so as to cover the optical waveguide.

In the above-described device for optical communication, desirably, the optical waveguide is an organic optical waveguide. In this case, desirably, the optical waveguide is a multimode optical waveguide constituted by a core portion and a clad portion, and a thickness and a width of the core portion are each set to at least about 20 µm and at most about 80 µm.

In the above-described device for optical communication, desirably, the optical waveguide is a multimode optical waveguide, and a material of the optical waveguide comprises an acryl resin, an epoxy resin, or an ultraviolet curing resin.

In the above-described device for optical communication, desirably, particles are mixed in the optical waveguide. Here, the particles comprise desirably silica, titania, or alumina. Moreover, a particle diameter of the particles is desirably at least about 0.01 µm and at most about 0.8 µm, and an amount of the mixed particles is desirably at least about 20% by weight and at most about 70% by weight.

Furthermore, when the particles are mixed in the optical waveguide, desirably, the optical waveguide is constituted by a core portion and a clad portion, and the particles are mixed only in the clad portion.

In the above-described device for optical communication, desirably, an optical path conversion mirror is formed in the optical waveguide. Moreover, desirably, a member having an optical path converting portion (optical path conversion member) is placed at front of an end portion of the optical waveguide.

A device for optical communication of the present invention comprises: a substrate for a motherboard comprising at least a conductor circuit and an insulating layer formed and laminated to form a laminated body, at least one solder resist layer further formed and laminated on both sides of the laminated body, an optical path for transmitting an optical signal, and an optical waveguide; and a package substrate having an optical element mounted thereon and/or an optical element, the package substrate and/or the optical element mounted on the substrate for a motherboard, wherein the optical waveguide is formed on the solder resist layer formed and laminated on the side opposite to the side where the package substrate having an optical element mounted thereon and/or the optical element is mounted, and the solder resist layer has a transmittance for light having a wavelength for communication of about 60% or more at a thickness of 30 μm.

In the above-described device for optical communication, desirably, the optical waveguide is an organic optical waveguide. In this case, the optical waveguide is a multimode optical waveguide constituted by a core portion and a clad portion, and a thickness and a width of the core portion are each set to at least about 20 μm and at most about 80 μm.

In the above-described device for optical communication, desirably, the optical waveguide is a multimode optical waveguide, and a material of the optical waveguide comprises an acryl resin, an epoxy resin or an ultraviolet curing resin.

In the above-described device for optical communication, desirably, particles are mixed in the optical waveguide. Here, desirably, the particles comprise silica, titania, or alumina. Moreover, a particle diameter of the particles is desirably at least about 0.01 μm and at most about 0.8 μm, and an amount of the mixed particles is at least about 20% by weight and at most about 70% by weight.

In the case where particles are mixed in the optical waveguide, desirably, the optical waveguide is constituted by a core portion and a clad portion, and the particles are mixed only in the clad portion.

In the above-described device for optical communication, desirably, an optical path conversion mirror is formed in the optical waveguide. Moreover, desirably, a member having an optical path converting portion is placed at front of an end portion of the optical waveguide.

In the above-described device for optical communication, desirably, both of the solder resist layer formed and laminated on both sides of the laminated body have a transmittance for light having a wavelength for communication of about 60% or more at a thickness of 30 μm.

A device for optical communication of the present invention comprises: a substrate for a motherboard comprising at least a conductor circuit and an insulating layer formed and laminated to form a laminated body, at least one solder resist layer further formed and laminated on at least one side of the laminated body, an optical path for transmitting an optical signal, and an optical waveguide; and a package substrate having an optical element mounted thereon and/or an optical element, the package substrate and/or the optical element mounted on the substrate for a motherboard, wherein an end portion of the optical path for transmitting an optical signal is covered with the solder resist layer, and the solder resist layer covering the optical path for transmitting an optical signal has a transmittance for light having a wavelength for communication of about 60% or more at a thickness of 30 μm.

In the above-described device for optical communication, desirably, the optical path for transmitting an optical signal has a collective through hole structure or an individual through hole structure.

In the above-described device for optical communication, desirably, a portion or the entirety of the optical path for transmitting an optical signal is formed of a resin composite.

In the above-described device for optical communication, desirably, the optical path for transmitting an optical signal has a transmittance for light having a wavelength for communication of about 70%/mm or more.

In the above-described device for optical communication, desirably, a solder resist layer is formed and laminated on both sides of the laminated body, and the solder resist layer has a transmittance for light having a wavelength for communication of about 60% or more at a thickness of 30 μm.

A device for optical communication of the present invention comprises: a substrate for a motherboard comprising at least a conductor circuit and an insulating layer formed and laminated to form a laminated body, at least one solder resist layer further formed and laminated on at least one side of the laminated body, an optical path for transmitting an optical signal, and an optical waveguide; and a package substrate having an optical element mounted thereon and/or an optical element, the package substrate and/or the optical element mounted on the substrate for a motherboard, wherein the solder resist layer is formed and laminated at least on the side where the package substrate having an optical element mounted thereon and/or the optical element is mounted, an outermost layer of the solder resist layer has a transmittance for light having a wavelength for communication of about 60% or more at a thickness of 30 μm, and a microlens is provided on the outermost solder resist layer formed and laminated on the side where the package substrate having an optical element mounted thereon and/or the optical element is mounted.

In the above-described device for optical communication, desirably, the microlens has a transmittance for light having a wavelength for communication of about 70%/mm or more.

Also, in the above-described device for optical communication, desirably, the microlens is provided on the solder resist layer directly or by interposing an adhesive agent. Moreover, the microlens is provided on the solder resist layer by interposing a lens marker processed with a water repellent treatment or a hydrophilic treatment.

In the above-described device for optical communication, desirably, the package substrate having an optical element mounted thereon is mounted on the substrate for a motherboard, the package substrate having the solder resist layers as an outermost layer on both side thereof and the optical path for transmitting an optical signal, and both of the outermost solder resist layers, or the solder resist layer on the side where the optical element is mounted, has a transmittance for light having a wavelength for communication of about 60% or more at a thickness of 30 μm.

BRIEF DESCRIPTION OF THE DRAWINGS

FIGS. 9A and 9B are cross-sectional views that schematically show a part of another example of a device for optical communication according to one embodiment of the present invention.

DESCRIPTION OF THE EMBODIMENTS

Figure 1:
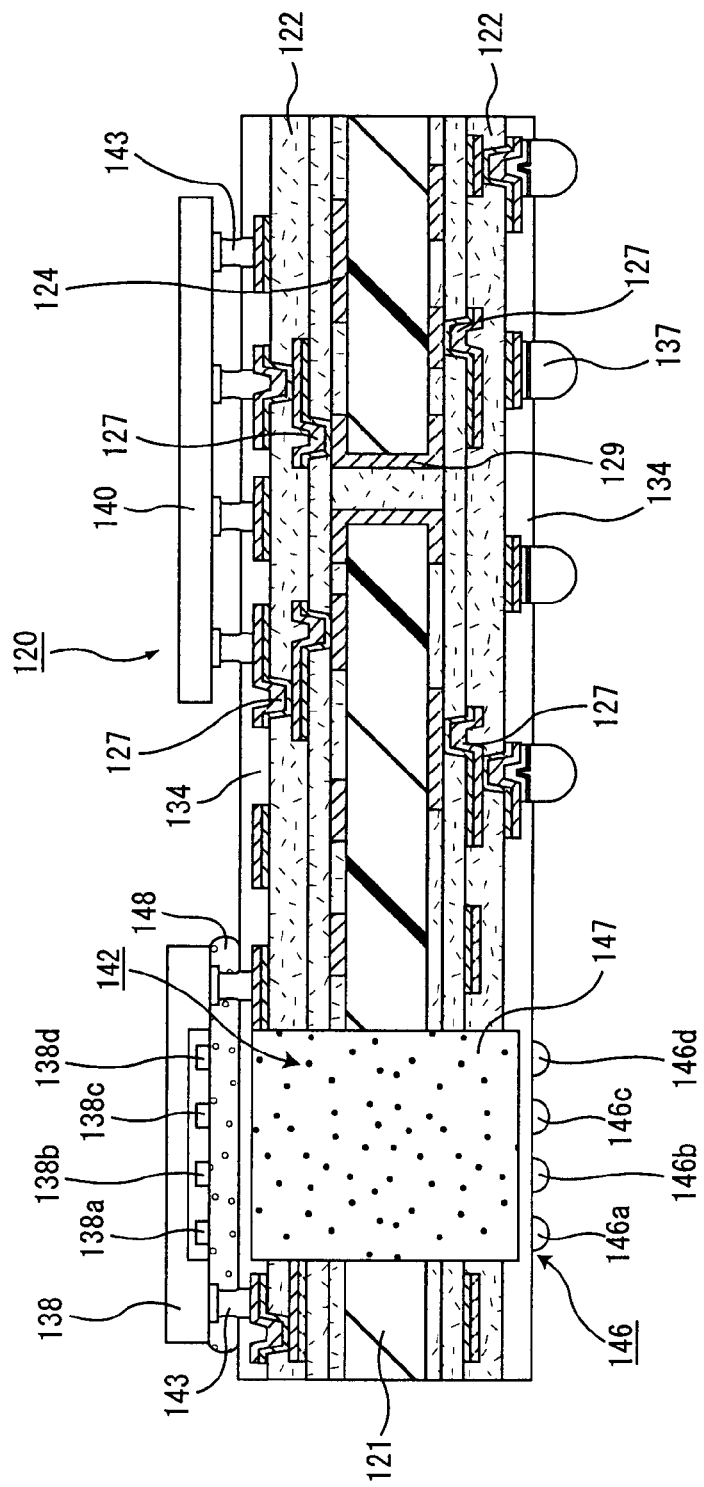
FIG. 1 is a cross-sectional view that schematically shows one example of a package substrate according to one embodiment of the present invention.

The package substrate of the present invention comprises: at least a conductor circuit and an insulating layer formed and laminated to form a laminated body; at least one solder resist layer further formed and laminated on both sides of the laminated body; an optical element; and an optical path for transmitting an optical signal, wherein at least one outermost layer of the solder resist layers formed and laminated on the laminated body has a transmittance for light having a wavelength for communication of about 60% or more at a thickness of 30 μm.

In the package substrate according to the above-described embodiment, an end portion of the optical path for transmitting an optical signal is desirably covered with the above-described solder resist layer.

In the package substrate according to the embodiments of the present invention, the solder resist layer is transparent for light having a wavelength for communication so that a sufficient optical signal can be transmitted, and therefore, it is not necessary to form an optical path for transmitting an optical signal that penetrates through the solder resist layer, and as a result, peeling of the resin composite filled in the optical path for transmitting an optical signal from the insulating layer and the like, or cracking in the resin composite tend not to occur, leading to excellent reliability.

The device for optical communication according to the present invention comprises: a substrate for a motherboard comprising at least a conductor circuit and an insulating layer formed and laminated to form a laminated body, at least one solder resist layer further formed and laminated on at least one side of the laminated body, an optical path for transmitting an optical signal, and an optical waveguide; and a package substrate having an optical element mounted thereon and/or an optical element, the package substrate and/or the optical element mounted on the substrate for a motherboard, wherein at least one outermost layer of the solder resist layers formed and laminated on the laminated body has a transmittance for light having a wavelength for communication of about 60% or more at a thickness of 30 μm.

In the package substrate according to the above-described embodiment, an end portion of the optical path for transmitting an optical signal is desirably covered with the solder resist layer.

In the device for optical communication according to the embodiment of the present invention, the solder resist layer that is formed and laminated on the laminated body is transparent to light having a wavelength for communication, so that an optical signal can be sufficiently transmitted, and therefore, it is not necessary to form an optical path for transmitting an optical signal that penetrates through the solder resist layer, and as a result, peeling of the resin composite filled in the optical path for transmitting an optical signal from the insulating layer and the like, or cracking in the resin composite tend not to occur, achieving excellent reliability.

The following description will discuss a package substrate and a device for optical communication according to embodiments of the present invention mainly with reference to a case, as an example, where the above-mentioned laminated body is a laminated body comprising a substrate, and a conductor circuit and an insulating layer formed and laminated on both sides of the substrate.

First, the following description will discuss a package substrate according to the embodiments of the present invention.

The package substrate according to the embodiment of the present invention comprises: a laminated body including a substrate, and at least a conductor circuit and an insulating layer formed and laminated on both sides of the substrate; and at least one solder resist layer further formed and laminated on both sides of the laminated body, wherein at least one solder resist layer is formed as the outermost layer.

The above-described solder resist layer has a transmittance for light having a wavelength for communication of about 60% or more at a thickness of 30 μm. When the transmittance for light having a wavelength for communication is about 60% or more, loss of the optical signal does not become too great, which is suited for transmission of an optical signal.

More desirably, the transmittance for light having a wavelength for communication at a thickness of 30 μm is set to about 90% or more.

Here, the transmittance for light having a wavelength for communication in the solder resist layer according to the present invention is a transmittance that has been converted through a calculation with respect to the case where the thickness of the solder resist layer is 30 μm. That is to say, this is the value that is calculated through the following equation (1), when light with intensity of $I_1$ comes into a solder resist layer having a thickness of 30 μm, passes through the solder resist layer, and comes out with intensity of $I_2$.

$$\text{Transmittance}(\%) = (I_2/I_1) \times 100 \quad (1)$$

Here, the transmittance for light having a wavelength for communication at a thickness of 30 μm is the transmittance measured at a temperature of 25° C.

The above-described solder resist layer is not particularly limited as long as it has a transmittance within the above-described range, and may be more easily formed by using a solder resist composition including, as a resin component, a polyphenylene ether resin, a polyolefin resin, a fluorine resin, a thermoplastic elastomer, an epoxy resin, a polyimide resin, an acryl resin and the like.

Moreover, a commercially available solder resist composition having a transmittance within the above-described range may be used.

Furthermore, a resin material, that is the same as the resin material used for formation of an optical waveguide in the below-described device for optical communication according to the embodiments of the present invention, may be used for formation of the solder resist layer. Those resin materials used for forming an optical waveguide are excellent in terms of transmission of light having a wavelength for communication, and thus can be used as materials for solder resist layers forming a package substrate according to the embodiments of the present invention.

In addition, inorganic particles comprising, for example, silica, titania, alumina or the like may be mixed with the above-described solder resist composition.

This is because, by mixing the inorganic particle, it becomes easier to arrange the matching and the like of the coefficients of thermal expansion between the solder resist layer with the substrate or the insulating layer. Of course, it does not cause any problem, if inorganic particles are not mixed It is desirable for the lower limit of the thickness of the above-described solder resist layer to be about 10 μm, and more desirably about 15 μm. Meanwhile, it is desirable for the upper limit thereof to be about 40 μm, and more desirably about 30 μm.

This is because, when the thickness of the solder resist layer is set within the above-described range, the functions as a solder resist layer may be surely carried out more easily, and also transmission of optical signals may be sufficiently secured more easily.

The number of the solder resist layer may be at least one layer, and may be two or more layers.

In addition, in the case where two or more solder resist layers are included, it is sufficient if at least one outermost solder resist layer has a transmittance within the above-described range. Here, in this case, as for a solder resist layer other than the outermost layer having a transmittance for light having a wavelength for communication of about less than 60% at a thickness of 30 μm, presumably, it is necessary to form an optical path for transmitting an optical signal which penetrates through the solder resist layer.

In the case where two or more layers of solder resist layers are formed, and only the outermost solder resist layer has the transmittance for light having a wavelength for communication of 60% or more at a thickness of 30 μm, and further, an optical path for transmitting an optical signal is formed in other solder resist layers so as to penetrate therethrough, those solder resist layers are provided with a sufficient thickness so that optical signals are to be surely transmitted.

In addition, it is desirable for the refractive index of the above-described solder resist layer to be almost the same as the refractive index of the below described optical path for transmitting an optical signal. This is because transmission loss tends not to occur due to the reflection in the interface between the solder resist layer and the optical path for transmitting an optical signal. Moreover, in the package substrate according to the embodiment of the present invention, in the case where a gap between an optical element and the solder resist layer is filled in with an underfill as described below, it is desirable for the refractive index of the solder resist layer and the refractive index of the underfill to be almost the same. In this case, also, transmission loss tends not to occur due to the reflection in the interface between the two.

An optical element is mounted on the package substrate according to the embodiments of the present invention.

A light receiving element, a light emitting element and the like can be cited as examples of the above-described optical element.

A PD (photodiode), an APD (avalanche photodiode) and the like can be cited as examples of the above-described light receiving element.

They can be properly selected, taking the configuration and required properties of the above-described package substrate into consideration. Si, Ge, InGaAs or the like can be cited as the material of the above-described light receiving element. From among these, InGaAs is desirable from the viewpoint of having excellent photosensitivity.

An LD (laser diode), a DFB-LD (distributed-feedback laser diode), an LED (light emitting diode), an infrastructure or oxide-confinement VCSEL (vertical cavity surface emitting laser) and the like can be cited as examples of the light emitting element.

Taking the structure of the package substrate or the demand characteristics, the light emitting element may be properly used.

As for the material of the above-described light emitting element, a compound of gallium, arsenic and phosphorous (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorous (InGaAsP) or the like can be cited.

These may be used in different applications, taking the wavelength for communication into consideration, and in the case where the wavelength for communication is, for example, a band of 0.85 μm, it becomes possible to use GaAlAs, and in the case where the wavelength for communication is a band of 1.31 μm or a band of 1.55 μm, it becomes possible to use InGaAs.

The optical element according to the embodiments of the present invention such as a light receiving element or a light emitting element may be a multi-channel optical element, and the number of channels thereof is not particularly limited.

Moreover, the optical element may be a kind of optical element which is mounted through flip chip bonding by interposing an external electrode or may be mounted by wire bonding.

In addition, upon taking the surface of the optical element where external electrodes are formed (hereinafter, referred to as the external electrode formed surface) in a plan view, the external electrodes may be locally formed in one of the two regions formed by equally dividing the planar shape with a center line.

In the case where the external electrodes are unevenly distributed in this manner, the above-described optical element can be connected to a driving IC or an IC chip such as an amplifier IC that is mounted on the package substrate via linear conductor circuits having the same length, and as a result, the system becomes excellent in the freedom of design, and skew (the shifting of a signal) tends not to occur, and thus, the system becomes excellent in its reliability in terms of the transmission of an optical signal.

In addition, in the case where the external electrodes are unevenly distributed, it is desirable for dummy electrodes or level maintaining members to be formed in the other region on the opposite side of the region where the external electrodes are formed with the center line in between on the above-described external electrode formed surface.

In particular, in the case where the above-described optical element is a kind that is mounted with the face facing downwards through flip chip bonding, it is desirable for dummy electrodes or level maintaining members to be formed. This is because the optical element inclines at the time of mounting, and the optical signal sometimes fails to be transmitted in the case where the level maintaining members or the like are not formed.

Here, the above-described dummy electrodes have the same configuration as the above-described external electrodes, except that no current flows through them due to the design of the optical element.

An underfill may be filled in a gap between the optical element and the solder resist layer.

By filling the gap with an underfill, it may become possible to prevent foreign matters such as litter and dust from entering into routes of optical transmission.

The material of the above-described underfill is not particularly limited, and a thermosetting resin, a photosensitive resin, a resin where a photosensitive group is added to a portion of a thermosetting resin, a resin compound which includes the above-described resin and a thermoplastic resin or the like, for example, can be used. In addition, a commercially available resin for underfill can be used.

In addition, it is desirable for the above-described underfill to have a transmittance for light having a wavelength for communication of about 70%/mm or more. This is because, when the transmittance for the light having a wavelength for communication is about 70%/mm or more, the transmission loss of the optical signal may not become too great, and thus transmissivity of the optical signal tends not to be lowered. It is desirable for the above-described transmittance to be about 90%/mm ore more.

Here, in the present specification, the transmittance of the underfill for light having a wavelength for communication means a transmittance when light transmits through the underfill having a thickness of 1 mm.

Examples of the thermosetting resin include an epoxy resin, a phenolic resin, a polyimide resin, a polyester resin, a bismaleimide resin, a polyolefin based resin, a polyphenylene ether resin, a polyphenylene resin, a fluorine resin and the like.

An acryl resin and the like can be cited as an example of the above-described photosensitive resin.

In addition, as for the resin where a photosensitive group is added to a portion of the above-described thermosetting resin, a resin gained by making the thermosetting group of any of the above-described thermosetting resins, methacrylic acid or acrylic acid react with each other in order to bring about acrylic conversion, and the like can be cited as an example.

As for the above-described thermoplastic resin, a phenoxy resin, polyether sulfone (PES), polysulfone (PSF), polyphenylene sulfone (PPS), polyphenylene sulfide (PPES), polyphenylene ether (PPE) and polyether imide (PI) and the like can be cited as examples.

In addition, the above-described underfill may include particles. In the case where particles are included, the coefficient of thermal expansion may be more easily adjusted by the amount of mixture, and therefore, matching of the coefficient of thermal expansion may be more easily achieved between the underfill and the package substrate or the optical element.

The same particles as those included in the optical path for transmitting an optical signal can be cited as concrete examples of the below-described particles.

In addition, in the case where the particles are included in the above-described underfill, the lower limit of the amount of the particles to be mixed is desirably set to about 20% by weight, and the upper limit is desirably set to about 70% by weight. This is because the amount within this range is usually appropriate for matching the coefficients of thermal expansion between the package substrate and the optical element, and the liquidity required at the time of filling is also provided.

A more desirable lower limit is set to about 30% by weight, and a more desirable upper limit is set to about 60% by weight.

An optical path for transmitting an optical signal is formed in the package substrate according to the embodiments of the present invention.

Examples of the optical path for transmitting an optical signal include a collective through hole structure, an individual through hole structure and the like. The specific structures of these are described in the following in reference to the drawings.

In addition, the above-described optical path for transmitting an optical signal may be formed of only a gap or a portion or the entirety thereof may be formed of a resin composite.

When a portion or the entirety of the optical path for transmitting an optical signal is formed of a resin composite, it may become easier to prevent a foreign matter such as litter and dust from entering in the optical path for transmitting an optical signal. Moreover, it may become possible to reduce transmission loss by controlling a refractive index of the resin composite that forms the optical path for transmitting an optical signal.

The resin component of the resin composite is not particularly limited as long as it has little absorption in the wavelength band for communication, and a thermosetting resin, a thermoplastic resin, a photosensitive resin, a resin of which a portion of a thermosetting resin is converted to have photosensitivity, and the like can be cited as examples.

Specifically, an epoxy resin, an UV (ultraviolet) curing epoxy resin, a polyolefin based resin, an acryl resin such as PMMA (polymethyl methacrylate), deuterated PMMA and deuterated PMMA fluoride, a polyimide resin such as polyimide fluoride, a silicone resin such as a deuterated silicone resin, a polymer manufactured from benzocyclobutene and the like can be cited as examples.

In addition, the resin composite may include particles, for example, resin particles, inorganic particles, metal particles or the like, in addition to the resin component. The matching of the coefficient of thermal expansion may be able to be achieved between the optical path for transmitting an optical signal and the substrate, the insulating layer or the solder resist layer and the like by including these particles and, in addition, it may become possible to impart incombustibility depending on the kind of particles.

Examples of the particles include inorganic particles, resin particles, metal particles and the like.

As for the inorganic particles, particles comprising aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc, silicon compounds such as silica and zeolite, titanium compounds such as titania and the like can be cited as examples. In addition, particles having a mixed component where at least two kinds of inorganic materials are mixed and melted together may be used.

Among the above, silica, titania, alumina or the like is more desirably used from the viewpoints that mixing is easy and the coefficient of thermal expansion can be easily adjusted.

Examples of the resin particles include particles made of, for example, a thermosetting resin, a thermoplastic resin, and the like, and concrete examples thereof include particles made of an amino resin (such as a melamine resin, a urea resin and a guanamine resin), an epoxy resin, a phenolic resin, a phenoxy resin, a polyimide resin, a polyphenylene resin, a polyolefin resin, a fluorine resin, a bismaleimide-triazine resin and the like.

Examples of the metal particles include gold, silver, copper, tin, zinc, a stainless steel, aluminum, nickel, iron, lead and the like. It is desirable for the surface layer of the metal particles to be coated with a resin or the like in order to secure insulating properties.

In addition, these particles may be solely used or two or more kinds may be used together.

It is desirable for the particle diameter of the particles to be smaller than the wavelength for communication.

In addition, the lower limit of the particle diameter is desirably set to about 0.01 µm, more desirably set to about 0.1 µm and furthermore desirably set to about 0.2 µm. Meanwhile, the upper limit of the particle diameter is desirably set to about 0.8 µm and more desirably set to about 0.6 µm.

Here, in the present specification, the particle diameter means the length of the longest portion of particles.

The lower limit of the amount of the mixed particles contained in the resin composite is desirably set to about 10% by weight and the upper limit is desirably set to about 50% by weight. This is because, in the case where the amount of the mixed particles is about 10% by weight or more, it becomes easier to exert the effects of mixing particles, while in the case where the amount of the mixed particles is about 50% by weight or less, it may become easier to fill the resin composite in the optical path for transmitting an optical signal. The more desirable lower limit of the amount of the mixed particles is about 20% by weight and the more desirable upper limit of the amount of the mixed particles is about 40% by weight.

In addition, the optical path for transmitting an optical signal desirably has a transmittance for light having a wavelength for communication of about 70%/mm or more. This is because, in the case where the transmittance for light having a wavelength for communication is about 70%/mm or more, the transmission loss of the optical signal tends not to become too great, and thus lowering of the transmission property of the optical signal tends not to be caused. It is more desirable for the transmittance to be about 90%/mm or more.

Here, in the present specification, the transmittance of an optical path for transmitting an optical signal for light having a wavelength for communication means a transmittance when light transmits an optical path for transmitting an optical signal having a thickness of 1 mm.

In addition, a conductive layer may be formed on the wall surface of the above-described optical path for transmitting an optical signal.

Diffused reflection of light from the wall surface of the optical path for transmitting an optical signal tends to be reduced and the transmissivity of the optical signal tends to be improved by forming a conductive layer as described above. In addition, in some cases, it may become possible for the above-described conductive layer to function as a through hole.

In addition, it is desirable for an end portion of the above-described optical path for transmitting an optical signal to be covered with a solder resist layer. In such a configuration, it may become easier to prevent peeling of the insulating layer from the resin composite with which the optical path for transmitting an optical signal is filled in, or cracking in the resin composite, and the like, leading to an excellent transmissivity of an optical signal.

A microlens may be provided on the outermost solder resist layer in the package substrate according to the embodiments of the present invention, and in particular, a microlens is desirably provided on the solder resist layer on the side opposite to the side on which an optical element is mounted. This is because, a microlens is easily provided at the position.

By providing a microlens, an optical signal transmitted through the optical path for transmitting an optical signal and the solder resist layer is condensed by a microlens, and thereby more reliable transmission of an optical signal may be achieved.

The above-described microlens is not particularly limited and any microlenses used as an optical lens can be exemplified, and concrete examples of the material thereof include optical glass and resins for an optical lens. Examples of the resins for an optical lens include an acryl resin, an epoxy resin and the like, which are the same materials as the polymer materials described to be used as the resin composite to be filled in the above-described optical path for transmitting an optical signal.

In addition, in the case where a microlens is provided on the side where the optical element is mounted, and a gap between the optical element and the solder resist layer is filled in with an underfill, desirably, the refractive index of the microlens is greater than the refractive index of the underfill. This is because, in this case, the optical signal is condensed upon transmission, and thus the transmission loss may be more easily reduced.

In addition, as for the form of the above-described microlens, a convex lens having a convex surface only on one side can be cited as an example and in this case the radius of curvature of the convex surface of the lens can be appropriately selected, taking the design of the optical path for transmitting an optical signal into consideration. Specifically, in the case where it is necessary to make the focal distance long, for example, it is desirable to make the radius of curvature large, while in the case where it is necessary to make the focal distance short, it is desirable to make the radius of curvature small.

Here, the form of the above-described microlens is not limited to a convex lens, and any form which can condense an optical signal in a desired direction may be used.

It is desirable for the above-described microlens to have a transmittance for light having a wavelength for communication of about 70%/mm or more.

In the case where the transmittance for light having a wavelength for communication is about 70%/mm or more, the transmission loss of the optical signal tends not to become too great, and thus lowering of the transmission property of the optical signal tends not to be caused. It is more desirable for the above-described transmittance to be about 90%/mm or more.

Here, in the present specification, the transmittance of a microlens for light having a wavelength for communication means a transmittance when light transmits the material for the formation of the microlens which is processed into a sheet form having a thickness of 1 mm.

In addition, the microlens may include particles such as resin particles, inorganic particles and metal particles.

This is because, by including particles, the strength of the microlens is increased so that it may become possible to maintain the form more certainly, and also it may become easier to match the coefficient of thermal expansion between the microlens and the above-described substrate or insulating layer, and thus, cracks and the like due to the difference in the coefficient of thermal expansion become less likely to occur.

In the case where the above-described microlens includes particles, desirably the refractive index of the resin component of the microlens and the refractive index of the above-described particles are almost the same. Therefore, it is desirable for the particles included in the microlens to be a mixture of particles of two or more kinds having different indexes of refraction so that the refractive index of the particles becomes almost the same as the refractive index of the resin component.

Specifically, in the case where the resin component is an epoxy resin having an refractive index of 1.53, for example, it is desirable for the particles included in the microlens to be particles which are obtained by mixing and melting silica particles having an refractive index of 1.46 and titania particles having an refractive index of 2.65.

Here, as for the method for mixing particles, a method for kneading particles and a method for melting and mixing two or more kinds of particles and after that, converting the mixture into particle form, and the like can be cited.

Here, the same kinds of particles as those mixed in the optical path for transmitting an optical signal can be cited as concrete examples of the above-described particles.

Though the particle diameter of the above-described particles is not particularly limited, it is desirable for the upper limit thereof to be about 0.8 μm and the lower limit thereof to be about 0.01 μm.

The above-described microlens is usually provided using an inkjet apparatus, a dispenser or the like, because, among presently used apparatuses, about 20 μm is the smallest size for the inner diameter of the application nozzle of inkjet apparatuses and the inner diameter of the nozzle of dispensers, and thus the particle diameter within the above-described range does not cause clogging of the nozzle and is suitable for application.

In addition, the lower limit of the particle diameter is more desirably set to about 0.1 μm.

The particle diameter within this range is more desirable from the viewpoint of stability in the viscosity for the application by means of inkjet apparatuses, dispensers or the like and inconsistency in the applied amount.

A desirable lower limit of the amount of mixed particles included in the microlens is about 5% by weight, and a more desirable lower limit is about 10% by weight. Meanwhile, a desirable upper limit of the amount of mixed particles is about 60% by weight and a more desirable upper limit is about 50% by weight. This is because, in the case where the amount of mixed particles is about 5% by weight or more, the effects due to mixing of particles may be more easily obtained, and in the case where the amount of mixed particles is about 60% by weight or less, transmission of an optical signal may become less likely to be obstructed.

Here, in the case where microlenses are provided to the package substrate according to the embodiments of the present invention, these microlenses may be independent of each other or may be a microlens array in which a plurality of lenses are aligned in parallel.

Though the above-described microlenses may be provided on the above-described solder resist layer directly or by interposing an optical adhesive, it is desirable for the microlenses to be directly provided.

The optical adhesive is not particularly limited and examples thereof include an epoxy resin based adhesive, an acryl resin based adhesive, a silicone resin based adhesive, and the like.

It is desirable for the optical adhesive to have the characteristics of a viscosity of at least about 0.2 Pa·s and at most about 1.0 Pa·s, an refractive index of at least about 1.4 and at most about 1.6, an optical transmittance of about 80% or more, and a coefficient of thermal expansion (CTE) of at least about $4.0 \times 10^{-5}$ (/° C.) and at most about $9.0 \times 10^{-5}$ (/° C.).

In addition, the thickness of the optical adhesive is desirably about 50 μm or less.

In the case where microlenses are provided as described above, a surface treatment may be carried out on the region where they are provided.

When a resin for the formation of microlenses is applied by means of an inkjet apparatus and the like, the form of microlenses, in particular the degree of sagging, easily becomes uneven due to the inconsistent wettability of the portions on which microlenses are provided which is caused by the inconsistent conditions in the process up to the formation of the solder resist layer and due to the difference in time for allowing the resin to stand; however, the unevenness in the degree of sagging may be more easily reduced by carrying out a surface treatment and the like using a water repellent coating agent.

As for the above-described surface treatment, a process using a water repellent coating agent such as a fluorine based polymer coating agent (surface tension: about 10 mN/m to about 12 mN/m), a water repellent treatment using $CF_4$ plasma, a hydrophilic process using $O_2$ plasma and the like can be cited as examples.

Here, in the present specification, the degree of sagging of microlenses means the height in portions which protrude from the surface of the solder resist layer.

Moreover, the above-described microlens may be provided by interposing a lens marker.

As for the above-described lens marker, the lens marker disclosed in JP 2002-331532A and the like can be cited as an example. Here, the contents of JP 2002-331532A are incorporated herein by reference in their entirety In addition, in the case where lens markers are formed, it is desirable for the above-described microlenses to be provided on the lens markers on which a water repellent process or a hydrophilic process has been carried out.

This is because, in the case where the surface of the lens markers is smeared, the resin composite used for the formation of microlenses (resin composite for lenses) does not spread uniformly, which may cause failure in the formation of microlenses in a desired form, but by carrying out a water repellent process or a hydrophilic process as described above, the smear on the surface of the lens markers may be more easily removed by carrying out a water repellent process or a hydrophilic process as described above, and thus this arrangement may be suitable for spreading the above-described resin composite for lenses on the lens markers uniformly.

Furthermore, it is desirable for a hydrophilic process, rather than a water repellent process to be carried out on the lens markers. This is because, in the case where a hydrophilic process is carried out, it is easy for the resin composite for lenses to spread over the entirety of the lens markers when dropped on the lens markers to provide microlenses and also the spread of the resin is stopped at the outer periphery of the lens markers without failure, which is appropriate for the formation of microlenses in a predetermined form using the surface tension.

In the package substrate according to the embodiments of the present invention, the laminated body comprises a substrate, and the conductor circuit and the insulating layer formed and laminated on both sides of the substrate, and the conductor circuits having the substrate in between are desirably connected through a through hole, and the conductor circuits having the insulating layer in between are desirably connected through a via hole. This is because, this configuration is suitable for achieving a high density wiring of the package substrate while making the package substrate smaller.

Next, the package substrate of the present invention is described in reference to the drawings.

FIG. 1 is a cross sectional diagram schematically showing a package substrate according to one embodiment of the present invention. Here, FIG. 1 shows a package substrate in a state where an IC chip is mounted.

As shown in FIG. 1, in a package substrate 120, conductor circuits 124 and insulating layers 122 are formed and laminated on both sides of a substrate 121, and conductor circuits having the substrate 121 in between are electrically connected to each other by means of a through hole 129, and conductor circuits having the insulating layer 122 in between are electrically connected to each other by means of via holes 127. In addition, solder resist layers 134 having a transmittance within the above-described range are formed as the outermost layers.

In this package substrate 120, an optical path 142 for transmitting an optical signal is provided so as to penetrate through the substrate 121, the insulating layers 122 and the like. Here, the portions which penetrate through the substrate 121 and the insulating layers 122 are collectively formed with a size that may allow an optical signal to be transmitted from all of the light emitting portions 138a to 138d of the light emitting element 138.

In this optical path for transmitting an optical signal 142, the portions which penetrate through the substrate 121, the insulating layers 122 and the like are filled in with a resin composite 147. Further, the resin composite 147 is formed in such a manner that the end portion thereof is located at almost the same level as the surface of the conductor circuit 124 formed on the outermost insulating layer.

Here, a conductor layer may be formed around the periphery of the above-described optical path for transmitting an optical signal.

A light emitting element 138 having four channels is surface mounted on one surface of the package substrate 120 with solder connection portions 143 so that each of the light emitting portions 138a to 138d face the optical path 142 for transmitting an optical signal, and at the same time, an IC chip 140 is surface mounted via solder connection portions 143. In addition, on the other surface of the package substrate 120, solder bumps 137 are formed on the solder resist layer 134.

A gap between the light emitting element 138 and the solder resist layer 134 is filled in with an underfill 148. Here, the underfill may not necessarily be filled.

Microlenses 146a to 146d are directly provided on the solder resist layer on the side of the optical path for transmitting an optical signal 142 opposite to the side on which the optical element is mounted.

In the package substrate 120 having such a configuration, an electrical signal from the IC chip 140 is converted into an optical signal in the light emitting element 138, and then transmitted to external optical parts or the like via the underfill 148, the solder resist layer 134, the optical path for transmitting an optical signal 142, the solder resist layer 134 and the microlenses 146a to 146b.

In the package substrate 120, the solder bumps 137 are formed on the solder resist layer 134 via a metal plating layer, and therefore, an electrical signal can be transmitted between the IC chip 140 and an external substrate or the like via the solder bumps 137.

When the solder bumps are formed in the above-described manner, the package substrate can be connected to an external substrate such as a substrate for a motherboard by using the solder bumps, and in this case the package substrate may be able to be placed at a predetermined position by the self-alignment function of solders.

Here, the self-alignment function means a function of solders which tends to exist in a more stable form in the vicinity of the center of openings for forming solder bumps due to the liquidity of the solders themselves at the time of reflow processing, and this function occurs presumably because the solders are repelled by the solder resist layer and a strong surface tension works to make the solders in spherical form when the solders adhere to metals.

In the case where this self-alignment function is used, when the package substrate is connected to the external substrate via the solder bumps, the package substrate moves at the time of reflow so that the package substrate may become able to be attached to the external substrate at the precise position, even if a positional error (miss alignment) exists between the package substrate and the external substrate before reflow.

Accordingly, in the case where an optical signal is transmitted between the optical element mounted on the package substrate and an external optical part via the optical path for transmitting an optical signal, it becomes easier for the optical signal to be transmitted precisely between the package substrate and the external substrate if the mounting position of the optical element mounted on the substrate is precise.

In addition, in the package substrate on which a multi-channel optical element (array element) is mounted as described above, the diameter of the microlens that is provided on an end portion of the optical path for transmitting an optical signal may be appropriately determined in accordance with the pitch between respective channels in the array element, and in the case where an array element having a pitch of 250 μm is used, for example, the diameter is desirably set to at least about 100 µm and at most about 240 µm, and more desirably set to at least about 180 µm and at most about 230 µm. This is because, in the case where the diameter is about 100 µm or more, it may be possible to obtain a desired focal distance more easily, and in the case where the diameter is about 240 µm or less, adjacent microlenses tend not to make contact with each other, and thus the diameter within the above-described range is suitable for placing the microlenses at predetermined positions.

In addition, in the case where an array element having a pitch of about 500 µm is used, for example, it is desirable for the diameter to be at least about 100 µm and at most about 490 µm, and it is more desirable for the diameter to be at least about 180 µm and at most about 480 µm. This is because, in the case where the diameter is about 100 µm or more, it becomes possible to obtain a desired focal distance more easily, and in the case where the diameter is about 490 µm or less, adjacent microlenses tend not to make contact with each other, and thus the diameter within the above-described range is suitable for placing the microlenses at predetermined.

With regard to the form of the optical path for transmitting an optical signal in the collective through hole structure, a round pillar shape, a rectangular pillar shape, a cylindroid shape, a form where a number of round pillars are aligned in parallel and portions of side faces of adjacent round pillars are connected to each other, a pillar form having a bottom face framed by a line and an arc and the like can be cited as examples.

In addition, in the case where the form of the optical path for transmitting an optical signal is a form where a number of round pillars are aligned in parallel and portions of side faces of adjacent round pillars are connected to each other, a dummy round pillar, which does not actually function as an optical path for transmitting an optical signal, may be formed among some of the round pillars thereof.

In addition, it is desirable for the planar shape of the optical path for transmitting an optical signal having a collective through hole structure (planar shape of the portion which penetrates through the substrate and the insulating layers in the structure shown in FIG. 1) to be an almost rectangle, an almost racetrack or an almost ellipse each having a size of at least about 100 µm and at most about 5 mm with respect to each of the length and width thereof. Here, in the case where the planar shape is an almost ellipse or an almost racetrack, the longer diameter and the shorter diameter are desirably set within the above range.

Moreover, the planar shape of the optical path for transmitting an optical signal may be an almost circle, and in this case, the diameter thereof is desirably set within the above range.

In the case where the size of the planar shape is about 100 µm or more, transmission of an optical signal tends not to be obstructed, while in the case where the diameter exceeds about 5 mm, transmission of an optical signal is not improved in terms of the loss, and miniaturization of the package substrate becomes difficult, and thus from this point of view, the diameter is desirably about 5 mm or less.

Figure 2:
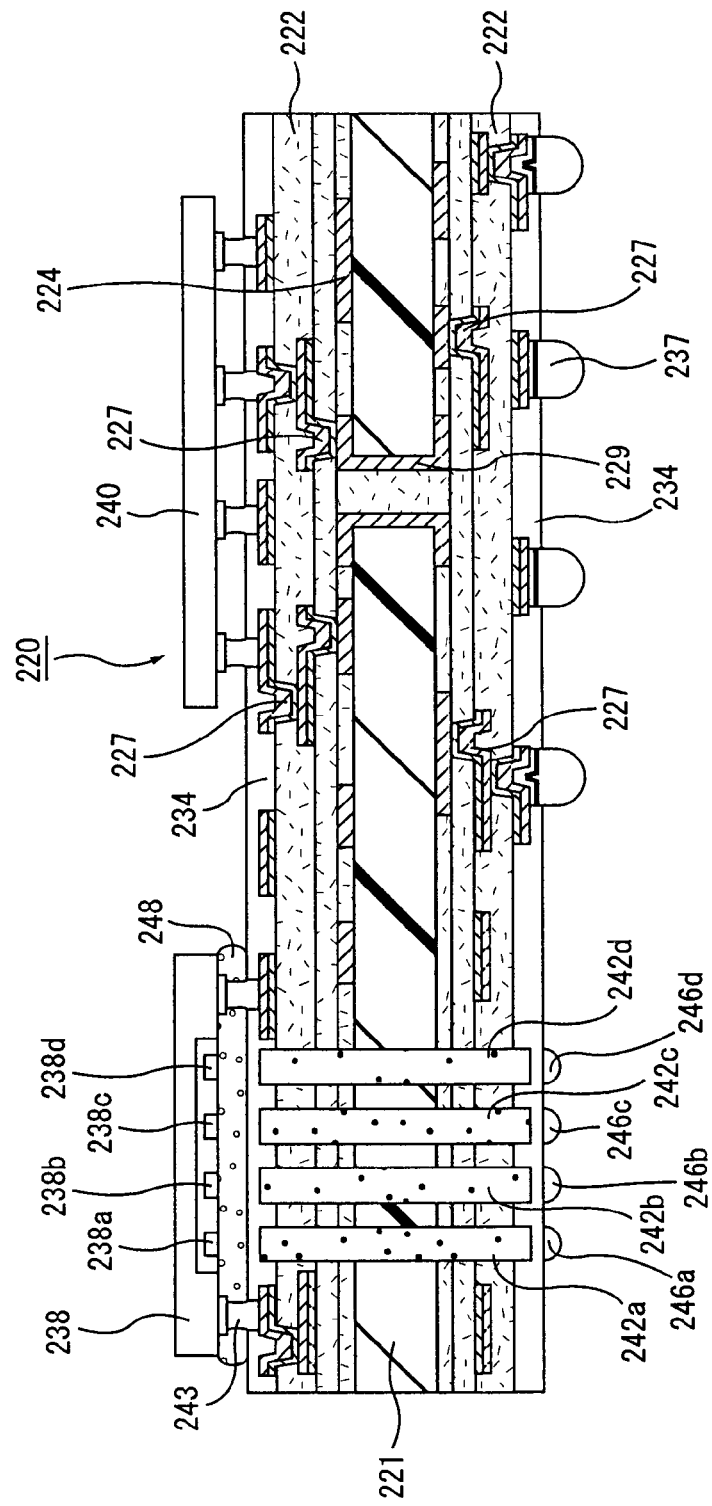
FIG. 2 is a cross-sectional view that schematically shows another example of a package substrate according to one embodiment of the present invention.

FIG. 2 is a cross-sectional view that schematically shows the package substrate according to another embodiment of the present invention. Here, FIG. 2 shows the package substrate in a state where an IC chip is mounted.

The structure of a substrate 220 as shown in FIG. 2 is the same with that of the package substrate 120 as shown in FIG. 1, except that the shape of optical path for transmitting an optical signal is different. Therefore, only the shape of optical path for transmitting an optical signal is to be described in detail here.

Four independent optical paths for transmitting an optical signal 242a to 242d are provided in the package substrate 220 shown in FIG. 2 so as to penetrate through a substrate 221, insulating layers 222 and the like.

These optical paths for transmitting an optical signal 242a to 242d are filled in with a resin composite 247. Further, the resin composite 247 is formed in such a manner that the end portion thereof is located at almost the same level as the surface of the conductor circuit 224 formed on the outermost insulating layer.

In addition, a solder resist layer 234 having a refractive index within the above-described range is formed on the outermost layer.

A light emitting element 238 having four channels is mounted on one surface of the package substrate 220 by interposing solder connection portions.

Accordingly, an optical signal from the light emitting element 238 having four channels can be transmitted via any of the optical paths for transmitting an optical signal 242a to 242d. Here, the individual optical paths for transmitting an optical signal are independently formed, so that each can transmit an optical signal from each of light emitting portions 238a to 238d of the light emitting element having four channels.

In addition, a gap between the light emitting element 238 and the solder resist layer 234 is filled in with an underfill 248.

In addition, microlenses 246a to 246d are provided directly on the outermost solder resist layer 234, on the side opposite to the light emitting element side of the optical paths for transmitting an optical signal 242a to 242d.

In the package substrate 220 having this configuration, an electrical signal from the IC chip 240 is converted into an optical signal in the light emitting element 238, and then transmitted to an external optical parts or the like via the underfill 248, the solder resist layer 234, the optical paths for transmitting an optical signal 242a to 242d, the solder resist layer 234 and the microlenses 246a to 246d.

Here, with regard to the diameter of the planar shape (the cross sectional diameter) of each optical path for transmitting an optical signal, the lower limit thereof is desirably set to about 100 µm, and the upper limit thereof is desirably set to about 500 µm. In the case where the diameter is about 100 µm or more, the optical paths may be less likely to be clogged and the difficulty in filling an uncured resin composite in the optical paths for transmitting an optical signal may be unlikely to occur. Meanwhile, in the case of the diameter exceeding about 500 µm, the transmission property for an optical signal is hardly increased, and freedom in design of the conductor circuits and the like that form the package substrate may be hindered, and thus from this point of view, the diameter is desirably about 500 µm or less.

A more desirable lower limit for the diameter is about 250 µm, and a more desirable upper limit for the diameter is about 350 µm.

Here, the cross sectional diameter of the portion of the optical paths for transmitting an optical signal of the individual through hole structure which penetrates through the substrate and the insulating layers means the diameter of the cross section in the case where the optical paths for transmitting an optical signal are in a round pillar shape, the long diameter of the cross section in the case where the optical paths for transmitting an optical signal are in a cylindroid shape, and the length of the longest portion in the cross section in the case where the optical paths for transmitting an optical signal have a rectangular or a polygonal pillar shape.

In addition, in the present invention, cross section of the optical paths for transmitting an optical signal means the cross section in parallel with the main surface of the package substrate.

In the package substrate of this embodiment also, an appropriate diameter may be determined for the microlenses which are provided on end portions of the optical paths for transmitting an optical signal in accordance with the pitch between the channels in the array element, and in the case where an array element having a pitch of 250 µm is used, for example, the diameter of the microlenses is desirably set to at least about 100 µm and at most about 190 µm. This is because, in the case where the diameter is about 100 µm or more, a desired focal distance can be more easily obtained, and in the case where the diameter is about 190 µm or less, the diameter is suitable for forming the microlens at an end portion of each optical path for transmitting an optical signal. Here, in this case, the cross sectional diameter of each of the optical paths for transmitting an optical signal is desirably set to at least about 150 µm and at most about 200 µm.

In the case where an array element having a pitch of about 500 µm is used, for example, it is desirable for the diameter to be at least about 100 µm and at most about 490 µm, and it is more desirable for the diameter to be in the range of about 180 µm to about 480 µm. This is because, in the case where the diameter is about 100 µm or more, a desired focal distance may be more easily obtained, and in the case where the diameter is about 490 µm or less, the diameter is suitable for forming the microlens at an end portion of each optical path for transmitting an optical signal. In this case, the cross sectional diameter of each of the optical path for transmitting an optical signal is desirably set to at least about 150 µm and at most about 450 µm.

The reason why it is desirable for the cross sectional diameter of each of the individually formed optical paths for transmitting an optical signal to be about 150 µm or more is as follows.

That is to say, the optical paths for transmitting an optical signal in the above-described embodiment are formed by forming through holes which penetrate through the substrate and the insulating layers, and then filling the through holes with a resin composite if necessary; in this process, the through holes are usually formed by using a drill, and when the through holes are formed by a drilling process, it is difficult to form a through hole having a diameter of less than about 150 µm.

Moreover, the desirable upper limit of the cross sectional diameter of each individually formed optical path for transmitting an optical signal is to be decided depending on the pitch of the optical element as described above, and as long as the diameter is within the above range, there may be almost no risk of contact between adjacent optical paths for transmitting an optical signal. Furthermore, the transmission light tends not to hit the wall surface of the optical path for transmitting an optical signal, and therefore it becomes easier to carry out optical signal transmission with low optical transmission loss.

Examples of the form of each of the optical paths for transmitting an optical signal having the individual through hole structure include a round pillar shape, a rectangular pillar shape, a cylindroid shape, a pillar shape having a bottom face framed by a linear line and an arc, and the like.

In addition, though the package substrates shown in FIGS. 1 and 2 are examples where a light emitting element is mounted as an optical element according to the embodiments of the present invention, a light receiving element may be mounted on the package substrate the embodiments of the present invention instead of a light emitting element, or a light emitting element and a light receiving element may be mounted together.

In addition, the number of channels of the optical element that is mounted on the package substrate is not limited to four but may be one or two, three, five or more.

In addition, the package substrate according to the embodiments of the present invention may be a package substrate where an optical path for transmitting an optical signal in recess form (cavity) is formed.

Figure 3:
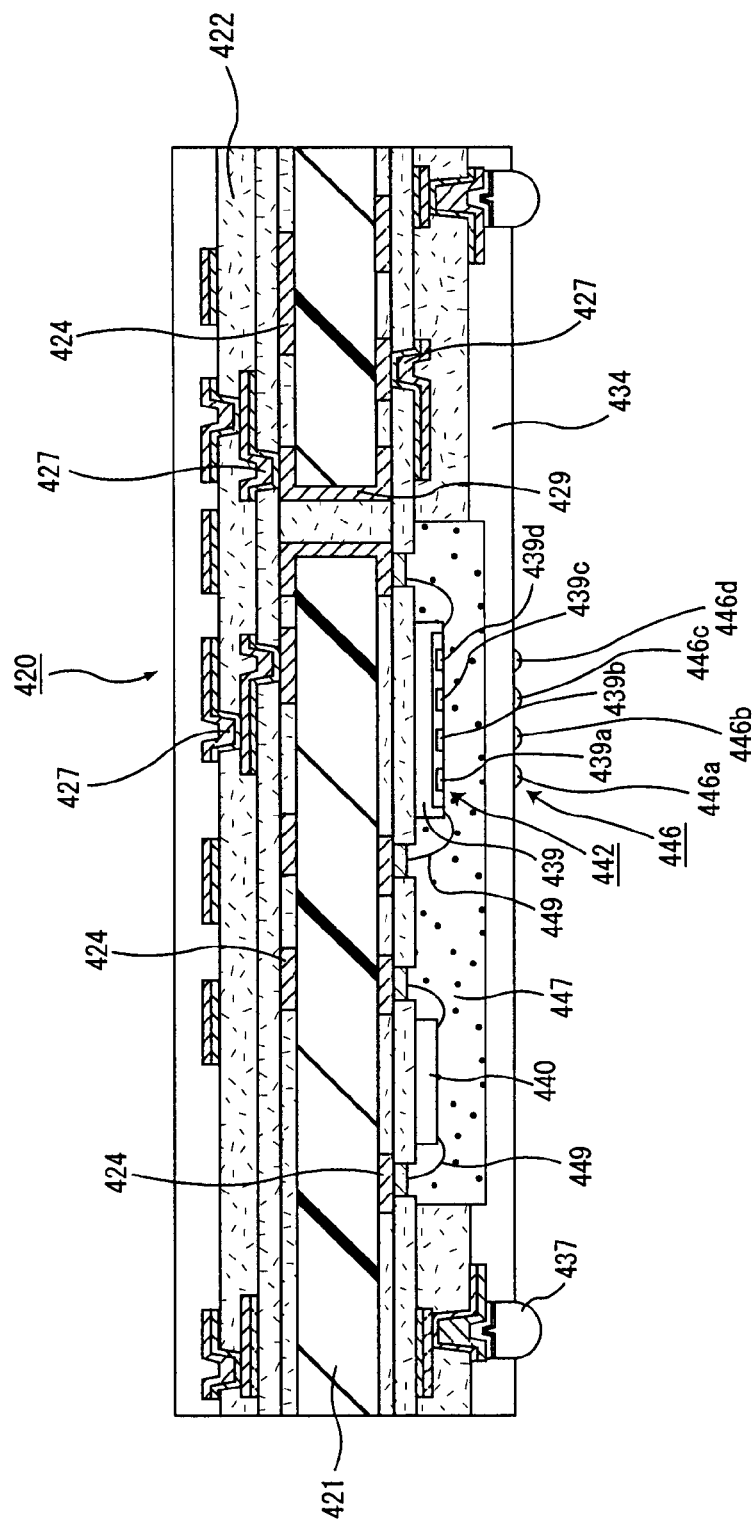
FIG. 3 is a cross-sectional view that schematically shows another example of a package substrate according to one embodiment of the present invention.

In the following, a package substrate where an optical path for transmitting an optical signal in recess form (cavity) is formed is briefly described. FIG. 3 is a cross sectional diagram schematically showing another example of the package substrate according to the embodiments of the present invention.

In a package substrate 420, conductor circuits 424 and insulating layers 422 are formed and laminated on both sides of a substrate 421, and conductor circuits having the substrate 421 in between are electrically connected to each other through a through hole 429, and conductor circuits having an insulating layer 422 in between are electrically connected to each other through via holes 427. In addition, solder resist layers 434 having a refractive index within the above-described range are formed as the outermost layers.

In this package substrate 420, an optical path for transmitting an optical signal 442 in recess form is provided in the insulating layer that is formed and laminated on one side of the substrate.

Within this optical path for transmitting an optical signal 442, a light emitting element 438 and an IC chip 440 are mounted and connected by means of wire bonding with wires 449, and furthermore, the optical path for transmitting an optical signal for 442 is filled in with a resin composite 447. Further, the resin composite 447 is formed in such a manner that the end portion thereof is located at almost the same level as the surface of the conductor circuit 424 formed on the outermost insulating layer.

Here, a light emitting element may be mounted through flip chip bonding on a package substrate having an optical path for transmitting an optical signal in recess form, and in this case, external electrodes are formed on the surface opposite to the surface where a light emitting portion is formed.

In addition, microlenses 446 (446a to 446d) are provided on the solder resist layer 434, on the side where the optical path for transmitting an optical signal 442 is formed.

A package substrate of this kind of embodiment is also one of those package substrates according to the embodiments of the present invention.

Here, with respect to the solder resist layers formed and laminated in the package substrate according to the embodiments of the present invention, as shown in FIG. 3, both of the outermost solder resist layers formed and laminated on both sides of the substrate may have a transmittance in the above-described range, or only the outermost solder resist layer on the side where the optical path for transmitting an optical signal is formed (lower side in the figure) may have a transmittance within the above-described range at least, while the transmittance of the solder resist layer on the opposite side is low.

That is to say, with regard to the solder resist layers formed and laminated on the package substrate according to the embodiments of the present invention, those solder resist layers, in which only portions of the solder resist layers that can transmit an optical signal (in other words, the portions that can function as an optical path for transmitting an optical signal) satisfy the transmittance within the above-described range, may be used.

Here, in the case where solder resist layers having different compositions are formed on the surface on the two respective sides, the number of processes for the formation increases, and furthermore, a difference in the coefficient of thermal expansion between those solder resist layers on the respective surfaces may cause warping in the package substrate, and therefore, it is desirable to form solder resist layers having a transmittance within the above-described range on both sides.

Next, one example of a method for manufacturing a package substrate according to one embodiment of the present invention is described in the order of the processes.

In the method for manufacturing a package substrate, first, a multilayer circuit board where conductor circuits and insulating layers are formed and laminated on both sides of a substrate is manufactured. The above-described multilayer circuit board may be manufactured in accordance with a semi-additive method, a full-additive method, a subtractive method, a collect layering method, a conformal method and the like. Here, an example of a manufacturing method for a multilayer circuit board using a semi-additive method is described.

(1) An insulating substrate is prepared as a starting material, and first, conductor circuits are formed on this insulating substrate. The insulating substrate is not particularly limited, and a glass epoxy substrate, a bismaleimide-triazine (BT) resin substrate, a copper covered multilayer board, a resin substrate such as an RCC substrate, a ceramic substrate such as an aluminum nitride substrate, a silicon substrate, and the like can be cited as examples.

The above-described conductor circuits can be formed by forming a solid conductor layer on the surface of the above-described insulating substrate in accordance with, for example, an electroless plating process, and after that, carrying out an etching process, and the like.

In addition, through holes for connecting the conductor circuits which sandwich the insulating substrate may be formed. In addition, a coarse surface may be formed on the surface of the conductor circuits in accordance with an etching process or the like, if necessary, after the formation of the conductor circuits.

(2) Next, an insulating layer having openings for via holes is formed on the substrate on which the conductor circuits are formed.

The inter layer resin insulating layer may be formed of a thermosetting resin, a photosensitive resin, a resin where a photosensitive group is added to a portion of a thermosetting resin, a resin compound including any of these and a thermoplastic resin or the like.

Specifically, for example, first, an uncured resin is applied using a roll coater, a curtain coater and the like, or a resin film is bonded through thermocompression so that a resin layer is formed, and after that a curing process is carried out if necessary, and openings for via holes are formed in accordance with a laser process, an exposure and development process or the like, and accordingly, an insulating layer can be formed.

In addition, a resin layer made of the above-described thermoplastic resin may be formed by, for example, bonding a resin mold in film form through thermocompression, and the like.

Examples of the thermosetting resin include an epoxy resin, a phenolic resin, a polyimide resin, a polyester resin, a bismaleimide resin, a polyolefin based resin, a polyphenylene ether resin, a polyphenylene resin, a fluorine resin and the like.

An acryl resin and the like can be cited as an example of the above-described photosensitive resin.

In addition, as for the resin where a photosensitive group is added to a portion of the above-described thermosetting resin, a resin gained by making the thermosetting group of any of the above-described thermosetting resins, methacrylic acid or acrylic acid react with each other in order to bring about acrylic conversion and the like can be cited as an example.

As for the above-described thermoplastic resin, a phenoxy resin, polyether sulfone (PES), polysulfone (PSF), polyphenylene sulfone (PPS), polyphenylene sulfide (PPES), polyphenylene ether (PPE) and polyether imide (PI) and the like can be cited as examples.

With regard to concrete combinations in the above-described resin compound, phenolic resin/polyether sulfone, polyimide resin/polysulfone, epoxy resin/polyether sulfone, epoxy resin/phenoxy resin and the like can be cited as examples. In addition, as for combinations of a photosensitive resin and a thermoplastic resin, acryl resin/phenoxy resin, epoxy resin where a portion of the epoxy group has been converted to acryl/polyether sulfone, and the like can be cited as examples.

In addition, the mixture ratio of the thermosetting resin or photosensitive resin in the resin compound to the thermoplastic resin is desirably set as follows: thermosetting resin or photosensitive resin/thermoplastic resin=at least about (95/5) and at most about (50/50). This is because, the mixture ratio is suitable for securing a high degree of toughness without losing resistance to heat.

Here, the insulating layer may comprise two or more different resin layers.

Moreover, the insulating layer may be formed by using a resin composite for the formation of a coarse surface.

As the resin composite for the formation of a coarse surface, those prepared by dispersing a substance which is soluble in a coarsening liquid comprising at least one member selected from acid, alkali and an oxidant, in an uncured, heat resistant resin matrix which is insoluble in a coarsening liquid comprising at least one member selected from acid, alkali and an oxidant can be cited as an example.

Here, with regard to the words "insoluble" and "soluble," for the sake of convenience, substances having a relatively high dissolution rate is referred to as "soluble," whereas those having a relatively low dissolution rate is referred to a "insoluble" in the case where those substances are immersed in the same coarsening liquid for the same period of time.

As for the heat resistant resin matrix, resins capable of maintaining the form of a coarse surface when the coarse surface is formed on the insulating layer using the coarsening liquid, can be used, and a thermosetting resin, a photosensitive resin, a thermoplastic resin, a composite body of those and the like can be cited as examples.

Examples of the thermosetting resin include an epoxy resin, a phenolic resin, a polyimide resin, a polyolefin resin, fluorine resin and the like. In addition, in the case where the above-described thermosetting resin is made photosensitive, methacrylic acid, acrylic acid or the like is used for carrying out (meth)acrylic conversion of the thermosetting group.

Examples of the thermoplastic resin include a phenoxy resin, polyether sulfone, polysulfone, polyphenylene sulfone, polyphenylene sulfide, polyphenyl ether, polyether imide and the like.

It is desirable for the above-described soluble substance to be of at least one kind selected from inorganic particles, resin particles and metal particles.

Examples of the inorganic particles include particles made of an aluminum compound, a calcium compound, a potassium compound, a magnesium compound, a silicon compound and the like.

Examples of the above-described resin particles include particles made of a thermosetting resin, a thermoplastic resin and the like, and the particles are not particularly limited as long as the dissolution rate is higher than the heat resistant resin matrix when immersed in a coarsening liquid made of at least one member selected from acid, alkali and an oxidant.

Here, it is necessary for a curing process to be carried out in advance on the above-described resin particles. This is because the above-described resin particles dissolve in a solvent for dissolving a heat resistant resin matrix, unless the particles are cured in advance.

Examples of the metal particles include particles made of gold, silver, copper, tin, zinc, stainless steel, aluminum, nickel, iron, lead and the like. In addition, the surface of the metal particles may be coated with a resin and the like, in order to secure insulating properties.

Examples of the acid used as the coarsening liquid include phosphoric acid, hydrochloric acid, sulfuric acid, nitric acid, and organic acids such as formic acid, acetic acid and the like; examples of the oxidant include chromic acid, a chromate acid mixture and solutions of alkaline permanganate (potassium permanganate) and the like; and examples of the alkali include sodium hydroxide, potassium hydroxide and the like.

The average particle diameter of the soluble substance is desirably set to about 10 μm or less.

In addition, a coarse particle having a relatively large average particle diameter and a fine particle having a relatively small particle diameter may be used in combination. By using in combination, it may become easier to form a shallow and complex coarse surface.

As the laser that is used in the laser process, a gas carbonate laser, an ultraviolet ray laser, an excimer laser and the like can be cited as examples. After the formation of openings for via holes, a desmear process may be carried out if necessary.

In addition, in this process, holes for through holes may be formed if necessary.

In addition, the material for the insulating layers is not limited to a thermosetting resin, a photosensitive resin, a resin where a photosensitive group has been added to a portion of a thermosetting resin, or a resin compound which includes any of these resins and a thermoplastic resin, and may be, for example, an insulating material such as ceramic, glass or silicon. In this case, openings for via holes may be created in advance in the insulating material such as ceramic.

(3) Next, a conductor circuit is formed on the surface of the insulating layer including the inner walls of the openings for via holes.

That is to say, first, a thin film conductor layer is formed on the surface of the insulating layer through electroless plating, sputtering or the like, and then, a plating resist is formed on part of the surface, and after that, an electrolytic plating layer is formed in the portion where the plating resist is not formed. Next, the plating resist and the thin film conductor layer beneath this plating resist are removed, so that a conductor circuit is formed.

As the material for the thin film conductor layer, examples thereof include: copper, nickel, tin, zinc, cobalt, thallium, lead and the like. The desirable material is copper or those comprised of copper and nickel, in order to obtain excellent electrical properties and from an economical point of view.

The thickness of the thin film conductor layer is desirably at least about 0.1 μm and at most about 2.0 μm.

Moreover, a coarse surface may be formed on the surface of the insulating layer before the formation of the thin film conductor layer.

The plating resist can be formed, for example, through exposure to light and development after a photosensitive dry film is pasted, and the like.

Here, the thickness of the electrolytic plating layer is desirably at least about 5 μm and at most about 20 μm. Copper plating is desirable as the electrolytic plating for the formation of the electrolytic plating layer.

The plating resist may be removed by using, for example, an alkaline solution and the like, and the thin film conductor layer may be removed using an etchant, such as a mixed liquid of sulfuric acid and hydrogen peroxide, sodium persulfate, ammonium persulfate, ferric chloride, cupric chloride or the like.

In addition, the catalyst on the insulating layer may be removed using acid or an oxidant if necessary after the formation of the conductor circuit. This arrangement is suitable for preventing deterioration of electrical characteristics.

(4) Furthermore, processes (2) and (3) may be repeated if necessary, so that an insulating layer and a conductor layer are formed in layers.

A multilayer circuit board in which conductor circuits and insulating layers are formed and laminated on both sides of a substrate can be manufactured by carrying out those processes (1) to (4).

(5) Next, an optical path for transmitting an optical signal is formed in the multilayer circuit board, if necessary. Here, an optical path for transmitting an optical signal which is formed in this process and penetrates through the multilayer circuit board is referred to also as a through hole for an optical path.

First, a through hole for an optical path is formed in the multilayer circuit board that has been manufactured through the above-described process.

The through hole for an optical path is formed in accordance with, for example, a drilling process, a laser process or the like.

As the laser used in the laser process, the same kinds of laser as can be used for the formation of the above-described openings for via holes can be cited.

It is desirable to use an apparatus with a function of recognizing marks (alignment marks) which reads recognizing marks (alignment marks) on a multilayer circuit board, corrects the point to be processed and carries out the drilling in the drilling process.

The position for formation and size of the above-described through hole for an optical path are not particularly limited, and an appropriate position for formation and size may be selected taking configurations such as the design of the conductor circuits, the point where the IC chip and the optical elements are mounted, into consideration.

Desirably, a through hole for an optical path as described above is formed for each optical element, for example a light receiving element or a light emitting element, or may be formed for each signal wavelength.

In addition, in the case where a through hole for an optical path in a form where a plurality of round pillars are aligned in parallel and certain portions of side faces of adjacent round pillars are connected to each other is formed in this process, it is desirable that the number of the formed round pillars should be an odd number, and it is also desirable to form round pillars which are not adjacent to each other in advance, and then form round pillars, in which certain portions of the side faces are connected to each other, between the round pillars which are not adjacent to each other.

This is because in the case where a round pillar is attempted to be formed in sequence so as to be adjacent to the previous round pillar with certain portions on the surface connected, the tip of the drill tends to shift in the direction of the already formed round pillar, and deviation is caused in the tip of the drill, and thus, the precision at the time of the drilling process may be lowered.

In addition, a desmear process may be carried out on the wall surface of a through hole for an optical path if necessary after the creation of the through hole for an optical path.

A process using a solution of permanganate, a plasma process, a corona process or the like can be used for the above-described desmear process. Here, the desmear process is suitable for removing resin residue, burrs and the like inside the through hole for an optical path, and is useful in that transmission loss of optical signal due to diffuse reflection of light from the wall surface of the completed optical path for transmitting an optical signal can be prevented from increasing.

In addition, a process for forming a coarse surface may be carried out in order to convert the wall surface of a through hole for an optical path to a coarse surface if necessary after the creation of a through hole for an optical path, before the formation of a conductive layer in the below described process or before filling the through hole with an uncured resin composite. This arrangement makes it easier to increase the adhesiveness between the wall surface and the conductive layer or the resin composite.

The formation of a coarse surface as described above can be carried out using, for example, acid such as sulfuric acid, hydrochloric acid or nitric acid, or chromic acid, a chromate acid mixture, an oxidant such as permanganate, or the like. In addition, it may also be carried out in accordance with a plasma process, a corona process or the like.

After the creation of a through hole for an optical path, a conductor layer may be formed on the wall surface of the through hole for an optical path if necessary. The formation of the conductor layer can be carried out in accordance with, for example, a method such as electroless plating, sputtering and vacuum vapor deposition.

In the case where a conductor layer of this kind is formed, in addition to the formation of the conductor layer on the wall surface of the through hole for an optical path, desirably a conductor circuit is also formed as the outermost layer on the outermost layer of the laminated insulating layers of the multilayer circuit board.

Specifically, first, a conductor layer is formed on the entirety of the surface of the insulating layer when the conductor layer is formed on the wall surface of the through hole for an optical path through electroless plating or the like.

Next, a plating resist is formed on the conductor layer that has been formed on the surface of this insulating layer.

Furthermore, an electrolytic plating layer is formed in a plating resist non-forming portion, and after that, the plating resist and the conductor layer beneath this plating resist are removed, and thereby, an independent conductor circuit is formed on the outermost layer of the laminated insulating layers.

Of course, even in the case where the conductor layer is not formed, a conductor circuit can be formed on the surface of the insulating layer in accordance with the above-described method.

In addition, after the formation of the conductor layer, a coarse surface may be formed on the wall surface of the conductor layer in accordance with the same method as that for forming a coarse surface on the conductor circuit.

(6) Next, the through hole for an optical path penetrating through the multilayer circuit board, which is formed in the above-described process (5), is filled in with a resin composite if necessary.

The through hole for an optical path is filled in with an uncured resin composite, and after that, a curing process is carried out, and thereby, the portion of the optical path for transmitting an optical signal to be completed in the subsequent process, which penetrates through the substrate and the insulating layers is filled in with a resin composite.

The concrete method for filling the through hole with an uncured resin composite is not particularly limited, and a printing method, a potting method or the like, for example, can be used.

Furthermore, it is desirable in this process to carry out a polishing process on the exposed surface of the resin composite exposed from the through hole for an optical path, so as to flatten the exposed surface. This is because, when the exposed surface is flattened, it may become easier to reduce the risk of interruption of the transmission of an optical signal.

The polishing process can be carried out through, for example, buffing, polishing using sandpaper or the like, mirror polishing, polishing to a clean surface, lapping or the like. In addition, chemical polishing using an acid, an oxidant or other chemicals can be carried out. In addition, a polishing process may be carried out by combining two or more of these methods.

In processes (5) and (6) described herein, an optical path for transmitting an optical signal which is filled in with a resin composite is formed after the formation of a conductor circuit on the outermost insulating layer.

However, in the method for manufacturing a package substrate according to the embodiments of the present invention, formation of the conductor circuit on the outermost insulating layer may be carried out in parallel with formation of the optical path for transmitting an optical signal which is filled in with a resin composite. That is to say, the following method may be used.

First, after the formation of the outermost insulating layer in the above-described process (2) or (4), a thin film conductive layer, a plating resist and an electrolytic plating layer are formed on the surface of the insulating layer in accordance with the same method as in the above-described process (3).

Next, a through hole for an optical path which penetrates through the substrate, the insulating layers, the thin film conductive layer and the plating resist is created in accordance with the same method as in the above-described process (5).

After that, the above-described through hole for an optical path is filled in with a resin composite in accordance with the same method as in the above-described process (6). Here, as described above, it is desirable that a polishing process be carried out on the exposed surface of the resin composite that is exposed from the through hole for an optical path so as to flatten this exposed surface.

Next, the plating resist and the thin film conductive layer beneath this plating resist are removed in accordance with the same method as in the above-described process (3), so that a conductor circuit if formed.

A conductor circuit and an optical path for transmitting an optical signal which is filled in with a resin composite may be formed in accordance with this method.

In addition, this method is appropriate for forming an optical path in such a manner that an end portion of the resin composite is located at almost the same level as the surface of the conductor circuit that is formed on the outermost insulating layer.

(7) Next, a solder resist layer is formed as the outermost layer of the multilayer circuit board in which a through hole for an optical path is formed.

The above-described solder resist layer can be formed by carrying out a hardening process after an uncured solder resist composition has been applied to the multilayer circuit board, or making a film made of the above-described solder resist composition adhere to the multilayer circuit board through pressure, and if necessary, carrying out a hardening process.

In addition, in this process, openings for the formation of solder bumps (openings for mounting an IC chip or an optical element) may be simultaneously formed when a solder resist layer is formed.

The above-described openings for forming solder bumps can be formed through, for example, exposure to light and development after application of the above-described solder resist composition.

In addition, when a solder resist layer is formed, a resin film having openings at desired points is manufactured in advance, and the solder resist layer having openings for forming solder bumps may be formed by pasting this resin film to the multilayer circuit board.

(8) Next, a microlens is provided on the solder resist layer, if necessary.

In addition, in the case where a microlens is provided, a surface treatment, such as a process using a water repellent coating material, a water repellant process using $CF_4$ plasma, a hydrophilic process using $O_2$ plasma or the like, may be carried out in advance in the portion where the microlens is provided.

The form of the microlens, in particular the degree of sagging, may easily vary, depending on the wettability in the portion where the above-described microlens is provided, but the varying degree of sagging may be more easily reduced by carrying out a surface treatment.

Concrete methods for the surface treatments described above are briefly described.

In the case where a process using a water repellent coating agent as described above is carried out, first, masking is carried out in such a manner that an opening is provided in a portion which corresponds to the portion of the solder resist layer where the microlens is to be formed, and then a water repellent coating agent is applied through spraying, using a spin coater or the like, and after that, the water repellent coating agent is naturally dried and the mask is peeled off to complete the surface treatment. The thickness of the water repellent coating agent layer is usually about 1 μm. Here, a mesh plate, a mask where a resist is formed or the like may be used.

When a process using a water repellent coating agent is carried out, the process may be carried out on the entire surfaces of the solder resist layer without using a mask.

On the other hand, in the case where a water repellent process using $CF_4$ plasma as described above is carried out, first, masking is carried out in such a manner that an opening is provided in a portion which corresponds to the portion of the solder resist layer where the microlens is to be formed, after which a $CF_4$ plasma process is carried out, and furthermore, the mask is peeled off to complete the surface treatment. Here, a mask where a resist is formed may be used.

In the case where a hydrophilic process using the above-described $O_2$ plasma is carried out, first, masking is carried out in such a manner that an opening is provided in a portion which corresponds to the portion of the solder resist layer where the microlens is to be formed, after which a $O_2$ plasma process is carried out, and furthermore, the mask is peeled off to complete the surface treatment. Here, a metal plate or a mask where a resist is formed may be used.

Here, it is desirable to carry out the water repellent process (including a process using a water repellent coating agent) and a hydrophilic process in combination.

In the case where the above-described microlens is provided, the microlens may be disposed on the solder resist layer directly, or may be disposed by interposing an adhesive layer.

With this arrangement, a separately prepared microlens may be more certainly and easily disposed.

As the method for providing a microlens directly on the solder resist layer, a method for dropping an appropriate amount of uncured resin for an optical lens onto the solder resist layer and carrying out a curing process on this uncured resin for an optical lens that has been dropped can be cited, for example.

In the above-described method, when dropping appropriate amount of uncured resin for an optical lens onto the solder resist layer, an apparatus such as a dispenser, an inkjet, a micro pipette or a micro syringe can be used. In addition, the uncured resin for an optical lens that has been dropped onto the solder resist layer using such an apparatus tends to be spherical, due to its surface tension, and therefore, it becomes of a hemispherical form on the solder resist layer, and after that, a curing process is carried out on the uncured resin for an optical lens in hemispherical form, and thereby, a microlens in hemispherical form can be formed on the solder resist layer.

Here, the form of the microlens that is formed in this manner, including the diameter and the curve, can be controlled by adjusting the viscosity and the like of the uncured resin for an optical lens to an appropriate degree taking the wettability of the solder resist layer for the uncured resin for an optical lens.

(9) Next, solder pads and solder bumps are formed in accordance with the following method, and furthermore, an optical element is mounted.

That is to say, the portions of the conductor circuit that have been exposed from the openings for forming solder bumps are coated with an anti-corrosive metal, such as nickel, palladium, gold, silver, platinum or the like, if necessary, so that solder pads are formed.

The above-described coating layer may be formed through plating, vapor deposition, electrodeposition, and the like. Among these, formation through plating is desirable from the viewpoint of a high uniformity in the coating layer. Here, the pads may be formed before the process for providing a microlens.

Furthermore, the space for the solder pads is filled in with a solder paste using a mask where openings are formed in portions corresponding to the solder pads, and after that, the solder bumps are formed through reflow. Here, gold bumps may be formed instead of solder bumps.

Furthermore, an optical element (light receiving element or light emitting element) is mounted on the solder resist layer. The optical element is mounted, for example, by interposing the solder bumps. Also, the optical element may be mounted in such a manner, for example, that, in the process of forming the solder bumps, the optical element is provided soon after the solder paste is filled, and then the optical element is mounted at the time of reflow. Here, the composition of the solder used here is not particularly limited, and may be any composition such as Sn/Pb, Sn/Pb/Ag, Sn/Ag/Cu and Sn/Cu. Moreover, the optical element may be mounted by using a conductive adhesive agent and the like instead of a solder.

(10) Next, a gap between the optical element and the solder resist layer is filled in with an underfill, if necessary. Here, in order to provide an underfill, a resin composite is applied moving the nozzle while dropping the resin composite around the periphery of the optical element that has been mounted through flip chip bonding using a dispenser apparatus, for example. The resin composite that has been applied in this manner flows into the portion beneath the chip due to capillarity, and then, after the resin composite has completely flown into the portion beneath the chip, a hardening process is carried out on the resin composite, and thus, an underfill is provided.

Here, when the resin composite is applied around the periphery of the optical element, the resin composite flows in from the entirety of the outer periphery of the optical element in the case where the resin composite is applied in the entirety of the periphery of the optical element (for example along all of the four sides in the case where the optical element is a quadrilateral in a plan view), and therefore, a void is easily created in the vicinity of the center of the portion beneath the optical element. Accordingly, when the resin composite is applied, it is desirable for the resin composite not to be applied in one portion of the periphery of the optical element (for example one side in the case where the form of the optical element is quadrilateral in a plan view), or for the order or the rate of application of the resin composite to be adjusted. This is because as a result, creation of a void can be prevented beneath the optical element.

The package substrate can be manufactured in these processes according to the present invention.

A package substrate where an optical path for transmitting an optical signal in a recess shape as described above is formed can be manufactured in accordance with, for example, the following method.

That is to say, first, a multilayer circuit board is manufactured in accordance with the same method as in the processes (1) to (4), and after that, a spot facing is carried out on the multilayer circuit board so that a recess (cavity) to form an optical path for transmitting an optical signal is formed.

Next, a conductor circuit is exposed from the bottom of the above-described recess, and the coating layer is formed on the exposed portion if necessary, and after that, an optical element and an IC chip are mounted at the bottom through flip chip or wire bonding.

Next, the above-described recess (cavity) is filled in with a resin composite in accordance with the same method as in the above process (6), and furthermore, a solder resist layer is formed, a microlens is provided, and solder bumps are formed appropriately in the same manner as in the above processes (7) to (9), and thereby, a package substrate having an optical path for transmitting an optical signal in a recess shape (cavity shape) as described above formed therein can be manufactured.

Though sufficient miniaturization of terminal apparatuses and the like can be achieved with a conventional substrate for mounting an IC chip, it cannot be said that this is sufficient from the viewpoint of reliability in the transmission of an optical signal.

In the following, the reasons for this are briefly described in reference to the drawings.

Figure 4A:
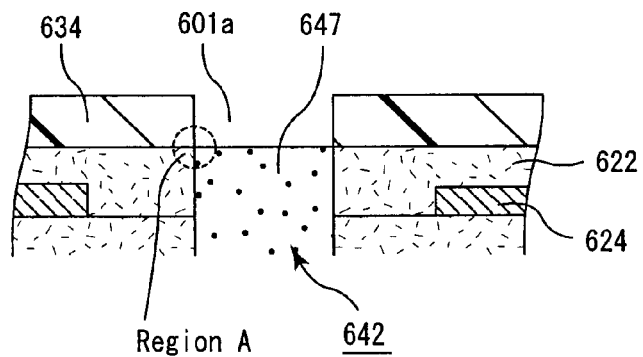
FIGS. 4A and 4B are partial cross-sectional views that schematically show a part of a conventional package substrate.
Figure 4B:
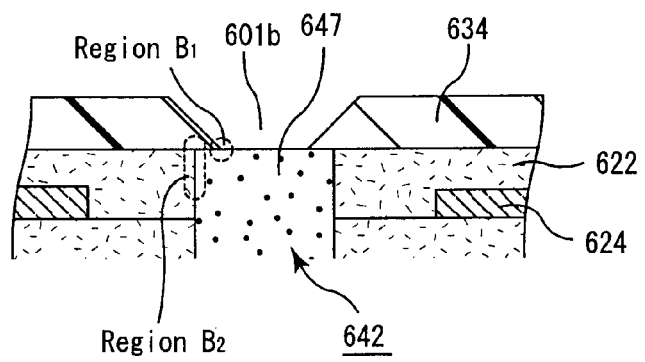

FIGS. 4A and 4B are partial cross sectional diagrams schematically showing a portion in the vicinity of the end portion of an optical path for transmitting an optical signal which is formed in a conventional substrate for mounting an IC chip (package substrate).

In the substrate for mounting an IC chip shown in FIG. 4A, a portion which penetrates through a substrate (not shown) and an insulating layer 622 of the optical path for transmitting an optical signal 642 which penetrates through the substrate, the insulating layer and a solder resist layer, is filled in with a resin composite 647, and a portion 601a which penetrates through the solder resist layer 634 is an opening.

In addition, the portion of the optical path for transmitting an optical signal 642 which penetrates through the insulating layer 622 and the portion which penetrates through the insulating layer 634 have almost the same diameter in a cross section.

In the optical path for transmitting an optical signal having a configuration as described above and the peripheral portion thereof, it is easy for the resin composite 647 to peel from the wall surface of the insulating layer 622, as well as for cracking to occur in the resin composite 647, in a region in the interface between the insulating layer 622 and the resin composite 647 in the vicinity of the end portion on the solder resist layer 634 side (region A in the figure).

In addition, as shown in FIG. 4B, in the case where a portion 601b which penetrates through the solder resist layer of the optical path for transmitting an optical signal 642 has such a form as to have a taper, it becomes difficult for the resin composite 647 to peel from the insulating layer 622 in the vicinity of the interface between the two (region $B_2$ in the figure) because this region is covered with the solder resist layer, but cracking easily occurs in the resin composite, in the region beneath the wall surface (region $B_1$ in the figure) of the portion 601b which penetrates through the solder resist layer.

As described above, in the case where the resin composite peels from the wall surface of the insulating layer or the like or cracking occurs in the resin composite, transmission of optical signals tends to be hindered in the peeled portion or portion where cracking has occurred. Therefore, the reliability of the conventional substrate for mounting an IC chip having a configuration as described above is not sufficient when used for optical communication.

On the other hand, peeling or cracks as described above tend not to occur in the package substrate according to the embodiments of the present invention, and thus the package substrate of the present invention has a sufficient reliability.

Next, a device for optical communication according to the embodiment of the present invention is described.

The device for optical communication according to the present invention comprises: a substrate for a motherboard comprising at least a conductor circuit and an insulating layer formed and laminated to form a laminated body, at least one solder resist layer further formed and laminated on at least one side of the laminated body, an optical path for transmitting an optical signal, and an optical waveguide; and a package substrate having an optical element mounted thereon and/or an optical element, the package substrate and/or the optical element mounted on the substrate for a motherboard, wherein at least one outermost layer of the solder resist layers formed and laminated on the laminated body has a transmittance for light having a wavelength for communication of about 60% or more at a thickness of 30 μm.

In the package substrate according to the above-described embodiment, an end portion of the optical path for transmitting an optical signal is desirably covered with the solder resist layer.

In the device for optical communication according to the embodiment of the present invention, the solder resist layer that is formed and laminated on the laminated body is transparent to light having a wavelength for communication, so that an optical signal can be sufficiently transmitted, and therefore, it is not necessary to form an optical path for transmitting an optical signal that penetrates through the solder resist layer, and as a result, peeling of the resin composite filled in the optical path for transmitting an optical signal from the insulating layer and the like, or cracking in the resin composite tend not to occur, achieving excellent reliability.

In the package substrate according to the above-described embodiment, an end portion of the optical path for transmitting an optical signal is desirably covered with the solder resist layer.

At least one solder resist layer is formed and laminated as the outermost layer of the substrate for a motherboard which forms the device for optical communication according to the embodiment of the present invention.

The transmittance of the above-described solder resist layer for light having a wavelength for communication is about 60% or more at a thickness of 30 µm. This is because in the case where the transmittance for light having a wavelength for communication at a thickness of 30 µm is 60% or more, the transmission loss of optical signals tends not to become too great, and thus the suitable for transmission of an optical signal.

It is more desirable for the transmittance for light having a wavelength for communication at a thickness of 30 µm to be about 90% or more.

The same solder resist layer as that formed and laminated as the outermost layer of the package substrate according to the embodiments of the present invention can be cited as a specific example of the above-described solder resist layer.

The lower limit of the thickness of the solder resist layer is desirably about 10 µm, and more desirably about 15 µm. Meanwhile, the upper limit of the thickness of the solder resist layer is desirably about 40 µm, and more desirably about 30 µm. When the thickness of the solder resist layer is within the above-described range, functions of the solder resist layer may be certainly carried out, and also transmissivity of optical signals may be sufficiently secured.

Here, in the case where an optical waveguide is formed on the outermost insulating layer and a solder resist layer is formed and laminated so as to cover this optical waveguide in the above-described substrate for a motherboard, it is desirable that the thickness in the portion of the solder resist layer formed and laminated on the optical waveguide be within the above-described range.

At least one solder resist layer as described above may be formed, and the number of layers may be two or more.

In addition, in the case where two or more solder resist layers are formed, it is sufficient if at least the outermost solder resist layer has a transmittance within the above-described range. Here, in this case, as for solder resist layers other than the outermost layer of which the transmittance for light having a wavelength for communication at a thickness of 30 µm is less than about 60%, it is presumably necessary to form an optical path for transmitting an optical signal which penetrates through the solder resist layer.

In the case where two or more layers of solder resist layers are formed, and only the outermost solder resist layer has the transmittance for light having a wavelength for communication of about 60% or more at a thickness of 30 µm, and also an optical path for transmitting an optical signal is formed in other solder resist layers so as to penetrate therethrough, a sufficient thickness of the solder resist layers may be secured, and at the same time transmission of an optical signal may be certainly carried out.

In addition, it is desirable for the refractive index of the above-described solder resist layer to be the almost same as the refractive index of the below described optical path for transmitting an optical signal. This is because no transmission loss occurs due to reflection in the interface between the two.

In addition, in the case where an underfill is filled in a gap between the package substrate on which an optical element is mounted or the optical element and the solder resist layer in the device for optical communication according to the embodiment of the present invention as described below, it is desirable for the refractive index of the solder resist layer and the refractive index of the underfill to be almost the same. This is because in this case also no transmission loss occurs due to reflection in the interface between the solder resist layer and the underfill.

In the device for optical communication according to the embodiments of the present invention, a package substrate on which an optical element is mounted and/or an optical element (hereinafter, both are referred to as an optical element mounted package substrate or the like) is mounted on a substrate for a motherboard.

As the above-described package substrate, package substrates according to the embodiments of the present can be cited as examples.

In addition, a gap between an optical element mounted package substrate or the like and the solder resist layer formed on the substrate for a motherboard may be filled in with an underfill. The same underfill as that provided to the package substrate according to the embodiments of the present invention can be cited as a specific example of the underfill.

In the substrate for a motherboard, an optical path for transmitting an optical signal and an optical waveguide are formed. As a result, in the above-described package substrate for a motherboard, it may become possible to transmit an optical signal through this optical path for transmitting an optical signal.

Examples of the optical waveguide include an organic-based optical waveguide, an inorganic-based optical waveguide comprising silica glass, silicon, a compound semiconductor and the like. Among the above examples, an organic-based optical waveguide is desirable. This is because, the optical waveguide of this kind has an excellent adhesion with an interlayer resin insulating layer, and thus processing becomes easy.

The above-described polymer material is not particularly limited, as long as it has little absorption for a wavelength band for communication, and a thermosetting resin, a thermoplastic resin, a photosensitive resin, a resin where a portion of a thermosetting resin is made photosensitive, a resin compound of a thermosetting resin and a thermoplastic resin, and a compound of a photosensitive resin and a thermoplastic resin, and the like can be cited.

Specifically, polymers manufactured from an acryl resin such as PMMA (polymethyl methacrylate), deuterated PMMA and deuterated PMMA fluoride, a polyimide resin such as polyimide fluoride, an epoxy resin, a UV (ultraviolet) curing epoxy resin, a polyolefin based resin, a silicone resin such as deuterated silicone resin, a siloxane resin, benzocyclobutene or the like can be cited.

In addition, in the case where the optical waveguide is a multimode optical waveguide, the material thereof is desirably an acryl resin, an epoxy resin or a UV (ultraviolet) curing epoxy resin, since the formation of the waveguide becomes easier. Also, in the case where the optical waveguide is a single mode optical waveguide, the material thereof is desirably a polyimide resin, a silicone resin or a siloxane resin.

In addition, the thickness of the core portion of the above-described optical waveguide is desirably set to at least about 1 µm and at most about 100 µm, and the width thereof is desirably set to at least about 1 µm and at most about 100 µm. In the case where the thickness or width of the core portion is about 1 µm or more, the formation thereof may become easier, while in the case where the thickness or width of the core portion is about 100 µm or less, the freedom in design of the conductor circuit forming the substrate for a motherboard is not likely to be deteriorated.

In addition, the ratio of the thickness to the width in the core portion of the optical waveguide is desirably set close to about (1:1). This is because, the form in the light receiving portion of the above-described light receiving element and the form in the light emitting portion of the above-described light emitting element are circular in a plan view. Here, the ratio of the thickness to the width is not particularly limited, as long as the ratio is at least about (1:2) and at most about (2:1).

Furthermore, in the case where the above-described optical waveguide is a single mode optical waveguide with a wavelength for communication of 1.31 µm or 1.55 µm, the thickness and the width of the core portion is desirably set to at least about 5 µm and at most about 15 µm, and most desirably set to about 10 µm.

In addition, in the case where the optical waveguide is a multimode optical waveguide with a wavelength for communication of 0.85 µm, the thickness and the width of the core portion is desirably set to at least about 20 µm and at most about 80 µm. This is because, in the case where the thickness and the width of the core portion is about 20 µm or more, formation thereof becomes easier, while in the case of about 80 µm or less, miniaturization of the substrate for a motherboard tends not to be obstructed. A most desirable value is set to about 50 µm.

In addition, in the optical waveguide, particles may also be mixed. This is because, when particles are mixed in, it becomes difficult for cracks to occur in the optical waveguide. That is to say, in the case where no particles are mixed in the optical waveguide, cracks may sometimes occur in the optical waveguide due to the difference in the coefficient of thermal expansion between the optical waveguide and the other layer (substrate, insulating layer or the like); thus, in the case where the difference in the coefficient of thermal expansion between the optical waveguide and the above-described other layer is made small by adjusting the coefficient of thermal expansion by mixing particles into the optical waveguide, it becomes difficult for cracks to occur in the optical waveguide.

As the above-described particles, the same particles as those included in the optical path for transmitting an optical signal which forms the package substrate according to the embodiments of the present invention can be cited as examples.

These particles may be used alone, or two or more kinds may be used together.

As the above-described particles, inorganic particles are desirable, and particles comprising silica, titania or alumina are desirable. This is because, manufacturing becomes easier and the coefficient of thermal expansion may be more easily adjusted.

In addition, particles having a mixed composition formed by mixing and fusing at least two kinds among silica, titania and alumina are also desirable.

The form of the particle such as resin particle is not particularly limited, and sphere shape, elliptical sphere shape, crashed shape, polyhedron shape and the like can be cited.

The particle diameter of the above-described particle is desirably shorter than the wavelength for communication. This is because, in the case where the particle diameter is less than the wavelength for communication, transmission of an optical signal may not easily interrupted.

More desirably, the lower limit of the particle diameter is about 0.01 µm and the upper limit thereof is about 0.8 µm. This is because, in the case where particles having a particle diameter within this range are included, distribution in the particle size tends not to be too wide, and inconsistency (deviation) of the viscosity of the resin composite tends not to be become too great when the particles are mixed into the resin composite, and thus, reproducibility in preparing the resin composite tends not to become worse, and as a result, it may become easier to prepare a resin composite having a predetermined viscosity.

Still more desirably, the lower limit of the particle diameter is about 0.1 µm and the upper limit thereof is about 0.8 µm. This is because, in the case where the particle diameter is within this range, it is appropriate for the resin composite to be applied using a spin coat method, a roll coating or the like, and it becomes easier to prepare a resin composite having a predetermined viscosity when the resin composite is prepared by mixing in particles.

It is particularly desirable for the lower limit of the particle diameter to be about 0.2 µm and the upper limit to be about 0.6 µm. This range is particularly appropriate for the application of the resin composite and formation of the core portion of the optical waveguide. Furthermore, inconsistency (deviation) in the formed optical waveguides becomes very small, in particular, inconsistency (deviation) in the core portion, becomes the smallest, and the properties of the substrate for a motherboard become particularly excellent.

In addition, particles with two or more different particle diameters may be included, as long as the particles have a particle diameter within this range.

A desirable lower limit for the amount of particles mixed therein as described above is about 10% by weight, and a more desirable lower limit is about 20% by weight. Meanwhile, a desirable upper limit for the above-described particles is about 80% by weight, and a more desirable upper limit is about 70% by weight. This is because, in the case where the amount of particles mixed in is about 10% by weight or more, it becomes possible to obtain the effects of mixing particles more easily, and in the case where the amount of particles mixed in is about 80% by weight or less, transmission of an optical signal tends not to be obstructed.

Although the form of the optical waveguide is not particularly limited, sheet form is preferable, because it is easily formed.

In the case where the optical waveguide comprises a core portion and a clad portion, though the particles may be mixed into both the core portion and the clad portion, desirably, the particles are not mixed in the core portion and mixed only in the clad portion that covers the surrounding of this core portion. The reason for this is as follows.

That is to say, in the case where particles are mixed in an optical waveguide, an air layer may generate in the interface between the particles and the resin component, depending on the adhesiveness between these particles and the resin component of the optical waveguide, and in such a case, the direction of refraction of light is changed by this air layer, increasing the transmission loss of the optical waveguide. On the other hand, in the case where particles are mixed only in the clad portion, even when particles are mixed in as described above, problems such as increase in transmission loss of the optical waveguide tends not to arise, and also it may become easier to exert the above-described effects such as less occurrence of cracks in the optical waveguide.

In addition, it is desirable for an optical path conversion mirror to be formed on the optical waveguide. By forming an optical path conversion mirror, it becomes possible to change the optical path by a desired angle.

The optical path conversion mirror can be formed, for example, by cutting an end portion or a predetermined portion of the optical waveguide as described below, and the like. In addition, a member having an optical path converting portion may be placed at the end of an end portion of the optical waveguide instead of forming an optical path conversion mirror in the optical waveguide.

Moreover, in the substrate for a motherboard, an optical path for transmitting an optical signal having a collective through hole structure or an individual through hole structure is formed so as to penetrate through at least an insulating layer. Here, a part or the entirety of the optical path for transmitting an optical signal may be formed of a resin composite. When a part or the entirety of the optical path for transmitting an optical signal is formed of a resin composite, it may become easier to prevent foreign matters such as litter, dust and the like from entering into the optical path for transmitting an optical signal. Moreover, by controlling the refractive index of the resin composite forming the optical path for transmitting an optical signal, it may become possible to reduce the transmission loss.

Here, examples of the resin composite include the same resin composites as those which may be able to form the optical path for transmitting an optical element in the above-described package substrate according to the embodiments of the present invention.

In addition, it is desirable for an end portion of the above-described optical path for transmitting an optical signal to be covered with a solder resist layer. In this configuration, peeling of the resin composite filled in the optical path for transmitting an optical signal from the insulating layer, cracking in the resin composite and the like tend not to occur, and thus, transmission loss of an optical signal due to peeling and cracking may be more easily reduced, and therefore an excellent transmissivity of an optical signal may be achieved.

In addition, in the above-described substrate for a motherboard, it is desirable for a microlens to be provided on the outermost solder resist layer which is formed and laminated on the side where the package substrate having an optical element mounted thereon and/or the optical element is mounted. This is because, by providing a microlens, transmission of an optical signal is carried out more certainly.

Here, as the specific material and properties, for example the transmittance, for the above-described microlens, the same as those for the microlens that is provided to the package substrate according to the embodiments of the present invention may be cited.

In addition, in the above-described substrate for a motherboard, a surface treatment may be carried out in the region where the microlens is to be provided in the same manner as the package substrate according to the embodiments of the present invention, and the microlens may be provided with a lens marker in between.

In addition, in the substrate for a motherboard, the laminated body comprises a substrate, and the conductor circuit and the insulating layer formed and laminated on both sides of the substrate, and the conductor circuits having the substrate therebetween are desirably connected to each other via a through hole, and the conductor circuits having the insulating layer therebetween are desirably connected to each other via a via hole. This is because miniaturization of the device for optical communication may become easier, while achieving a high density wiring of the device for optical communication.

A concrete embodiment of the device for optical communication according to the embodiment of the present invention includes a device for optical communication in which conductor circuits, insulating layers and solder resist layers are formed and laminated on both sides of the substrate, and an optical waveguide is formed on the outermost insulating layer on the side opposite to the side where the optical element mounted package substrate is mounted as described above, and in this case, it is more desirable for a solder resist layer to be formed and laminated so as to cover the above-described optical waveguide. This is because, when the solder resist layer is formed so as to convert the optical waveguide, the optical waveguide is protected.

In addition to this, the embodiment in which solder resist layers are formed and laminated on both sides of the substrate, and an optical waveguide is formed on the solder resist layer on the side opposite to the side where the optical element mounted package substrate and the like is mounted is desirable. In this case, formation of the optical waveguide may become easier.

In the following, a device for optical communication according to embodiments of the present invention is described in reference to the drawings.

Figure 5:
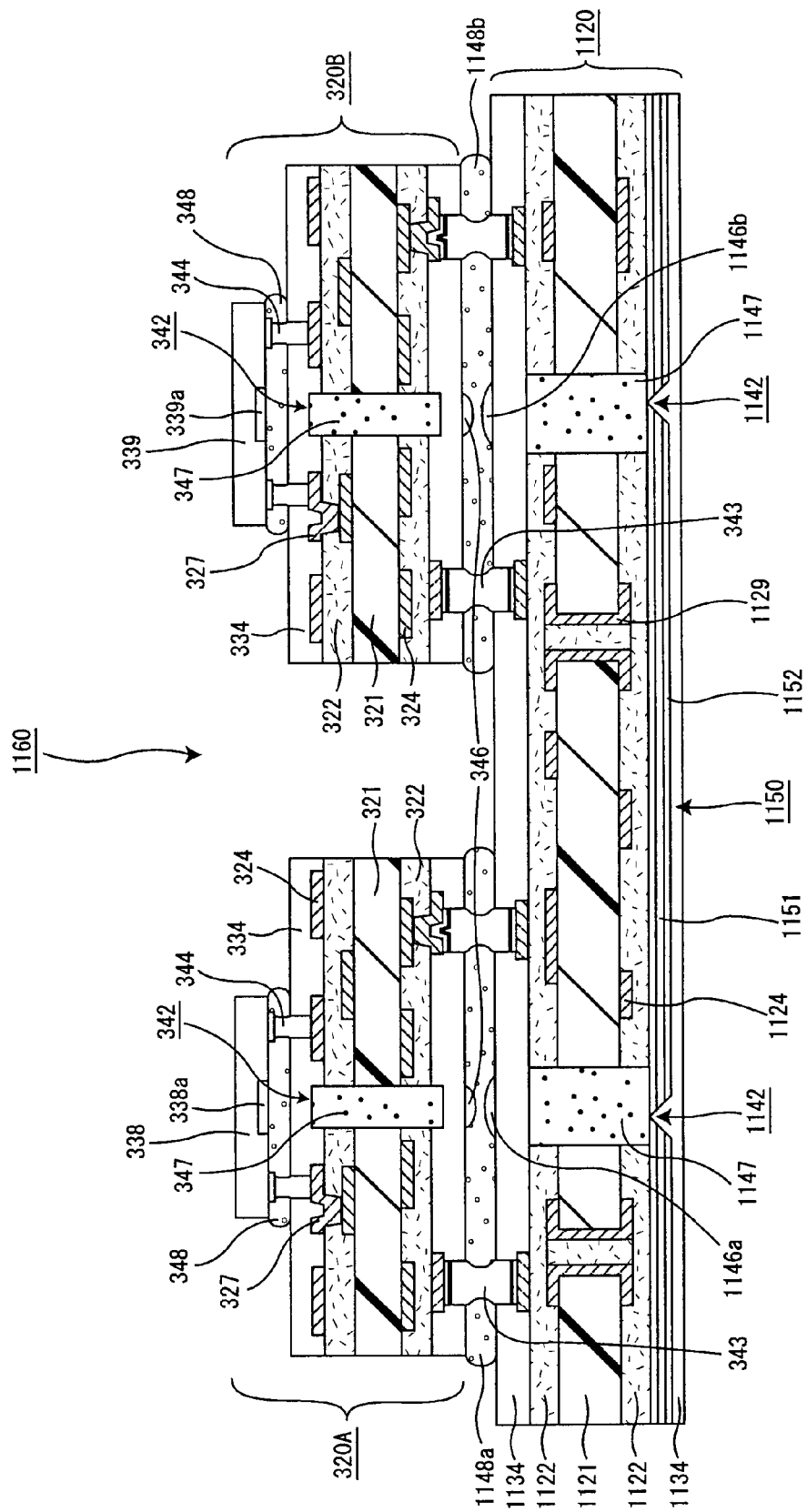
FIG. 5 is a cross-sectional view that schematically shows one example of a device for optical communication according to one embodiment of the present invention.

FIG. 5 is a cross sectional view schematically showing one example of a device for optical communication according to one embodiment of the present invention.

FIG. 5 shows a device for optical communication 1160 where a package substrate 320B on which a light receiving element 339 is mounted according to one embodiment of the present invention, and a package substrate 320A on which a light emitting element 338 is mounted according to one embodiment of the present invention are mounted on a substrate for a motherboard 1120. Here, package substrates 320A and 320B are package substrates according to the embodiments of the present invention with an IC chip mounted thereon.

That is to say, in the package substrate 320A, conductor circuits 324 and insulating layers 322 are formed and laminated on both sides of a substrate 321, and the conductor circuits having the substrate 321 in between are electrically connected by means of through holes (not shown), and the conductor circuits having the insulating layers 322 in between are electrically connected through via holes 327. In addition, a solder resist layer 334 having a transmittance of the above range is formed as the outermost layer.

In this package substrate 320A, an optical path for transmitting an optical signal 342 is provided so as to penetrate through the substrate 321, the insulating layers 322 and the like.

This optical path for transmitting an optical signal 342 is filled in with a resin composite 347. Further, a microlens 346 is provided on the solder resist layer 334 on the side facing the substrate for a motherboard 1120. Here, the resin composite 347 is formed in such a manner that the end portion thereof is located at almost the same level as the surface of the conductor circuit 324.

The light emitting element 338 is mounted on one surface of the package substrate 320A through a solder connection portion 344. Moreover, a gap between the light emitting element 338 and the solder resist layer 334 is filled in with an underfill 348. In addition, though not shown, an IC chip is mounted with a solder connection portion in between on the surface of the package substrate 320 on which the light emitting element 338 is mounted.

In addition, the package substrate 320B has the same configuration as the package substrate 320A, except that a light receiving element 339 is mounted instead of the light emitting element 338.

In the substrate for a motherboard 1120, conductor circuits 1124 and interlayer resin insulating layers 1122 are formed and laminated on both sides of a substrate 1121, and conductor circuits having the substrate 1121 in between are electrically connected by means of through holes 1129, and the conductor circuits having the insulating layers 1122 in between are electrically connected through via holes (not shown). Also, solder resist layers 1134 having a transmittance of the above range are formed as outermost layers.

The optical path for transmitting an optical signal 1142 is formed in the substrate for a motherboard 1120 so as to penetrate through the substrate 1121 and the insulating layer 1122. Also, the portions of the optical path for transmitting an optical signal 1142 which penetrate through the substrate 1121 and the insulating layer 1122 are filled in with the resin composite. Here, the resin composite 1147 is formed in such a manner that an end portion thereof is located at almost the same level as the surface of the outermost insulating layer. Alternatively, the resin composite may be formed in such a manner that an end portion thereof is located at almost the same level as the surface of the conductor circuits formed on the outermost insulating layer.

Optical waveguides 1150 constituted by cores 1151 and clads 1152 are formed on the outermost layer of the insulating layers 1122 on the side of the substrate for a motherboard 1120 opposite to the side where the package substrates 320A and 320B are mounted.

Also, optical path conversion mirrors are formed on the respective end portions of the optical waveguides 1150 so that an optical signal can be transmitted between the optical waveguides 1150 and the optical paths 1142 for transmitting an optical signal.

Microlenses 1146a and 1146b are provided on the solder resist layer 1134 on the side facing the package substrates 320A and 320B. Here, the microlenses 1146a and 1146b are respectively provided in positions corresponding to the respective end portions of the cores 1151 where the optical path conversion mirrors are formed on the end portions.

Moreover, in the device for optical communication 1160, the package substrates 320A and 320B are mounted with solder connection portions 343 in between, on the surface of the substrate for a motherboard 1120 on the side opposite to the side where the optical waveguides 1150 is formed.

Here, the package substrates 320A and 320B are respectively mounted in a predetermined position by the self-alignment function.

Furthermore, a gap between the package substrate 320A and the solder resist layer 1134, and a gap between the package substrate 320B and the solder resist layer 1134 are each filled in with an underfill 1148a and an underfill 1148b, respectively.

Figure 6:
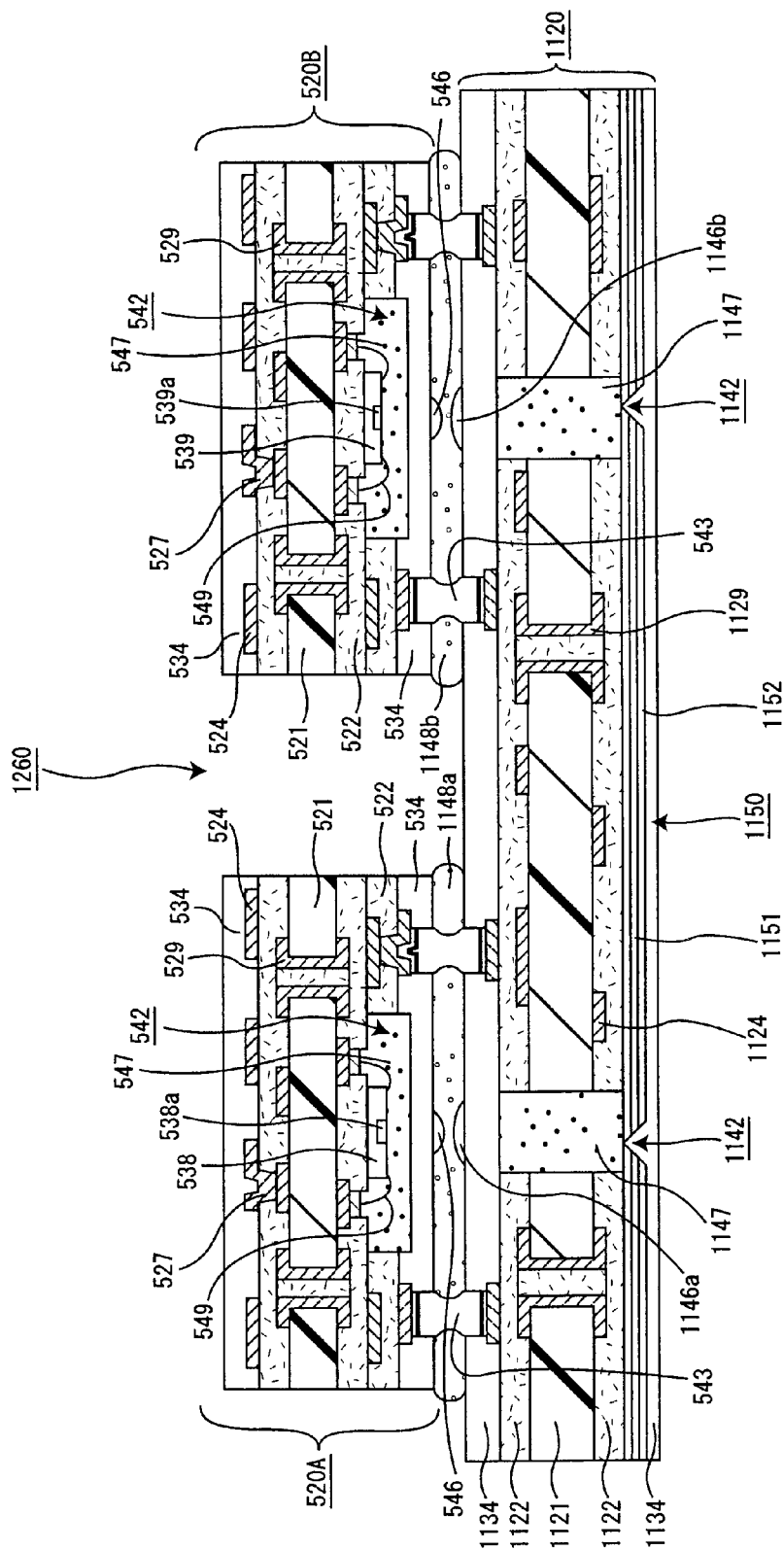
FIG. 6 is a cross-sectional view that schematically shows another example of a device for optical communication according to one embodiment of the present invention.

In addition, the embodiment of the device for optical communication according to the embodiment of the present invention is not limited to the embodiment shown in FIG. 5, but may be, for example, an embodiment shown in FIG. 6.

FIG. 6 is a cross sectional diagram schematically showing another example of a device for optical communication according to the embodiment of the present invention. FIG. 6 shows a device for optical communication 1260 where a package substrate 520A having a light emitting element 538 mounted thereon and a package substrate 520B having a light receiving element 539 mounted thereon are mounted on a substrate for a motherboard 1120. Here, the package substrates 520A and 520B are package substrates according to the embodiments of the present invention in a state where an IC chip is mounted.

Here, the device for optical communication 1260 has different configurations of the package substrates 520A and 520B in comparison with the device for optical communication 1160 shown in FIG. 5, whereas the configuration of the substrate for a motherboard is the same as that of the device for optical communication 1160. Accordingly, an embodiment of the device for optical communication 1260 is herein described, focusing on the structure of the package substrates 520A and 520B.

In the package substrate 520A, conductor circuits 524 and insulating layers 522 are formed and laminated on both sides of a substrate 521, and the conductor circuits having the substrate 521 therebetween are electrically connected by means of through holes 529, and the conductor circuits having the insulating layers 522 therebetween are electrically connected through via holes 527. In addition, solder resist layers 534 having a transmittance within the above range are formed as outermost layers.

An optical path for transmitting an optical signal 542 in recess form is provided in this package substrate 520A.

A light emitting element 538 and an IC chip (not shown) are mounted within this optical path for transmitting an optical signal 542, using wires 549 for wire bonding, and furthermore, the optical path for transmitting an optical signal 542 is filled in with a resin composite 547. Here, the resin composite 547 is in such a form that an end portion thereof is located at almost the same level as the surface of the conductor circuit 524, which is formed on the outermost insulating layer.

In addition, a microlens 546 is provided on the solder resist layer 1134 on the side facing the substrate for a motherboard 1120.

In addition, the package substrate 420B has the same structure as the package substrate 420A, except that a light receiving element 439 is mounted instead of a light emitting element 438.

As described above, the substrate for a motherboard 1120 has the same configuration as the substrate for a motherboard shown in FIG. 5.

In addition, in the device for optical communication 1260, package substrates 520A and 520B are mounted through a solder connection portion 543 on the surface of the substrate for a motherboard 1120 on the side opposite to the side where the optical waveguide 1150 is formed. Here, package substrates 520A and 520B are respectively mounted in a predetermined location by the self-alignment function.

Furthermore, a gap between the package substrate 520A and the solder resist layer 1134, and a gap between the package substrate 520B and the solder resist layer 1134 are each filled in with an underfill 1148a and an underfill 1148b, respectively.

Here, as shown in FIGS. 5 and 6, though it is desirable in the device for optical communication according to the embodiments of the present invention for solder resist layers to be formed and laminated so as to cover the optical waveguide, a solder resist layer may not necessarily be formed and laminated on the side where the optical waveguide is formed.

Moreover, in the package substrate for a motherboard shown in FIGS. 5 and 6, an optical waveguide having optical path conversion mirrors on both sides thereof is formed at a part of the outermost insulating layer, whereas the device for optical communication according to the embodiments of the present invention may have a configuration in which an optical waveguide is formed on the entirety of the outermost insulating layer and an optical path conversion mirrors are formed at predetermined locations.

In addition, in the device for optical communication shown in FIGS. 5 and 6, though solder bumps and the like are not particularly formed on the substrate for a motherboard on the side opposite to the side where the package substrates are mounted, solder bumps may be formed in order to mount an electronic part or an optical part, or to make the connection with another substrate.

In addition, in the device for optical communication according to the present invention, which is described in reference to FIGS. 5 and 6, an optical signal is transmitted via the optical waveguide between the package substrates which are mounted on the substrate for a motherboard or between the optical elements, that is to say, an optical signal is transmitted within the substrate.

However, the device for optical communication according to the embodiments of the present invention may allow for the transmission of an optical signal between this device and an external substrate. In the following, an example of such a device for optical communication is described in reference to the drawings.

Figure 7:
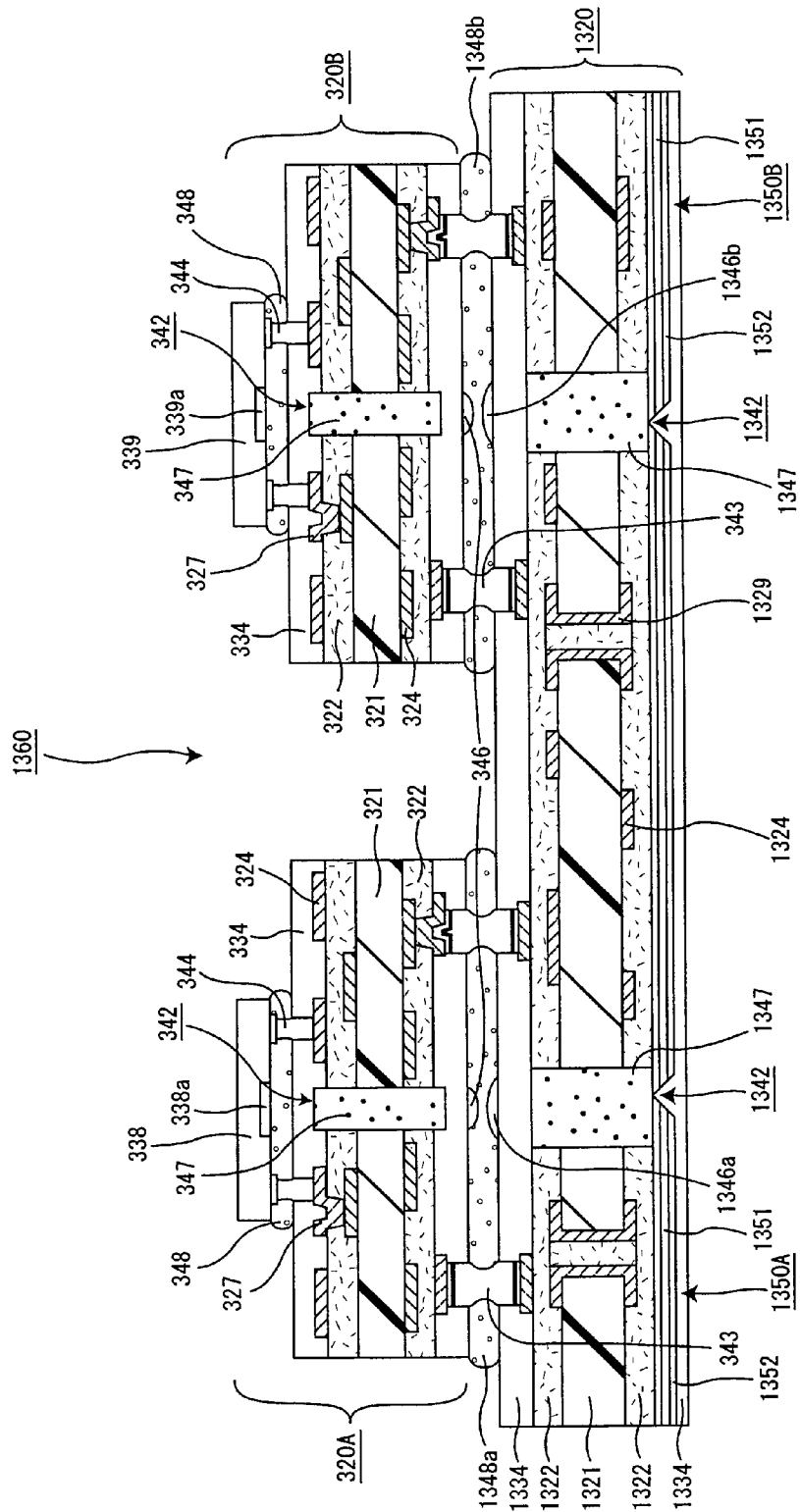
FIG. 7 is a cross-sectional view that schematically shows another example of a device for optical communication according to one embodiment of the present invention.

FIG. 7 is a cross sectional diagram schematically showing another example of a device for optical communication according to one embodiment of the present invention.

FIG. 7 shows a device for optical communication 1360 where a package substrate 320A having a light emitting element 338 mounted thereon and a package substrate 320B having a light receiving element 339 mounted thereon are mounted on a substrate for a motherboard 1320 through a solder connection portion 343 in between. Here, the package substrates 320A and 320B are package substrates according to the embodiments of the present invention in a state where an IC chip is mounted.

Here, though the device for optical communication 1360 has a different configuration of the substrate for a motherboard 1320 in comparison with the device for optical communication 1160 shown in FIG. 5, the configurations of the package substrates 320A and 320B, which are mounted on the substrate for a motherboard 1320, are the same as those in the device for optical communication 1160. Accordingly, an embodiment of the device for optical communication 1360 is herein described, focusing on the structure of the substrate for a motherboard 1320.

In the substrate for a motherboard 1320, conductor circuits 1324 and insulating layers 1322 are formed and laminated on both sides of a substrate 1321, and the conductor circuits having the substrate 1321 therebetween are electrically connected by means of through holes 1329, and the conductor circuits having the insulating layers 1322 therebetween are electrically connected through via holes (not shown). In addition, solder resist layers 1334 having a transmittance within the above-described range are formed as the outermost layers.

Optical paths for transmitting an optical signal 1342 are provided to this substrate for a motherboard 1320 so as to penetrate through the substrate 1321 and the insulating layers 1322. In addition, the portions which penetrate through the substrate 1321 and the insulating layers 1322 are filled in with a resin composite 1347. Here, the resin composite 1347 is in such a form that an end portion thereof is located at almost the same level as the surface of the outermost insulating layer. Here, the resin composite may be in such a form that an end portion thereof is located at almost the same level as the surface of the conductor circuit that is formed on the outermost insulating layer.

Optical waveguides 1350A and 1350B formed of a core 1351 and a clad 1352 are formed on the outermost insulating layer 1322 on the substrate for a motherboard 1320 on the side opposite to the side where the package substrates 320A and 320B are mounted.

In addition, optical path converting mirrors are formed on the respective end portion of the optical waveguides 1350A and 1350B so that an optical signal can be transmitted between the optical waveguide 1350A and the optical path for transmitting an optical signal 1342, and between the optical waveguide 1350B and the optical path for transmitting an optical signal 1342. In addition, the end portions of the optical waveguides 1350A and 1350B on the side opposite to the side where the respective optical path converting mirrors are formed are exposed from the sides of the substrate for a motherboard.

In addition, microlenses 1346a and 1346b are provided on the solder resist layer 1334 on the side facing the package substrates 320A and 320B. Here, the microlenses 1346a and 1346b are respectively provided in a location which corresponds to an end portion of the core 1351 where optical path converting mirrors are formed on the respective end portions.

In the device for optical communication 1360 having this configuration, an optical signal from the light emitting element 338 that is mounted on the package substrate 320A is transmitted to the optical waveguide 1350A via optical paths for transmitting an optical signal 342, 1342 and the like, and furthermore, is transmitted to an external substrate or an external optical element, not shown. In addition, an optical signal from an external substrate or an external optical element, not shown, is first transmitted to the optical path for transmitting an optical signal 1350B, and furthermore, is transmitted to the light receiving element 339 that is mounted on the package substrate 320B via the optical paths for transmitting an optical signal 342, 1342 and the like.

Accordingly, in the device for optical communication according to the present invention, the package substrates can function as a daughter board, and the substrate for a motherboard can function as a backplane board.

Here, in the device for optical communication which is used for transmitting an optical signal within the substrate as shown in FIGS. 5 and 6, the length of the optical waveguide formed on the substrate for a motherboard is usually about 50 cm or less, and in the case where the substrate for a motherboard in the device for optical communication according to the present invention functions as a backplane board, the length of the optical waveguide that is formed on this substrate for a motherboard is at least about 50 cm and at most about 100 cm at the longest.

Figure 8:
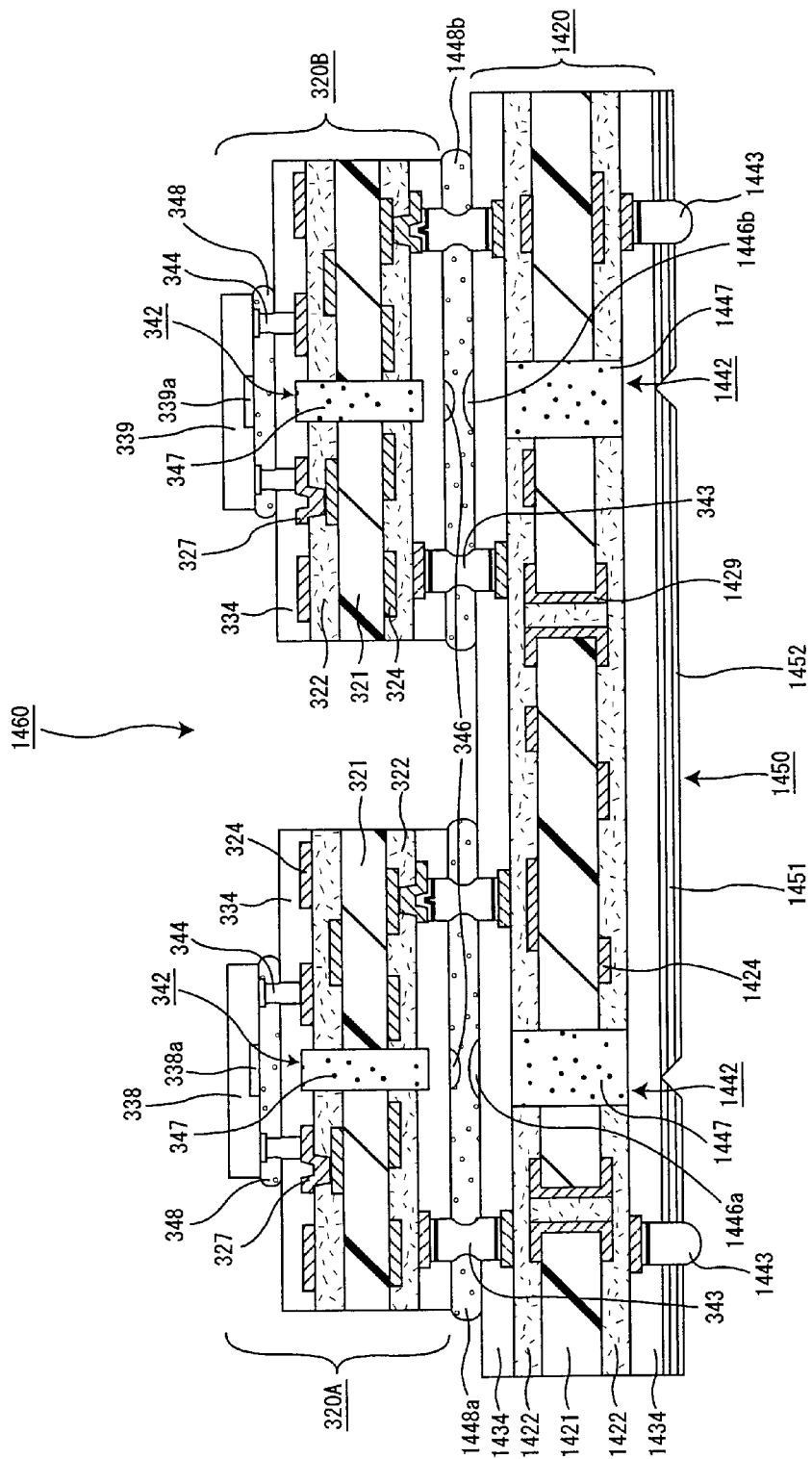
FIG. 8 is a cross-sectional view that schematically shows another example of a device for optical communication according to one embodiment of the present invention.

In addition, the device for optical communication according to the one embodiment of the present invention may have the embodiment shown in FIG. 8.

FIG. 8 is a cross sectional diagram schematically showing another example of the device for optical communication according to one embodiment of the present invention.

FIG. 8 shows a device for optical communication 1460 where a package substrate 320A having a light emitting element 338 mounted thereon and a package substrate 320B having a light receiving element 339 mounted thereon are mounted on a substrate for a motherboard 1420 through a solder connection portion 343. Here, the package substrates 320A and 320B are package substrates of the present invention in a state where an IC chip is mounted.

Though the device for optical communication 1460 has a different configuration of the substrate for a motherboard 1420 in comparison with the device for optical communication 1160 shown in FIG. 5, the configurations of the package substrates 320A and 320B which are mounted on the substrate for a motherboard 1320 are the same as those in the device for optical communication 1160. Accordingly, an embodiment of the device for optical communication 1460 is herein described, focusing on the structure of the substrate for a motherboard 1420.

In the substrate for a motherboard 1420, conductor circuits 1424 and insulating layers 1422 are formed and laminated on both sides of the substrate 1421, and the conductor circuits having the substrate 1421 therebetween are electrically connected by means of through holes 1429, and the conductor circuits having the insulating layers 1422 therebetween are electrically connected through via holes (not shown). In addition, solder resist layers 1434 having a transmittance within the above-described range are formed on the outermost insulating layers.

In this substrate for a motherboard 1420, optical paths for transmitting an optical signal 1442 are provided so as to penetrate through the substrate 1421 and the insulating layers 1422. In addition, the portions which penetrate through the substrate 1421 and the insulating layers 1422 are filled in with a resin composite 1447. Here, the resin composite 1447 is in such a form that an end portion thereof is located at almost the same level as the surface of the outermost insulating layer. Here, the resin composite may be in such a form that an end portion thereof may be located at almost the same level as the surface of the conductor circuit that is formed on the outermost insulating layer.

An optical waveguide 1450 formed of a core 1451 and a clad 1452 is formed on the entirety of the solder resist layers 1434 on the substrate for a motherboard 1420 on the side opposite to the side where package substrates 320A and 320B are mounted.

In addition, optical path converting mirrors are formed in a predetermined location (directly beneath the optical path for transmitting an optical signal 1442) in the optical waveguide 1450 so that an optical signal can be transmitted between the optical waveguide 1450 and the optical paths for transmitting an optical signal 1442 in the configuration.

In addition, solder bumps 1443 are formed on the side opposite to the side where the package substrates 320A and 320B are mounted, and these solder bumps 1443 make it possible for a variety of electronic parts and optical parts to be mounted, or for connection with another external substrate to be made.

In addition, microlenses 1446a and 1446b are provided on the solder resist layer 1434 on the side facing the package substrates 320A and 320B. Here, the microlenses 1446a and 1146b are respectively provided in a location which corresponds to an end portion of the core 1451 where optical path converting mirrors are formed on the respective end portions.

In the device for optical communication 1460 having this configuration, an optical signal from the light emitting element 338 that is mounted on the package substrate 320A is transmitted to the optical waveguide 1450 via optical paths for transmitting an optical signal 342, 1442 and the like, and furthermore, is transmitted to the light receiving element 339 that is mounted on the package substrate 320B via optical paths for transmitting an optical signal 1442 and 342. Here, as shown in FIG. 8, in the case where an optical waveguide is formed on the solder resist layer, the transmittance of this solder resist layer for light having a wavelength for communication is about 60% or more at a thickness of 30 μm.

In addition, the form of the optical waveguide that forms the device for optical transmission according to the embodiments of the present invention is not limited to the form in which the optical waveguide is formed on the entire surface of an insulating or a solder resist layer where optical path converting mirrors are formed at predetermined locations as shown in FIGS. 5, 6, 7 and 8, and may be, for example, in a form as shown in FIGS. 9A and 9B.

FIGS. 9A and 9B are cross sectional diagrams schematically showing a portion of another example of the device for optical communication according to the embodiments of the present invention.

That is to say, in the substrate for a motherboard which forms the device for optical communication according to the embodiment of the present invention, as shown in FIG. 9A, an optical waveguide 1550 formed of a core 1551 and a clad 1552 with optical path converting mirrors formed on both ends is formed on the solder resist layer 1534 only at the minimum portion required for transmitting an optical signal, or as shown in FIG. 9B, an optical waveguide 1650 formed of a core 1651 and a clad 1652 is formed only on a portion of the solder resist layer 1634, and optical path converting mirrors may be formed in a predetermined portion of this optical waveguide 1650.

Here, the other members of the device for optical communication shown in FIGS. 9A and 9B (members other than the optical waveguide) are the same as those in the device for optical communication shown in FIG. 8.

Moreover, an optical waveguide according to the embodiment shown in FIG. 9A or 9B may be formed in the device for optical communication where an optical waveguide is formed on the outermost insulting layer according to an embodiment as shown in FIG. 5, 6 or 7, in addition to the case where an optical waveguide is formed on a solder resist layer.

In addition, in the devices for optical communication shown in FIGS. 5, 6, 7 and 8, a one-channel optical element (light emitting element or a light receiving element) is mounted on a package substrate, and corresponding to this, an optical path for transmitting an optical signal, through which an optical signal from the one-channel optical element is transmitted, is formed in the package substrate and a substrate for a motherboard, respectively.

However, the embodiments of the device for optical communication according to the embodiments of the present invention are not limited to the embodiments shown in FIGS. 5, 6, 7 and 8, and a multi-channel optical element may be mounted.

In addition, an optical element may be directly mounted instead of the package substrate.

In addition, an optical path for transmitting an optical signal having a collective through hole structure or an optical path for transmitting an optical signal having an individual through hole structure and the like may be formed in the package substrate or the substrate for a motherboard, respectively, in order to transmit an optical signal from the multi-channel optical element.

Forming an optical path for transmitting an optical signal in the respective package substrate and the substrate for a motherboard as described above is suitable for transmission of optical signals between those substrates.

In addition, in the case where a number of package substrates are mounted on the substrate for a motherboard, package substrates having different structures of the optical path for transmitting an optical signal, such as a package substrate where an optical path for transmitting an optical signal having a collective through hole structure is formed and a package substrate where an optical path for transmitting an optical signal in recess form is formed, may be mounted on one substrate for a motherboard.

Furthermore, in the case where a microlens is provided to a device for optical communication according to an embodiment as shown in FIG. 5, 6, 7 or 8, it is desirable to provide microlenses in all of the four portions shown in the embodiment of FIG. 5. This is because the reliability in the transmission performance of an optical signal from a light emitting element to a light receiving element becomes excellent. Here, the same can be applied for the devices for optical communication of the embodiments shown in FIGS. 6, 7 and 8.

Here, as for the solder resist layers formed and layered as the outermost layers of the substrate for a motherboard, which forms a device for optical communication according to the embodiments of the present invention, in the case where an optical waveguide is formed on an insulating layer as shown in FIGS. 5, 6 and 7, both of the solder resist layers formed and laminated as the outermost layers on both sides may have a transmittance within the above-described range, or only the solder resist layer on the side facing at least the optical element mounted package substrate or the like (upper side in the figure) may have a transmittance within the above-described range with the solder resist layer on the opposite side having a low transmittance.

That is to say, in the substrate for a mother board which forms the device for optical communication according to the embodiments of the present invention, it is sufficient if at least the portion of the solder resist layer which can transmit an optical signal has a transmittance within the above-described range.

Here, in the case where solder resist layers having different compositions are formed on both sides respectively, the number of processes increases, and furthermore, in the case where the coefficient of the thermal expansion of the solder resist layer differs between the respective sides, warping may occur in the substrate for a motherboard, and therefore, it is desirable to form solder resist layers having a transmittance within the above-described range on both sides.

In addition, the location where an optical waveguide is formed is not limited to the location as shown in FIGS. 5, 6, 7 and 8 in the device for optical communication according to the embodiments of the present invention, and an optical waveguide may be formed, for example, between insulating layers in the case where two or more insulating layers are formed on one side of the substrate.

In addition, when an embodiment in which an optical waveguide is formed on an outermost insulating layer and furthermore, a solder resist layer is formed so as to cover this optical waveguide is compared with an embodiment in which the optical waveguide is formed on the solder resist layer, though there are no specific advantages and disadvantages between the two embodiments, in the former embodiment, the solder resist layer formed and laminated on the optical waveguide and the solder resist layer formed and laminated on a region where an optical waveguide is not formed may have different thickness, and in this case, openings for forming a solder bump cannot be created under the same conditions between the thick and thin portions of the solder resist layer, or the thick portion of the solder resist layer may be inappropriate for creating openings having a small diameter (about 100 μm), whereas the latter embodiment is advantageous in the point that such inconvenience tends not to occur.

Next, a method for manufacturing a device for optical communication according to the embodiments of the present invention is described.

The device for optical communication according to the embodiments of the present invention is manufactured, for example, by separately manufacturing a package substrate in which an optical element is mounted and the like and a substrate for a motherboard, and after that, connecting the two by means of soldering.

The method for manufacturing a package substrate according to the embodiments of the present invention is as described above.

Also, for example, the substrate for a motherboard is manufactured in accordance with the below described manufacturing method.

(1) First, a conductor circuit is formed on both sides or one side of a substrate in the same manner as process (1) in the method for manufacturing a package substrate according to the embodiments of the present invention, and if necessary, through holes for connecting conductor circuits having a substrate interposed therebetween may be formed. If necessary, in this process as well, a coarse surface may be formed on the surface of the conductor circuit or on the wall surface of the through holes.

(2) Next, if necessary, an insulating layer and a conductor layer are formed and laminated on the substrate on which the conductor circuits are formed.

Specifically, the insulating layer and the conductor layer may be formed and laminated in accordance with the same processes as the processes (2) and (3) in the manufacturing method for a package substrate according to the embodiments the present invention.

Here, the process of laminating an insulating layer and a conductor circuit may be carried out only once or may be repeated a plurality of times.

As the method for forming the conductor circuit on the insulating layer in this process, a method other than semi-additive method, such as subtractive method, may be used in the same manner as in the case where a package substrate according to the embodiments of the present invention is manufactured.

Moreover, upon forming an optical waveguide as described below, in the case where the optical waveguide is formed on the insulating layer on the side opposite to the side facing the package substrate and the like across the substrate, the optical waveguide is filled in with a resin composite in this process, or a through hole for an optical path in which a conductor layer is formed on the wall surface thereof is formed, if necessary. This through hole for an optical path is allowed to function as an optical path for transmitting an optical signal.

Here, the through hole for an optical path (optical path for transmitting an optical signal) which penetrates through the substrate may be formed after an optical waveguide is formed in the below-described process (3).

A through hole for an optical path is formed, for example, according to a drilling process, a laser process and the like. As the laser used in the laser process, the same lasers as those used at the time of forming the openings for via holes can be cited as examples.

In addition, the through hole for an optical path may have a form where an optical path for transmitting an optical signal having a collective through hole structure or an individual through hole structure can be formed.

(3) Next, an optical waveguide is formed on the substrate and/or the insulating layer in a predetermined location (that may be a part or the entirety of the insulating layer) according to the design.

Here, as described above, formation of the optical waveguide on the solder resist layer may be carried by forming a solder resist layer through the post processes, and then forming an optical waveguide on the solder resist layer.

For example, in the case where the optical waveguide is formed using an inorganic material such as silica glass and silicon, as the material thereof, an optical waveguide that has been formed in a predetermined form is attached via an optical adhesive and the like.

In addition, the optical waveguide made of an inorganic material can be formed, for example, through film formation of an inorganic material such as $LiNbO_3$ and $LiTaO_3$ in accordance with a liquid phase epitaxial method, a chemical vapor deposition method (CVD), a molecular beam epitaxial method, and the like.

As the method for forming an optical waveguide of a polymer material, (1) a method for pasting a film for forming an optical waveguide, which has been previously formed in film form on a mold release film, to the top of an insulating layer, and (2) a method for forming an optical waveguide directly on an insulating layer and the like by sequentially forming and laminating a lower clad, a core and an upper clad on the insulating layer, and the like can be cited.

Here, the same method may be used as the method for forming an optical waveguide in the case where an optical waveguide is formed on a mold release film and in the case where an optical waveguide is formed on the insulating layer.

Specifically, for example, a method using reactive ion etching, a process including exposure to light and development, a die forming method, a resist forming method or a method combining these methods is used.

In the method using the reactive ion etching, (i) first, a lower clad is formed on a mold release film or an insulating layer (hereinafter, simply referred to as a mold release film or the like), and (ii) next, a resin composite for a core is applied to the top of this lower clad, and furthermore, a curing process is carried out, if necessary, to provide a resin layer for forming a core. After that, (iii) a resin layer for forming a mask is formed on the resin layer for forming a core, and then a process including exposure to light and development is carried out on the resin layer for forming a mask, and thereby, a mask (etching resist) is formed on the resin layer for forming a core.

Next, (iv) reactive ion etching is carried out on the resin layer for forming a core to remove the resin layer for forming a core on the mask non-forming portion so that a core is formed on the lower clad. Finally, (v) an upper clad is formed on the lower clad so as to cover the core, and thus, an optical waveguide is provided.

This method using reactive ion etching is suitable for forming an optical waveguide having excellent dimensional reliability. In addition, this method is also excellent in reproducibility.

In addition, in the process including exposure to light and development, (i) first, a lower clad is formed on a mold release film or the like, and (ii) next, a resin composite for a core is applied to the top of this lower clad, and furthermore, a semi-curing process is carried out, if necessary, so that a layer of a resin composite for forming a core is formed.

Next, (iii) a mask where a pattern corresponding to the portion for forming the core is drawn is placed on the layer of the resin composite for forming a core, and after that, a process including exposure to light and development is carried out so that a core is formed on the lower clad. Lastly, (iv) an upper clad is formed on the lower clad so as to cover the core, and thus, an optical waveguide is provided.

This method, including exposure to light and development, may be appropriately used when an optical waveguide is mass produced, since its number of processes is small, and in addition, because this method has a small number of heating processes, stress hardly occurs in the optical waveguide.

In the die forming method, (i) first, a lower clad is formed on a mold release film, and (ii) next, a trench for forming a core is formed in the lower clad through die formation. Furthermore, (iii) the above-described trench is filled in with a resin composite for a core through printing, and after that, a core is formed by carrying out a curing process. Finally, (iv), an upper clad is formed on the lower clad so as to cover the core, and thus, an optical waveguide is provided.

This die forming method may be appropriately used when an optical waveguide is mass produced, and thus suitably used for forming an optical waveguide having excellent dimensional reliability. In addition, this method is excellent in reproducibility.

In the resist forming method, (i) first, a lower clad is formed on a mold release film or the like, and then, (ii) a resin composite for a resist is applied to the top of this lower clad, and after that, a process including exposure to light and development is carried out, and thereby, a resist for forming a core is formed in the core non-forming portion on the above-described lower clad.

(iii) Next, a resin composite for a core is applied to the resist non-forming portion on the lower clad, and (iv) furthermore, the resin composite for a core is cured, and after that, the resist for forming a core is peeled off, and thereby, a core is formed on the lower clad. Lastly, (v) an upper clad is formed on the lower clad so as to cover the core, and thus, an optical waveguide is provided.

This resist forming method may be appropriately used when an optical waveguide is mass produced, and thus may be suitably used for forming an optical waveguide having excellent dimensional reliability. In addition, this method is also excellent in reproducibility.

In the case where an optical waveguide made of a polymer material is formed using these methods, and an optical waveguide where particles are mixed into the core is formed, a mold forming method is desirable in comparison with a process including exposure to light and development. The reason for this is as follows.

That is to say, in the case where a trench for forming a core is formed in the lower clad through die formation, and then a core is formed within this trench in accordance with a die forming method for forming a core, it becomes possible for all of the particles mixed into the core to be contained in the core more easily, and as a result, the surface of the core becomes flat, providing excellent transmissivity of an optical signal. On the other hand, when the core is formed in a process including exposure to light and development, in the core after the development process, part of the particles may extrude from the surface of the core, or a recess may be formed in the surface of the core due to coming off of the particles, making the surface of the core uneven, and this unevenness may make it difficult for light to be reflected in a desired direction, and as a result of this, there may be a case where the transmission property of an optical signal is lowered.

In addition, an optical path conversion mirror is formed in the optical waveguide.

Though the optical path conversion mirror may be formed before the optical waveguide is attached to the insulating layer or may be formed after the optical waveguide has been attached to the insulating layer, it is desirable to form the optical path conversion mirror in advance, except for the case where the optical waveguide is directly formed on the insulating layer. With this arrangement, it becomes possible for the process to be carried out more easily, and also during this process, there may be no risk of scratching or damaging of other members which form the substrate for a motherboard, the substrate, the conductor circuits, the insulating layers and the like.

The method for forming an optical path conversion mirror is not particularly limited, and conventionally well-known forming methods may be used. Specifically, for example, a machining using a diamond saw or a blade each having the edge in a V shape at about 90°, a process using reactive ion etching, laser ablation, and the like can be used. In addition, instead of forming an optical path conversion mirror, an optical path conversion member may be embedded.

In the case where a 90 degrees optical path conversion mirror is formed in the optical waveguide, the angle formed by the surface where the lower clad makes contact with the substrate or the insulating layer, and the optical path conversion surface may be about 45 degrees or about 135 degrees.

In the case where the optical path conversion mirror is formed, a metal layer comprising chrome, gold or the like may be formed on a reflecting surface of the mirror by vapor deposition and the like.

Here, though a method for forming an optical waveguide on the substrate or on the outermost insulating layer is described, in the manufacture of the substrate for a motherboard, the optical waveguide as described above may sometimes be formed between the substrate and the insulating layer or between the insulating layers.

In the case where an optical waveguide is formed between the substrate and the insulating layer, for example, a substrate where conductor circuits are formed on both sides thereof is manufactured in the above-described process (1), and after that, an optical waveguide is formed in a portion where a conductor circuit is not formed on the substrate in accordance with the same method as in the above-described process (3), and subsequently, an insulating layer is formed in accordance with the same method as in the above-described process (2), and thereby, an optical waveguide can be formed in the above-described location.

In addition, in the case where an optical waveguide is formed between the resin insulating layers, at least one layer of an interlayer resin insulating layer is formed and laminated on a substrate where conductor circuits are formed in the same manner as in the above-described processes (1) and (2), and after that, an optical waveguide is formed on the insulating layer in the same manner as in the above-described process (3), and subsequently, the same process as the above-described process (2) is additionally repeated, and thereby, an optical waveguide can be formed between the interlayer resin insulating layers.

Moreover, when the optical waveguide is formed on the solder resist layer, the formation may be carried out after any of the below-described processes (4) to (6).

(4) First, a solder resist layer is formed as the outermost layer of the multilayer circuit board in which a through hole for an optical path, which is filled in with a resin composite, is formed.

The solder resist layer may be formed in accordance with the same method as the method that is used in the method for manufacturing of a package substrate according to the embodiments of the present invention.

Moreover, upon forming the solder resist layer, openings for forming solder bumps may be formed simultaneously.

(5) Next, if necessary, a microlens is provided on the solder resist layer.

The microlens may be provided in accordance with the same method as the method used in the method for manufacturing a package substrate.

In addition, a surface treatment such as a water repellant process (including a process using a water repellant coating agent) a hydrophilic process, or the like may be carried out before mounting the microlens.

(6) After that, solder pads or solder bumps are formed if necessary, and thereby, a substrate for a motherboard can be manufactured.

Here, the solder pads or the solder bumps may be formed in accordance with the same method as the method used in the manufacturing method for a package substrate according to the embodiments of the present invention.

In addition, in some cases, an optical waveguide may be formed on the entirety of the outermost layer of the substrate in the above-described process (3) so that the optical waveguide may function as a solder resist layer.

The device for optical communication according to the embodiments of the present invention can be manufactured by manufacturing a package substrate and a substrate for a motherboard using the methods as described above, and connecting the two by means of soldering and the like, and then filling an underfill in a gap between the package substrate and the solder resist layer formed on the substrate for a motherboard.

Specifically, first, a package substrate on which solder bumps are formed and a substrate for a motherboard on which solder bumps are formed are placed in predetermined locations respectively so as to face each other in a predetermined direction, and after that, the two are connected to each other through reflow. Here, solder bumps may be formed only on one surface between the surfaces of the above-described package substrate and the substrate for a motherboard which face each other. This is because in this case also, the two can be electrically connected to each other.

In addition, in the case where the optical element is directly mounted on the substrate for a motherboard, the optical element may be mounted in accordance with the same method as the method for mounting an optical element on a package substrate in the manufacturing method for a package substrate according to the embodiments of the present invention.

Next, a gap between the mounted package substrate or the mounted optical element and the substrate for a motherboard is filled in with the underfill, if necessary.

Here, filling of the underfill may be carried out by the same method as the method for filling an underfill beneath an optical element in the package substrate according to the above-described embodiments of the present invention.

The above description has discussed the package substrate and the device for optical communication according to the embodiments of the present invention mainly with reference to a case, as an example, where the laminated body is a laminated body comprising a substrate, and a conductor circuit and an insulating layer formed and laminated on both sides of the substrate. However, the laminated body does not necessarily comprise a substrate, and a conductor circuit and an insulating layer formed and laminated on both sides of the substrate, and the laminated body may be a laminated body comprising only a conductor circuit and an insulating layer which are formed and laminated, or may be a laminated body comprising a substrate, and a conductor circuit and an insulating layer formed and laminated on only one side of the substrate.

Accordingly, in a package substrate or a substrate for a motherboard each forming the package substrate or the device for optical communication according to the embodiments of the present invention, a laminated body provided with a substrate or a laminated body without a substrate (a laminated body having a coreless structure) may be used.

EXAMPLES

In the following, the present invention is described in further detail.

Example 1

A. Manufacture of Resin Film for Insulating Layer

A bisphenol A type epoxy resin (equivalent of epoxy 469, Epikote 1001, made by Yuka Shell Epoxy K.K.) (30 parts by weight), cresol novolac type epoxy resin (equivalent of epoxy 215, Epiclon N-673, made by Dainippon Ink & Chemicals, Inc.) (40 parts by weight) and phenol novolac resin containing triazine structure (equivalent of phenolic hydroxy group 120, Phenolite KA-7052, made by Dainippon Ink & Chemicals, Inc.) (30 parts by weight) were heated and melted in 20 parts by weight of ethyl diglycol acetate and 20 parts by weight of a naphtha solvent while stirring, and 15 parts by weight of polybutadiene rubber with a terminal converted to epoxy (DENAREX R-45EPT, made by Nagase Chemicals Ltd.), 1.5 parts by weight of pulverized 2-phenyl-4,5-bis(hydroxymethyl)imidazole, 2 parts by weight of finely pulverized silica and 0.5 part by weight of a silicone based antifoaming agent were added thereto to prepare an epoxy resin composite.

The obtained epoxy resin composite was applied to the top of a PET film having a thickness of 38 μm using a roll coater, so that the thickness after drying became 50 μm, and then dried for ten minutes at 80° C. to 120° C. and thereby, a resin film for an insulating layer was manufactured.

B. Preparation of Resin Composite for Filling Through Holes

A bisphenol F type epoxy monomer (molecular weight: 310, YL983U, made by Yuka Shell Epoxy K.K.) (100 parts by weight), $SiO_2$ particles in spherical form (CRS 1101-CE, made by ADTEC Corp.) (170 parts by weight) of which the surface is coated with a silane coupling agent, the average particle diameter is 1.6 μm and the diameter of the largest particles is 15 μm or less, and a leveling agent (Perenol S4, made by San Nopco Co., Ltd.) (1.5 parts by weight) were put in a container and mixed through stirring, and thereby, a resin filling of which the viscosity is 45 Pa·s to 49 Pa·s at 23±1° C. was prepared. Here, 6.5 parts by weight of an imidazole curing agent (2E4MZ-CN, made by Shikoku Corp.) was used as a curing agent.

Figure 10A:
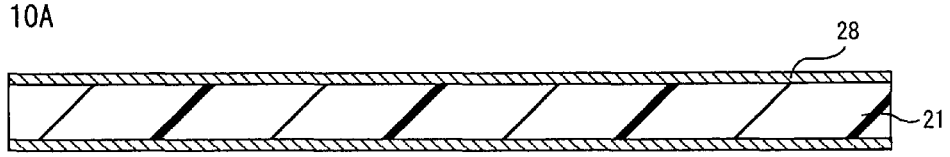
FIGS. 10A to 10F are cross-sectional views that schematically show a part of a method for manufacturing a package substrate according to one embodiment of the present invention.

C. Manufacture of Package Substrate (1) A copper pasted multilayer plate where copper foil 28 having a thickness of 18 μm is laminated on both sides of an insulating substrate 21 made of a glass epoxy resin or a BT (bismaleimide triazine) resin having a thickness of 0.8 mm was used as a starting material (see FIG. 10A). First, holes were drilled in this copper pasted multilayer plate, an electroless plating process was carried out, and etching was carried out so as to form a pattern, and thus, conductor circuits 24 and a through hole 29 were formed on both sides of the substrate 21.

Figure 10B:
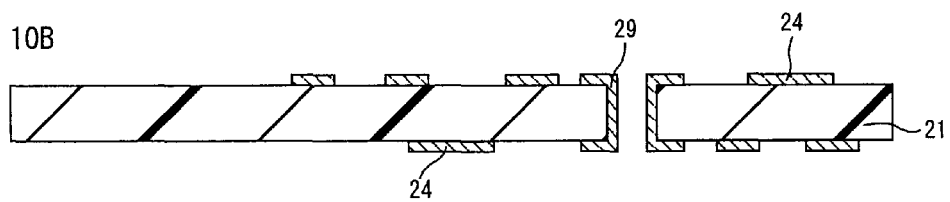

(2) The substrate where the through hole 29 and the conductor circuits 24 were formed washed with water and dried, and thereafter, a blackening process using a solution including NaOH (10 g/L), $NaClO_2$ (40 g/L) and $Na_3PO_4$ (6 g/L) for a blackening bath (oxidation bath) and a reduction process using a solution including NaOH (10 g/L) and $NaBH_4$ (6 g/L) for a reduction bath were carried out, and a coarse surface (not shown) was formed on the surface of the conductor circuits 24 including the through hole 29 (see FIG. 10B).

(3) After the preparation of the resin filling described in the above B, and within 24 hours after preparation thereof, a layer of a resin filling 30' was formed in a conductor circuits non-forming portion within the through hole 29 and on one side of the substrate 21, and also formed on the outer periphery portion of the conductor circuits 24, using the method described below.

Figure 10C:
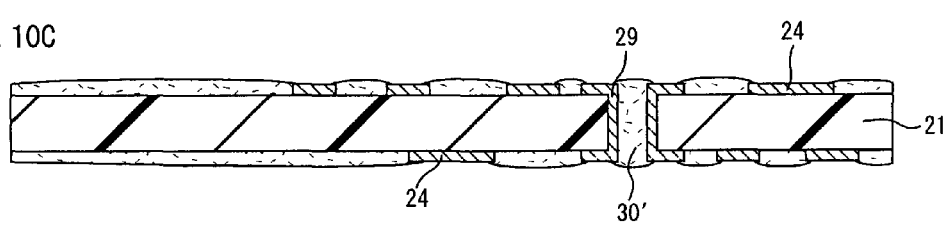

That is to say, first, a squeegee was used to push the resin filling into the through hole, and after that, the resin filling was dried under conditions of 100° C. for 20 minutes. Next, a mask having openings in portions corresponding to the conductor circuits non-forming portion was placed on the substrate and the conductor circuits non-forming portions in a recess shape were formed were filled in with a resin filling using a squeegee, and the resin filling was dried under conditions of 100° C. for 20 minutes, and thereby, a layer of resin filling 30' was formed (see FIG. 10C).

(4) One side of the substrate after the above-described process (3) was polished through belt sander polishing using belt polishing paper #600 (made by Sankyo Rikagaku Co., Ltd.), so that no resin filling 30' was left on the surface of the conductor circuits 24 nor the land surface of the through hole 29, and then, buff polishing was carried out in order to remove scratches created as a result of the above-described belt sander polishing. This polishing sequence was carried out in the same manner on the opposite side of the substrate.

Next, heat treatment was carried out for one hour at 100° C., three hours at 120° C., one hour at 150° C. and seven hours at 180° C., and thereby, a resin filling layer 30 was formed.

Figure 10D:
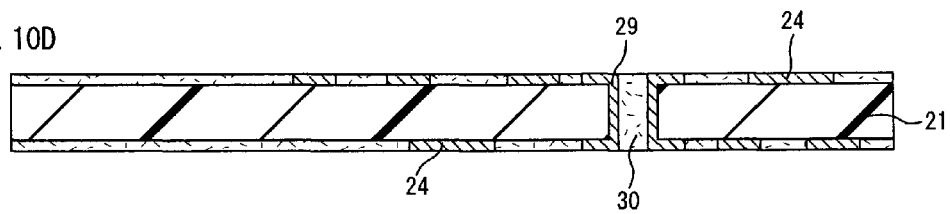

In this manner, an insulating substrate was gained, where the surface layer portion of the resin filling material 30 formed in the through hole 29 and in the conductor circuits non-forming portions, and the surface of the conductor circuits 24 were flattened, the resin filling material 30 and the side faces of the conductor circuits 24 adhered firmly to each other via the coarse surface (not shown), and the inner wall surface of the through hole 29 and the resin filling material 30 adhered firmly to each other via the coarse surface (not shown) (see FIG. 10D). In this process, the surface of the resin filling material 30 and the surface of the conductor circuits 24 were made in the same plane.

(5) The above-described substrate washed with water, and after acid degreasing, soft etching was carried out, and then, an etchant was sprayed onto both sides of the substrate so that the surface of the conductor circuit 24, and the land surface and inner wall of the through hole 29 were etched, and thereby, a coarse surface (not shown) was formed on the entirety of the surface of the conductor circuit 24. As the etchant, an etchant (MECetchBOND, made by MEC Co., Ltd.) including 10 parts by weight of a imidazole copper (II) complex, 7 parts by weight of glycolic acid and 5 parts by weight of potassium chloride was used.

Figure 10E:
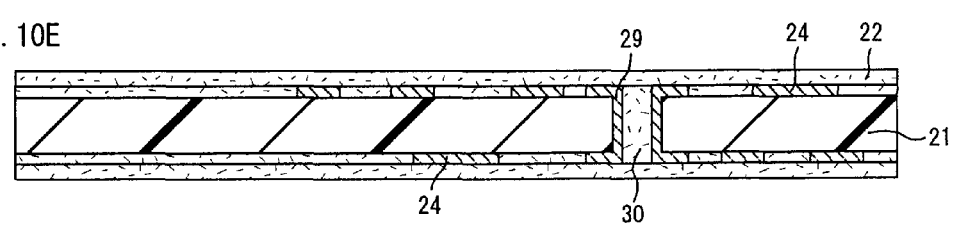

(6) Next, a resin film for an insulating layer which is a little larger than the substrate manufactured in the above-described A was placed on the substrate, temporarily pressure-bonded thereto under such conditions that the pressure was 0.4 MPa, the temperature was 80° C. and the press-bonding time was 10 seconds, and the edges were trimmed, and after that, the film was pasted using a vacuum laminating apparatus in accordance with the following method, and thereby, an insulating layer 22 was formed (see FIG. 10E).

That is to say, the resin film for an insulating layer was permanently pressure-bonded to the substrate under such conditions that the degree of vacuum was 65 Pa, the pressure was 0.4 MPa, the temperature was 80° C. and the press-bonding time was 60 seconds, and after that, thermosetting was carried out at 170° C. for 30 minutes.

Figure 10F:
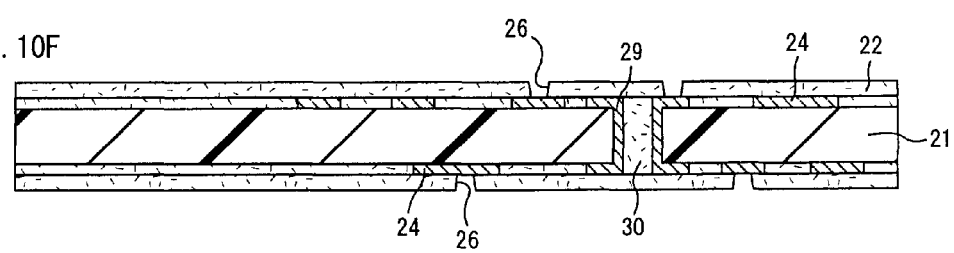

(7) Next, openings 26 for via holes having a diameter of 80 μm were formed in the insulating layer 22 through a mask having a thickness of 1.2 mm with through holes corresponding to the openings placed on the insulating layers 22, and using a $CO_2$ gas laser having a wavelength of 10.4 μm, under such conditions that the beam diameter was 4.0 mm, the laser was in a top hat mode, a pulse width was 8.0 μs, the diameter of through holes in the mask was 1.0 mm, and the laser was shot once for each opening (see FIG. 10F).

(8) The substrate where the openings 26 for via holes were formed was immersed in a solution including 60 g/L of permanganic acid at 80° C. for 10 minutes, so that the epoxy resin particles on the surface of the insulating layers 22 were dissolved and removed, and thereby, a coarse surface (not shown) was formed on the surface of the substrate, including the inner wall surface of the openings 26 for via holes.

(9) Next, the substrate after the above-described process was immersed in a neutral solution (made by Shipley Co., Ltd.) and then washed with water.

Furthermore, a palladium catalyst was provided on the surface of this substrate on which a surface roughening treatment (depth of coarseness: 3 μm) was carried out, and thus, catalyst nuclei were attached to the surface of the insulating layers 22 (including the inner wall surface of the openings 26 for via holes) (not shown). That is to say, the substrate was immersed in a catalyst solution including palladium chloride ($PdCl_2$) and stannous chloride ($SnCl_2$) so that a palladium metal was deposited, and thus, a catalyst was provided.

Figure 11A:
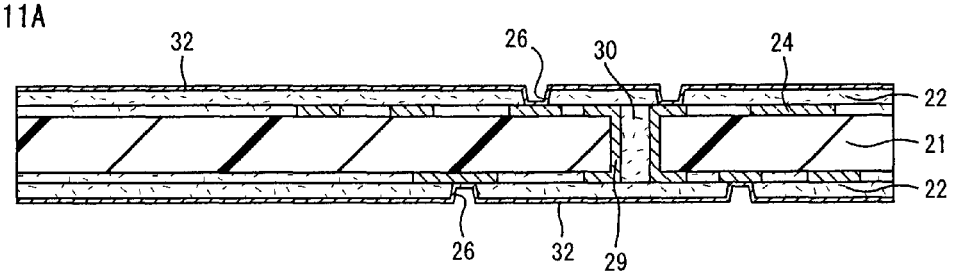
FIGS. 11A to 11D are cross-sectional views that schematically show a part of the method for manufacturing a package substrate according to one embodiment of the present invention.

(10) Next, the substrate was immersed in an electroless copper plating solution having the following composition, and thin film conductor layers (electroless copper plating films) 32 having a thickness of 0.6 μm to 3.0 μm were formed on the surface of the insulating layers 22 (including the inner wall surface of the openings 26 for via holes) (see FIG. 11A).

| [Electroless plating solution] | |
|---|---|
| $NiSO_4$ | 0.003 mol/L |
| Tartaric acid | 0.200 mol/L |
| Copper sulfate | 0.030 mol/L |
| HCHO | 0.050 mol/L |
| NaOH | 0.100 mol/L |
| α,α'-bipyridyl | 100 mg/L |
| Polyethylene glycol (PEG) | 0.10 g/L |
| [Conditions for Electroless Plating] | |
| Solution temperature of 30° C. for 40 minutes | |

Figure 11B:
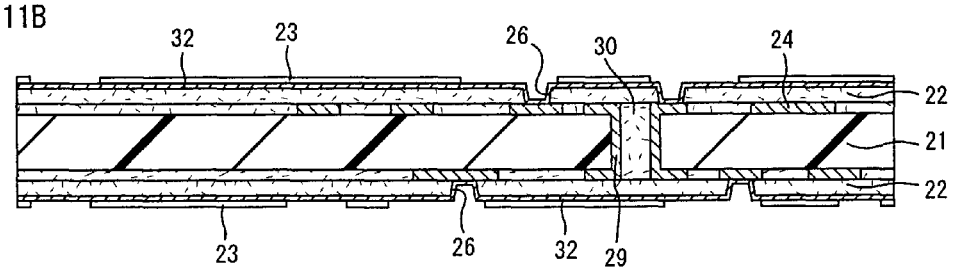
Figure 11C:
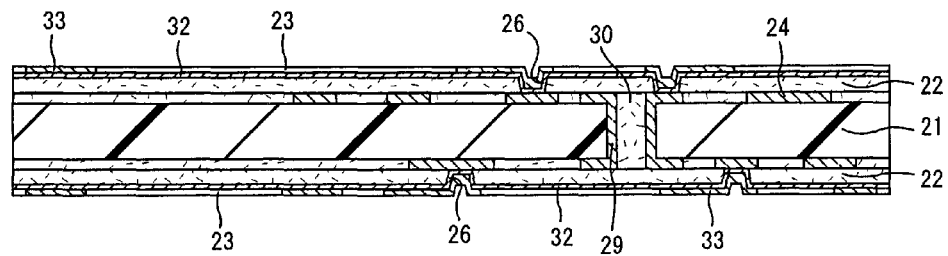

(11) Next, commercially available photosensitive dry films were pasted to the substrate on which thin film conductor layers (electroless copper plating films) 32 were formed, and the substrate was exposed to light of 100 mJ/cm$^2$ with a mask placed thereon, and then, a development process was carried out in a solution of 0.8% sodium carbonate, and thereby, plating resists 23 having a thickness of 20 μm were provided (see FIG. 11B).

(12) Subsequently, the substrate washed with water at 50° C. to carry out degreasing thereon, and then washed with water at 25° C., further washed with sulfuric acid, followed by electrolytic plating under the following conditions, and thereby electrolytic copper plating films 33 having a thickness of 20 μm were formed in the plating resists 23 non-forming portions (see FIG. 13C).

| [Electrolytic Plating Solution] | |
|---|---|
| Sulfuric acid | 2.24 mol/L |
| Copper sulfate | 0.26 mol/L |
| Additive (Copperacid HL, made by Atotech Japan K.K.) | 19.5 ml/L |
| [Conditions for electrolytic plating] | |
| Current density | 1 A/dm$^2$ |
| Time | 65 minutes |
| Temperature | 22 ± 2° C. |

Figure 11D:
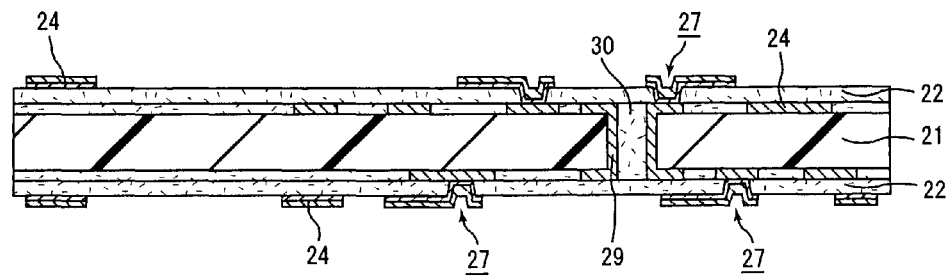

(13) Furthermore, the plating resists 23 were removed through peeling with 5% NaOH, and after that, the thin film conductor layers beneath these plating resists 23 were dissolved and removed through an etching process using a mixed solution of sulfuric acid and hydrogen peroxide, and thus, conductor circuits 24 (including via holes 27) having a thickness of 18 μm, formed of thin film conductor layers (electroless copper plating films) 32 and electrolytic copper plating films 33 were formed (see FIG. 11D).

Figure 12A:
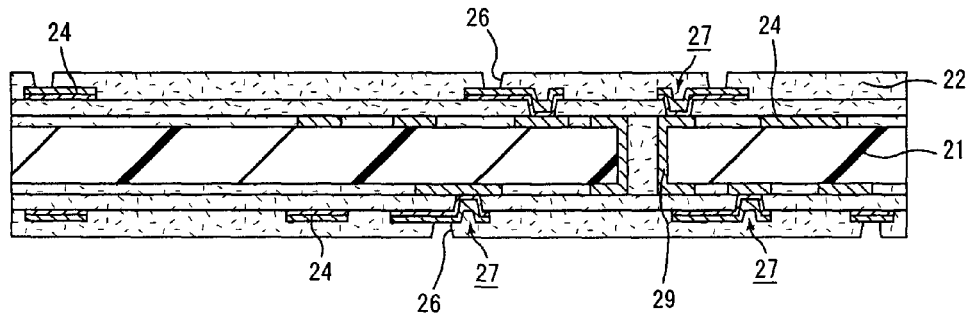
FIGS. 12A to 12D are cross-sectional views that schematically show a part of the method for manufacturing a package substrate according to one embodiment of the present invention.

(14) Furthermore, the same kind of etchant as the etchant used in the above-described process (5) was used to form a coarse surface (not shown) on the surface of the conductor circuits 24, and then, insulating layers 22 having openings for via holes 26 where a coarse surface (not shown) was formed on the surface were formed and laminated in the same manner as in the processes (6) to (8) (see FIG. 12A).

Figure 12B:
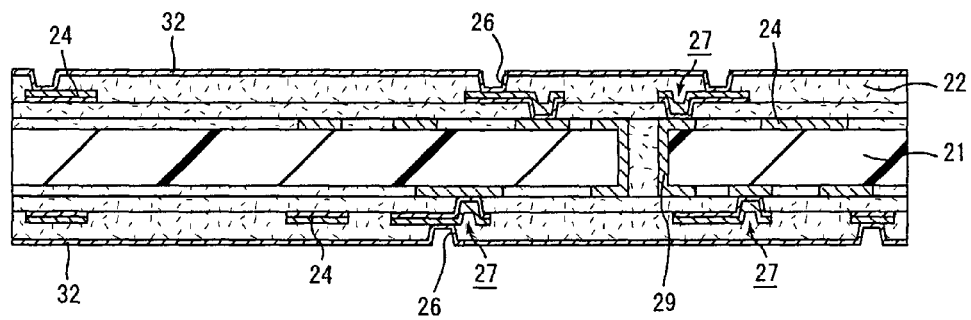

(15) Next, a catalyst was added to the surface of the insulating layers 22 (including the inner wall surface of the openings 26 for via holes) in accordance with the same method as the method used in the above-described process (9), and furthermore, the substrate was immersed in the same electroless copper plating solution as the electroless plating liquid used in the process (10), so that thin film conductor layers (electroless copper plating films) 32 were formed on the surface of the insulating layers 22 (including the inner wall surface of the openings 26 for via holes) (see FIG. 12B).

Figure 12C:
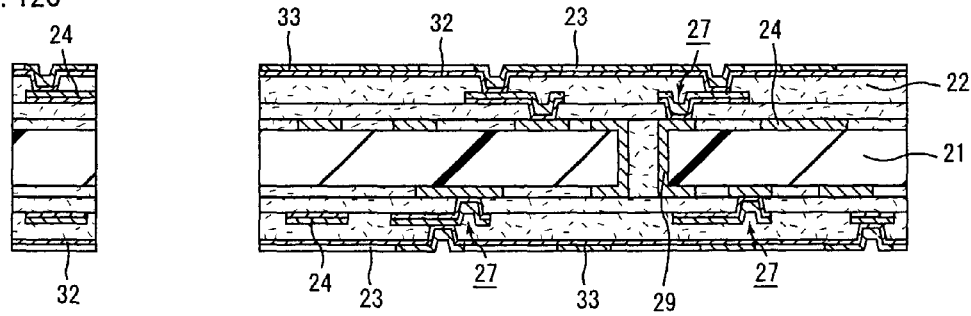

(16) Next, plating resists 23 were provided in accordance with the same method as the method used in the above-described process (11), and furthermore, electrolytic copper plating films 33 having a thickness of 20 μm were formed in the plating resists 23 non-forming portions in accordance with the same method as the method used in the above-described process (12) (see FIG. 12C).

(17) Next, the plating resists 23 were peeled off and the thin film conductor layers beneath the plating resists 23 were removed in accordance with the same method as the method used in the above-described process (13), so that conductor circuits 24 (including via holes 27) were formed.

Furthermore, an oxidation-reduction process was carried out in accordance with the same method as the method used in the above-described process (2), so that the surface of the conductor circuits 24 was converted to a coarse surface (not shown).

Figure 12D:
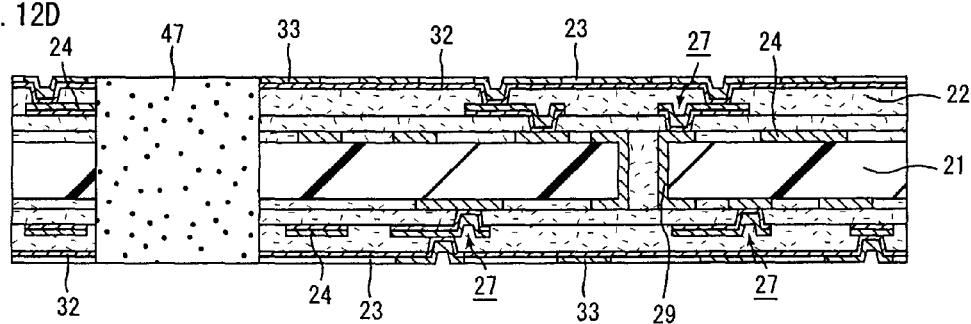

After that, a through hole for an optical path 31 which penetrates through the substrate 21 and the insulating layers 22 (the form in a plan view was a rectangle with rounded corners (240 μm in length×1000 μm in width)) was formed through a drilling process, and furthermore, a desmear process was carried out on the wall surface of the through hole for an optical path 31 (see FIG. 12D). In this case, a through hole for an optical path 31a having a collective through hole structure was formed.

(18) Next, a resin was placed on a plugging mask of a printing apparatus, and screen printing was carried out, and thereby, the through holes for an optical path 31 were filled in with the resin, and after that, a curing process was carried out under conditions of 120° C. for one hour and 150° C. for one hour, and subsequently, the resin that protruded from the through holes for an optical path 31 was polished using polishing paper #3000, and furthermore, the surface was polished to be flattened, using alumina particles having a diameter of 0.05 μm, and thus, a resin composite layer 47 was formed.

As the resin in this process, an epoxy resin (transmittance: 91%, CTE: 82 ppm) to which 40% by weight of pulverized silica having a particle size distribution from 0.1 μm to 0.8 μm was added so that the transmittance became 82%, the CTE became 42 ppm and the viscosity became 200000 cps, was used.

Figure 13A:
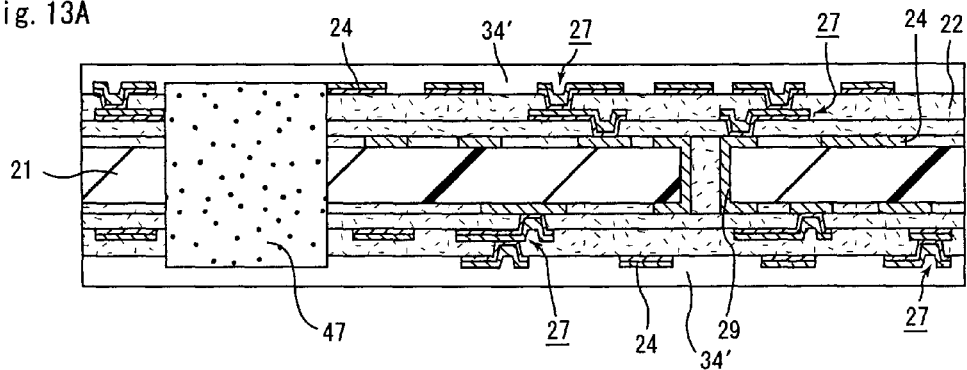
FIGS. 13A to 13C are cross-sectional views that schematically show a part of the method for manufacturing a package substrate according to one embodiment of the present invention.

(19) Next, a solder resist composition prepared by a below described method was applied on both sides of the substrate on which the resin composite layers 42a were formed so as to have a thickness of 30 μm, and a drying process was carried out under conditions of 70° C. for 20 minutes and 70° C. for 30 minutes, and thus, layers 34' of a solder resist composition were formed (see FIG. 13A).

The solder resist composition was prepared by mixing 46.67 g of a photosensitive oligomer (molecular weight: 4000), where 50% of the epoxy group in 60 wt % of a cresol novolac type epoxy resin (made by Nippon Kayaku Co., Ltd.) dissolved in DMDG was converted to acryl, 6.67 g of 80 wt % of a bisphenol A type epoxy resin (Epikote 1001, made by Yuka Shell Epoxy K.K.) dissolved in methyl ethyl ketone, 6.67 g of a bisphenol A type epoxy resin solution (80% resin) (Epikote 1001B80, made by Yuka Shell Epoxy K.K.), 1.6 g of an imidazole hardening agent (trade name: 2E4MZ-CN, made by Shikoku Chemicals Corporation), 1.5 g of a multivalent acryl monomer (trade name: R604, made by Nippon Kayaku Co., Ltd.), which is a photosensitive monomer, 3.0 g of multivalent acryl monomer (trade name: DPE6A, made by Kyoeisha Chemical Co., Ltd.), which is also a photosensitive monomer, and 0.36 g of a leveling agent, and furthermore, adding 2 g of benzophenone (made by Kanto Chemical Co., Inc.) as an optical initiator, 0.2 g of Michler's ketone (made by Kanto Chemical Co., Inc.) as an optical sensitizer and 0.6 g of DMDG as a solvent to this mixture, and adjusting the viscosity to 2.0 Pa·s at 25° C.

Here, the viscosity was measured using a B type viscometer (type DVL-B, made by Tokyo Keiki Co., Ltd.), with a rotor No. 4 in the case of 60 rpm and a rotor No. 3 in the case of 6 rpm.

(20) Next, a photo mask having a thickness of 5 mm where patterns of openings for forming solder bumps were drawn was made to make contact with the layer of a solder resist composition 34' on the IC chip mounting-side, and then exposed to ultraviolet rays of 1000 mJ/cm$^2$, and a development process was carried out using a DMTG solution, and thus, the openings were created.

Figure 13B:
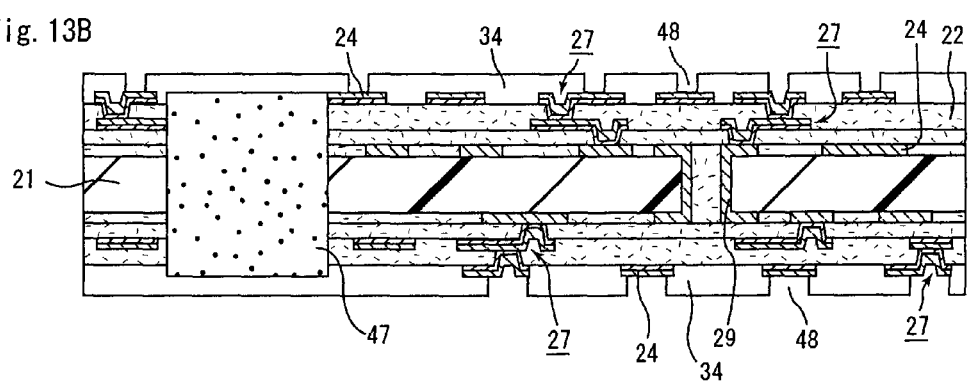

Furthermore, heat treatment was carried out under conditions of 80° C. for one hour, 100° C. for one hour, 120° C. for one hour and 150° C. for three hours, respectively, so that the layers of a solder resist composition cured, and thus, solder resist layers 34 each having a thickness of 20 μm and having openings for forming solder bumps 48 in a predetermined form were formed (see FIG. 13B).

(21) After that, the substrate on which the solder resist layers 34 were formed was immersed in an electroless nickel plating solution having a pH of 4.5 and including nickel chloride ($2.3 \times 10^{-1}$ mol/L), sodium hypophosphite ($2.8 \times 10^{-1}$ mol/L) and sodium citrate ($1.6 \times 10^{-1}$ mol/L) for 20 minutes, and thus, nickel plating layers having a thickness of 5 μm were formed in the openings for forming solder bumps 48. Furthermore, this substrate was immersed in an electroless gold plating solution including gold potassium cyanide ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/L) under conditions of 80° C. for 7.5 minutes, and thus, gold plating layers having a thickness of 0.03 μm were formed on the nickel plating layers for the formation of solder pads 36.

Figure 13C:
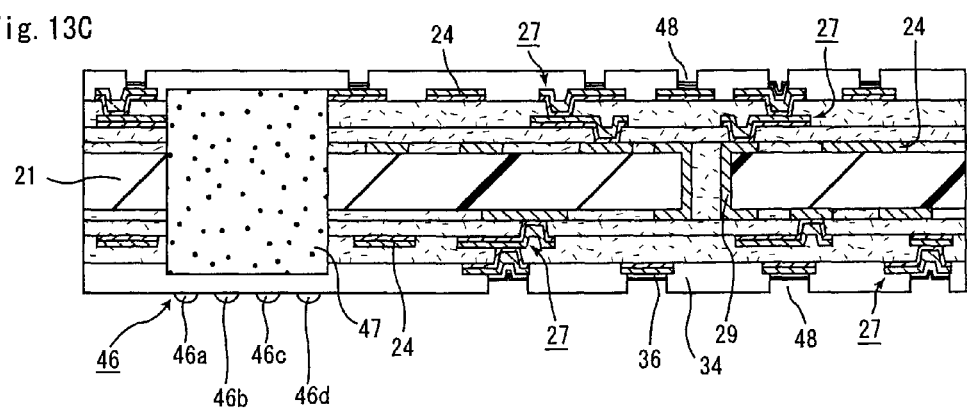

(22) Next, an inkjet apparatus was used to provide microlenses 46a to 46d on the solder resist layer 34 on the side opposite to the underfill which was to be formed in the subsequent process in accordance with the following method (see FIG. 13C).

That is to say, a UV (ultraviolet) curing epoxy based resin (transmittance: 94%/mm, refractive index after curing: 1.53) was prepared so as to have a viscosity of 20 cps at room temperature (25° C.), and after that, this resin was adjusted so as to have a viscosity of 8 cps at a temperature of 40° C. within the resin container of the inkjet apparatus, and subsequently, the resin was applied in predetermined places on the solder resist layer 34 in hemispherical form with a diameter of 220 μm and a degree of sagging of 9 μm, and furthermore, irradiated with UV light (500 mW/min) so that the resin was cured, and thus, microlenses 46a to 46d were provided.

Figure 14A:
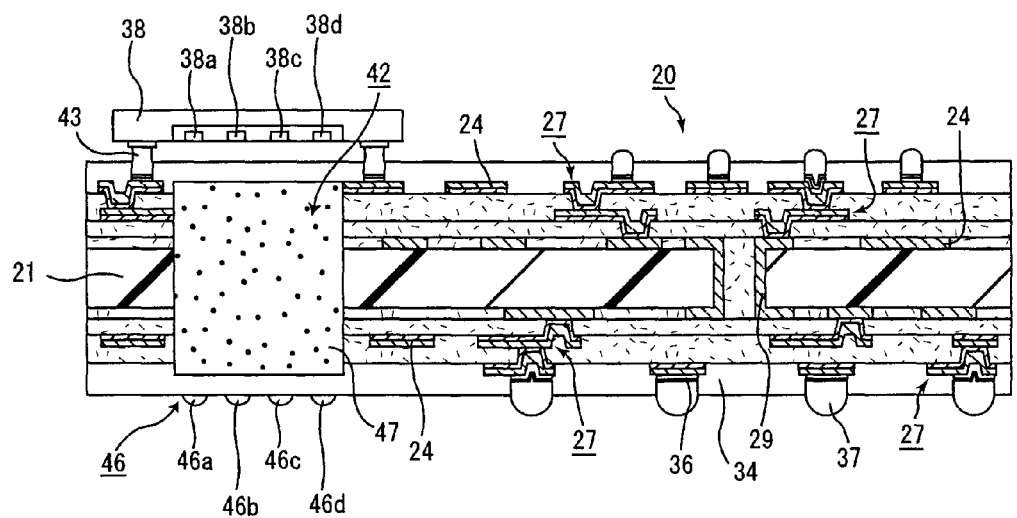
FIGS. 14A and 14B are cross-sectional views that schematically show a part of the method for manufacturing a package substrate according to one embodiment of the present invention.

(23) Next, a solder paste was printed on the openings for forming solder bumps 47 which were formed in the solder resist layers 34, and furthermore, a light emitting element 38 was attached while positioning a light emitting portion 38a, and reflow was carried out at 200° C., and thus, the light emitting element 38 was mounted, and at the same time, solder bumps 37 were formed in the openings for forming solder bumps 48 (see FIG. 14A).

Figure 14B:
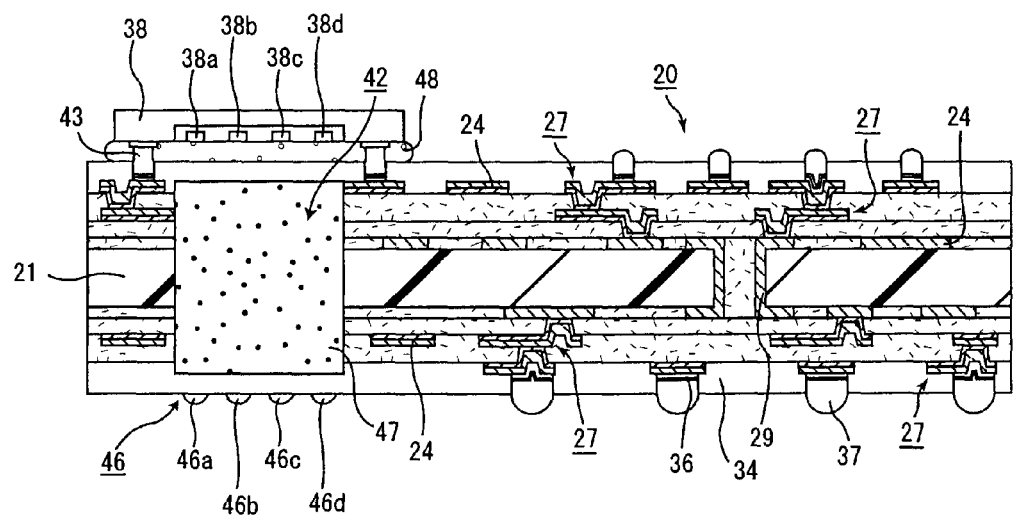

Subsequently, a resin for an underfill adjusted to have the transmittance of 80%/mm, the CTE of 30 ppm and the viscosity of 50 cps was prepared by adding 60% by weight of pulverized silica having a particle size distribution from 0.1 μm to 0.8 μm to an epoxy based resin (transmittance: 90%/mm, CTE: 73 ppm), and after that, this resin for an underfill was applied around the surroundings of the light emitting element and left to penetrate into the gap (50 μm) between the light emitting element and the solder resist layer, and this resin for an underfill was cured under conditions of 120° C. for one hour and 150° C. for two hours to form an underfill. Through these processes, the package substrate was obtained (see FIG. 14B).

Here, the transmittance of the solder resist layers formed in the present example for light having a wavelength for communication (850 nm) was 91% when the thickness was 30 μm.

In addition, as the light emitting element 38, a VCSEL made of InGaAsP was used.

Example 2

A package substrate was manufactured in the same manner as in Example 1, except that a flip chip type PINPD was attached as a light receiving element instead of the light emitting element in the process (23) in Example 1.

Comparative Example 1

A package substrate was manufactured in the same manner as in Example 1, except that a commercially available solder resist composition (RPZ-1, made by Hitachi Chemical Co., Ltd.) was used in a process corresponding to the process (19) in Example 1.

Here, the transmittance of the solder resist layers which were formed in the present comparative example for light having a wavelength for communication (850 nm) was no 20% or less at a thickness of 30 μm.

Comparative Example 2

A package substrate was manufactured in the same manner as in Example 1, except that an opening connecting to the through hole for an optical path was simultaneously created when openings for forming solder bumps were created in the process (20) in Example 1.

Here, the opening that was created in the solder resist layer so as to connect to the through hole for an optical path in the present comparative example was to function as a portion of the optical path for transmitting an optical signal in the package substrate.

As for the package substrates according to Example 1 and Comparative Examples 1 and 2, first, an IC chip was mounted on the package substrate, and after that, a detector was attached to end portions of the optical path for transmitting optical light in the package substrate on the side opposite to the side on which the light emitting element was mounted, and an optical signal was emitted from the light emitting element, and then, the optical signal was detected by the detector.

As a result of this, a desired optical signal could be detected in the package substrates according to Example 1 and Comparative Example 2.

Meanwhile, an optical signal sometimes failed to be detected in the package substrates according to Comparative Examples 1 and 2, and in addition, detected noise was great in comparison with the package substrate according to Example 1. This is presumably because the transmittance of the solder resist layers was low, making transmission loss too great.

In addition as for the package substrate according to Example 2, first, an IC chip was mounted on the package substrate, and after that, an optical fiber was attached to a end portion of the optical path for transmitting an optical signal in the package substrate on the side opposite to the side on which the light receiving element was mounted, and an optical signal was emitted via this optical fiber and the optical signal was detected by the light receiving element.

As a result of this, a desired optical signal could be detected in the package substrate according to Example 2.

Next, as for the package substrates according to Examples 1 and 2, as well as Comparative Example 2, a liquid phase temperature cycle test where one cycle includes three minutes at −55° C. and three minutes at 125° C. was carried out on each package substrate in 250 cycles, 500 cycles and 1000 cycles. After that, the transmissivity of an optical signal was evaluated for each package substrate using the above-described method. As a result of this, it was found that a desired optical signal could be detected even after 1000 cycles in the package substrates according to Examples 1 and 2, while the number of package substrates which could not transmit an optical signal gradually increased as the number of cycles increased in the package substrate according to Comparative Example 2.

In addition, after 1000 cycles were carried out in the liquid phase temperature cycle test, the package substrate was cut crosswise and when the periphery of the optical path for transmitting an optical signal was observed, no peeling was observed in the interface between the resin composite and the insulating layer within the optical path for transmitting an optical signal in the package substrates according to Examples 1 and 2. Meanwhile, peeling was observed in the interface between the resin composite and the insulating layer within the optical path for transmitting an optical signal in the package substrate according to the Comparative Example 2, and cracking was also observed within the resin composite. Thus, presumably, this was considered to be the cause of obstruction in the transmission of an optical signal.

Example 3

A. Manufacturing of Resin Film for Insulating Layer

A resin film for an insulating layer was manufactured in the same manner as in the process A in Example 1.

B. Preparation of Resin Composite for Filling Through Hole

A resin composite for filling a through hole was prepared in the same manner as in the process B in Example 1.

Figure 15A:
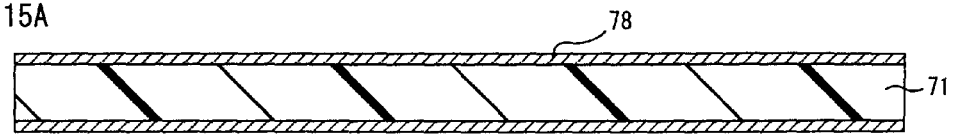
FIGS. 15A to 15F are cross sectional views that schematically show a part of a method for manufacturing a substrate for motherboard which constitutes a device for optical communication according to one embodiment of the present invention.

C. Manufacturing of Substrate for a Motherboard (1) A copper-clad laminated board, prepared by laminating a 18 μm-thick copper foil 78 on both surfaces of an insulating substrate 71 made of a glass epoxy resin or a BT (bismaleimide-triazine) resin having a thickness of 0.8 mm, was used as a starting material (see FIG. 15A). First, this copper-clad laminated board was drilled and electroless-plated, and a pattern-wise etching was carried thereon to form a conductor circuit 74 and a through hole 79 on both surfaces of the substrate 71.

Figure 15B:
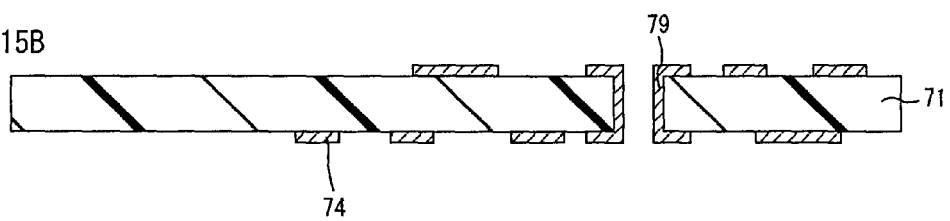

(2) The substrate formed with the through hole 79 and the conductor circuit 74 was rinsed with water and dried. Then, blackening treatment using an aqueous solution containing NaOH (10 g/L), NaClO$_2$ (40 g/L) and Na$_3$PO$_4$ (6 g/L) as a blackening bath (oxidation bath) and reduction treatment using an aqueous solution containing NaOH (10 g/L) and NaBH$_4$ (6 g/L) as a reduction bath were carried out to form a roughened surface (not shown) on the conductor circuit 74 including the through hole 79 (see FIG. 15B).

(3) Within 24 hours after preparing the resin filling described in the above-described B, layers 80' of the resin filling were formed through the following method, inside the through hole 79, and on the conductor circuit non-forming portion and on the outer peripheral portion of the conductor circuit 74, both of which the position is on either of the surfaces of the substrate 71.

Figure 15C:
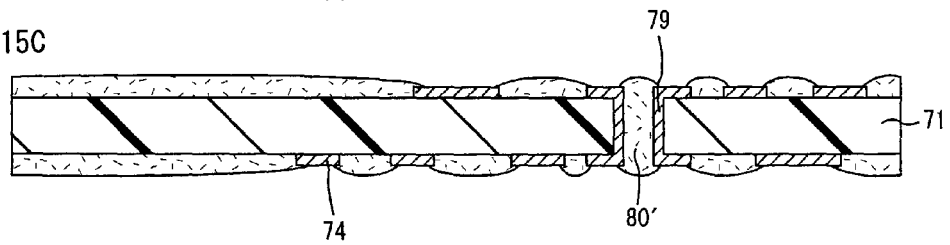

That is, first, after the resin filling had been pressed into the through hole by using a squeezee, the filled-in resin was dried at 100° C. for 20 minutes. Then, a mask having an opening at a portion corresponding to the conductor circuit non-forming portion was placed on the substrate, and by using a squeezee, the resin filling was also filled into the conductor circuit non-forming portion in a recess shape (cavity shape), and dried at 100° C. for 20 minutes, thereby the layers 80' of the resin filling were formed (see FIG. 15C).

(4) The one side face of the substrate treated as in the above (3) was polished with a belt sander polishing using a belt polishing paper #600 (made by Sankyo Rikagaku Co., Ltd.) so as to leave no resin filling 80' on the surface of the conductor circuit 74 and the land surface of the through hole 79, and buffing polishing was carried out to remove scratches caused by the belt sander polishing. A series of this polishing process was carried out on the opposite side of the substrate as well.

Then, heat treatment was carried out for 1 hour at 100° C., for 3 hours at 120° C., for 1 hour at 150° C. and for 7 hours at 180° C., such that a resin filling layer 80 was formed.

Figure 15D:
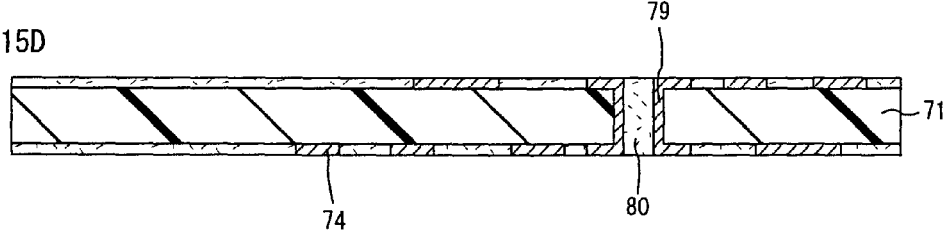
Figure 15E:
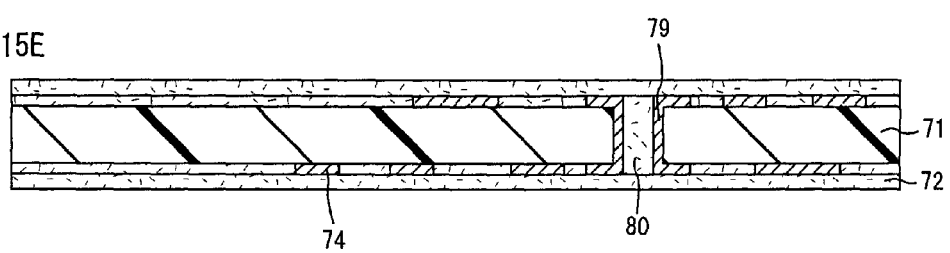

In this manner, an insulating substrate (see FIG. 15D), in which the surface layer portion of the resin filling material 80 formed in the through hole 79 and the conductor circuit non-forming portion as well as the surface of the conductor circuit 74 were flattened; the resin filling material 80 and the side surfaces of the conductor circuit 74 were firmly joined together via the roughened surface (not shown); and the inner wall face of the through hole 79 and the resin filling material 80 were firmly joined together via the roughened surface (not shown), was obtained (see FIG. 15D).

Through these processes, the surface of the resin filling material 80 became coplanar with the surface of the conductor circuit 74.

(5) Then, the substrate washed with water and acid-degreased, and then soft-etched, and after spraying an etchant over both surfaces of the substrate, the surface of the conductor circuit 74 and the land surface and inner wall of the through hole 79 were etched, such that a roughened surface (not shown) was formed over the entire surface of the conductor circuit 74. As the etchant, an etchant (MECetchBOND made by Mec Co., Ltd.) containing 10 parts by weight of imidazole copper (II) complex, 7 parts by weight of glycolic acid and 5 parts by weight of potassium chloride was used.

(6) Then, a resin film for an insulating layer, which was slightly larger than the substrate manufactured in the above-described process A, was placed on the substrate, and temporarily pressure-bonded thereto under conditions of a pressure of 0.4 MPa, a temperature of 80° C. and a press-bonding time of 10 seconds, and then a cutting process was carried out thereon, and the resulting film was affixed by using a vacuum laminator apparatus through the following method, such that an insulating layer 72 was formed (see FIG. 17E).

That is, the resin film for an insulating layer was actually pressure-bonded onto the substrate under conditions of a degree of vacuum of 65 Pa, a pressure of 0.4 MPa, a temperature of 80° C. and a press-bonding time of 60 seconds, and then heated for curing at 170° C. for 30 minutes.

Figure 15F:
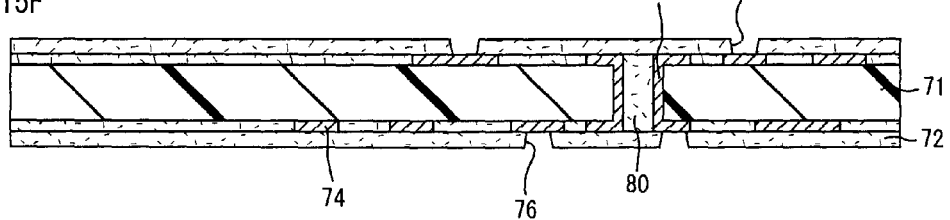

(7) Next, an opening 76 for a via hole of 80 μm in diameter was formed on the insulating layer 72 (see FIG. 15F) by applying a $CO_2$ gas laser having a wavelength of 10.4 μm onto the insulating layer 72 via a mask of 1.2 mm in thickness in which a through hole was formed, under conditions of one shot of a beam diameter of 4.0 mm, in a top-hat mode, a pulse width of 8.0 μs, and the through hole of the mask having 1.0 mm in diameter.

(8) The substrate in which the opening 76 for a via hole had been formed was immersed in a solution containing permanganate of 60 g/L at 80° C. for 10 minutes, and epoxy resin particles remaining on the surface of the insulating layer 72 were dissolved and removed, such that a roughened surface (not shown) was formed on the surface including the inner wall faces of the opening 76 for a via hole.

(9) Next, the substrate that had been through the above-described processes was immersed in a neutral solution (made by Shipley Co., Ltd.), and then washed with water.

On the surface of the surface-roughened substrate (roughened depth: 3 μm), a palladium catalyst was applied to deposit the catalyst nucleus on the surface of the insulating layer 72 (including the inner wall faces of the opening 76 for a via hole) (not shown). In other words, the substrate was immersed in a catalyst solution containing palladium chloride ($PdCl_2$) and stannous chloride ($SnCl_2$), such that, by deposition of palladium metal, the catalyst was applied thereto.

Figure 16A:
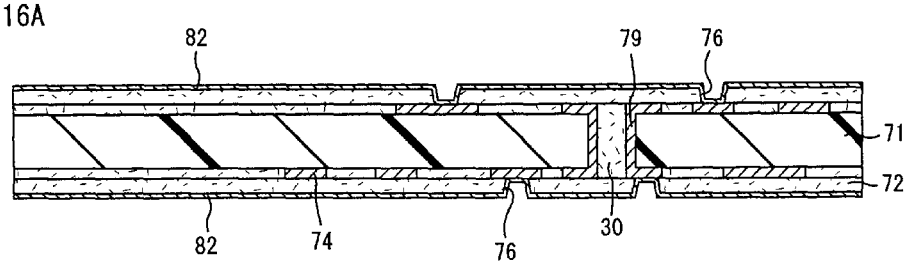
FIGS. 16A to 16D are cross-sectional views that schematically show a part of a method for manufacturing a substrate for motherboard which constitutes a device for optical communication according to one embodiment of the present invention.

(10) Next, the substrate was immersed in an electroless copper plating solution of the following composition, to form a thin-film conductor layer (electroless copper plating film) 82, 0.6 to 3.0 μm in thickness, on the surface of the insulating layer 72 (including the inner wall faces of the opening 76 for a via hole) (see FIG. 16A).

| [Electroless plating solution] | |
| --- | --- |
| $NiSO_4$ | 0.003 mol/L |
| Tartaric acid | 0.200 mol/L |
| Copper sulfate | 0.030 mol/L |
| HCHO | 0.050 mol/L |
| NaOH | 0.100 mol/L |
| α,α'-bipyridyl | 100 mg/L |
| polyethylene glycol (PEG) | 0.10 g/L |
| [Conditions for Electroless Plating] | |
| Solution temperature of 30° C. for 40 minutes | |

Figure 16B:
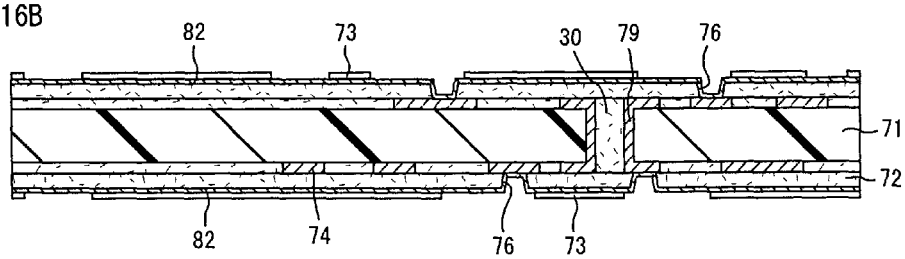

(11) A commercially available photosensitive dry film was affixed to the substrate on which the thin-film conductor layer (electroless copper plating film) 82 was formed, and with a mask set in position, an exposure at 100 mJ/cm² and a development with a 0.8% sodium carbonate solution were carried out to provide a 20 μm-thick plating resist 73 (see FIG. 16B).

Figure 16C:
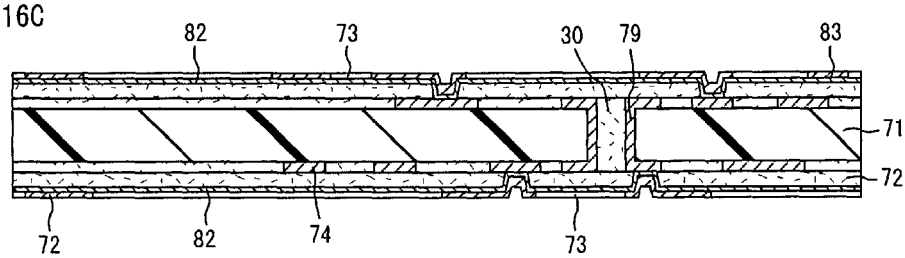

(12) Then, the substrate washed with water at 50° C. to be degreased, and after having been washed with water at 25° C., the resulting substrate was further washed with sulfuric acid, and then electrolytic plating was carried out thereon under the following conditions, such that a 20 μm-thick electrolytic copper plating film 83 was formed on the plating resist 73 non-forming portion (see FIG. 16C).

| [Electrolytic Plating Solution] | |
| --- | --- |
| Sulfuric acid | 2.24 mol/l |
| Copper Sulfate | 0.26 mol/l |
| Additive | 19.5 ml/l |
| (Copperacid HL, made by Atotech Japan K.K.) | |
| [Conditions for electrolytic plating] | |
| Current density | 1 A/dm² |
| Time | 65 min |
| Temperature | 22 ± 2° C. |

Figure 16D:
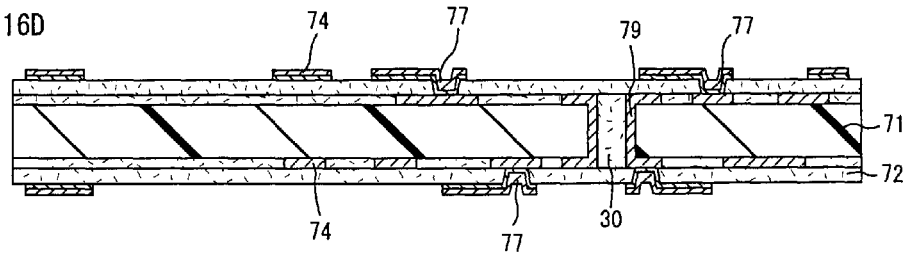

(13) Then, after the plating resist 73 was separated with 5% NaOH, the thin-film conductor layer beneath the plating resist 73 was etched and dissolved with a mixed solution of sulfuric acid and hydrogen peroxide to form a 18 μm-thick conductor circuit 74 (including via hole 77), constituted by the thin-film conductor layer (electroless copper plating film) 82 and the electrolytic copper plating film 83, was formed (see FIG. 16D).

(14) By using the same etchant as the etchant used in the above process (5), a roughened surface (not shown) was formed on the surface of the conductor circuit 74, and the same processes as those in the processes (6) to (8) were carried out, so that an insulating layer 72, which had an opening 76 for a via hole and was provided with the roughened surface (not shown) formed on its surface, was formed and laminated.

Figure 17A:
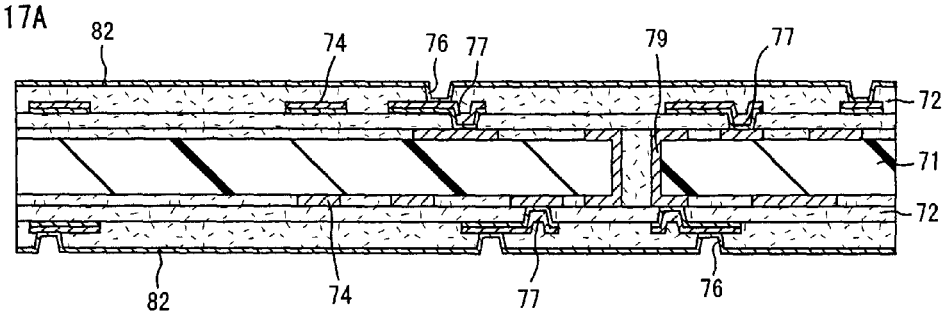
FIGS. 17A to 17D are cross-sectional views that schematically show a part of the method for manufacturing a substrate for motherboard which constitutes a device for optical communication according to one embodiment of the present invention.

(15) Next, by using the same method as the method used in the process (9), a catalyst was applied to the surface of the insulating layer 72 (including inner wall faces of the opening 76 for a via hole), and the substrate was immersed in the same electroless copper plating aqueous solution as the electroless plating solution used in the process (10), such that a thin-film conductor layer (electroless copper plating film) 82 was formed on the surface of the insulating layer 72 (including inner wall faces of the opening 76 for a via hole) (see FIG. 17A).

Figure 17B:
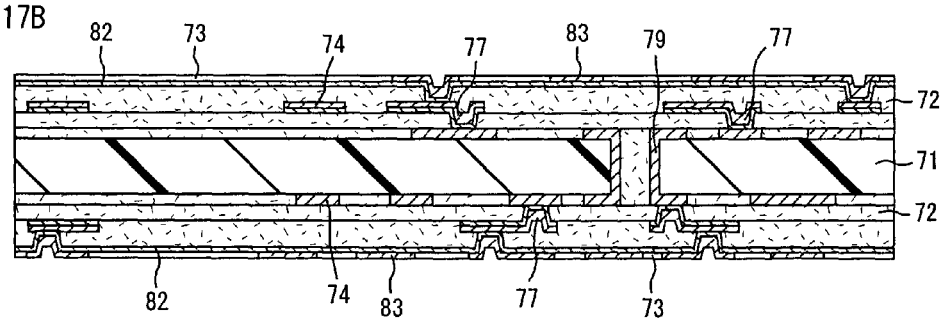

(16) By using the same method as the method used in the process (11), a plating resist 73 was provided, and by using the same method as the method used in the process (12), a 20 μm-thick electrolytic copper plating film 83 was formed on the plating resist 73 non-forming portion (see FIG. 17B).

Figure 17C:
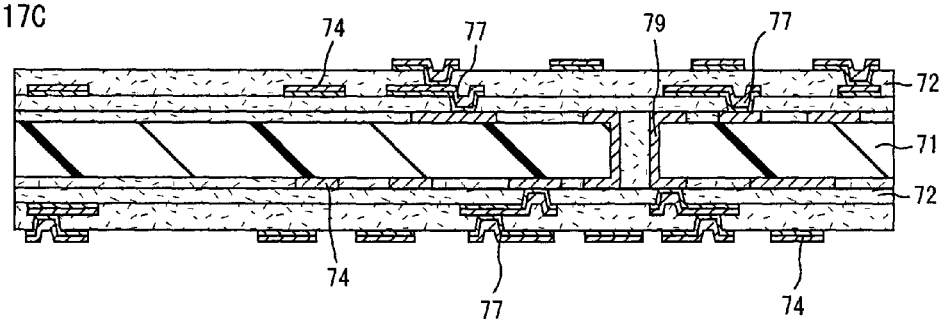

(17) By using the same method as the method used in the process (13), the plating resist 73 was separated and the thin-film conductor layer beneath the plating resist 73 was removed to form a conductor circuit 74 (including via hole 77) (see FIG. 17C).

Furthermore, by using the same method as the method used in the process (2), oxidation-reduction treatment was carried out to form a roughened surface (not shown) on the surface of the conductor circuit 74.

Figure 17D:
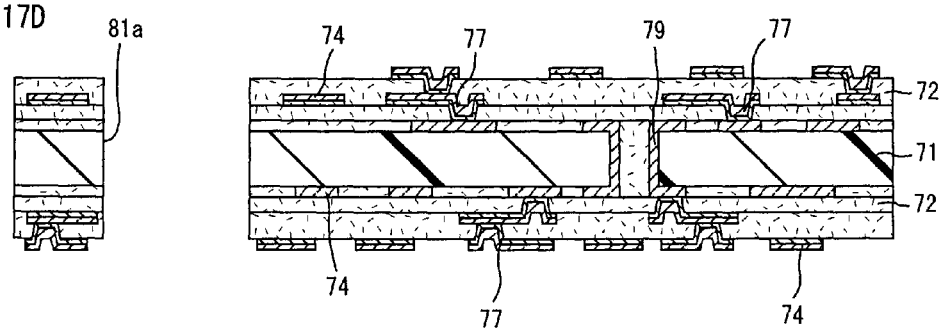

Thereafter, a through hole 81a for an optical path (having a rectangle shape with rounded corners (240 μm in length× 1000 μm in width) in a plan view), which penetrates through the substrate 71 and the insulating layer 72, was formed by drilling, and desmear treatment was carried out on the wall faces of the through hole 81a for an optical path (see FIG. 17D). In this case, the through hole 81a for an optical path of the collective through hole structure was formed.

Figure 18A:
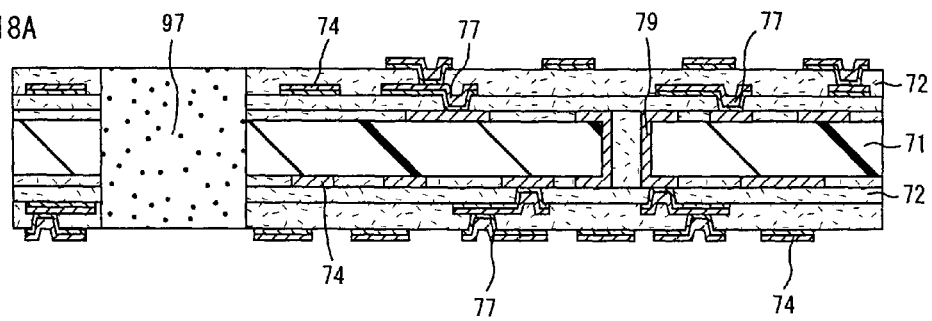
FIGS. 18A to 18D are cross-sectional views that schematically show a part of the method for manufacturing a substrate for motherboard which constitutes a device for optical communication according to one embodiment of the present invention.

(18) Next, resin was placed on a plugging mask of a printing apparatus and a screen printing was carried out, so that the through hole 81a for an optical path was filled in with the resin, and this was then cured at 120° C. for one hour and at 150° C. for one hour. Thereafter, the resin protruding from the through hole 81a for an optical path was polished with a polishing paper #3000, and further polished with alumina particles of 0.05 μm to flatten the surface so that a resin composite layer 97 was formed (see FIG. 18A).

In this process, the resin was prepared by adding 40% by weight of pulverized silica having a grain-size distribution of 0.1 to 0.8 μm to epoxy resin (transmittance 91%, CTE 82 ppm) so as to set the transmittance to 82%, the CTE to 42 ppm, and the viscosity to 200000 cps, and the resulting resin was used.

(19) Next, by using the following method, an optical waveguide 50 with four cores 51a to 51d arranged therein in parallel with one another was formed at an end portion of the through hole 96 for an optical path in which the resin composite layer 97 was formed.

First, an acrylic-based resin (refractive index: 1.52, transmittance: 94%/mm, CTE: 72 ppm) as a resin for forming a core, and a resin for forming a clad made by adding 25% by weight of pulverized silica having a grain-size distribution of 0.1 to 0.8 μm to an acrylic-based resin (refractive index: 1.51, transmittance: 93%/mm, CTE: 70 ppm) so as to set the transmittance, to 81%/mm the CTE to 53 ppm and the viscosity to 1000 cps, were prepared.

Figure 18B:
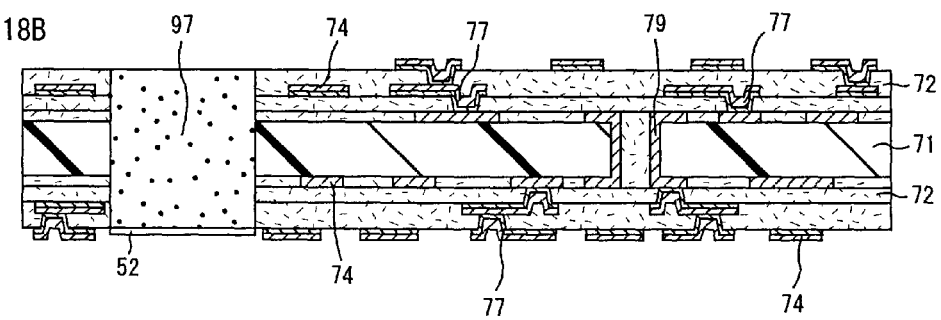

The resin for forming a clad was applied to an end portion of the through hole for an optical path by using a spin coater (1000 μm/10 sec), and then pre-baking at 80° C. for 10 minutes, exposure process at 2000 mJ and post-baking at 150° C. for 1 hour were carried out to form a lower clad of 50 μm in thickness (see FIG. 18B).

Figure 18C:
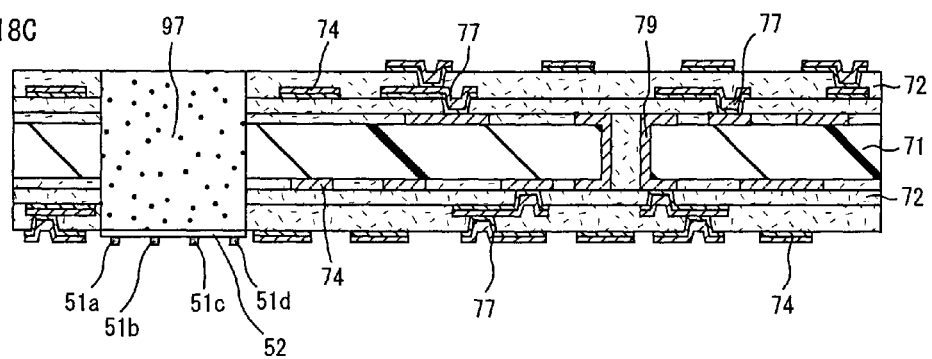

Next, the resin for forming a core was applied onto the lower clad 52 by using a spin coater (1200 μm/10 sec), and then pre-baking at 80° C. for 10 minutes, exposure process at 1000 mJ and development process through a dipping process using 1% TMH for 2 minutes, and post-baking at 15° C. for 1 hour were carried out to form cores 51a to 51d, each having a size of 50 μm in width×50 μm in thickness (see FIG. 18C).

Next, the resin for forming a clad was applied thereto by using a spin coater (1000 μm/10 sec), and then pre-baking at 80° C. for 10 minutes, exposure process at 2000 mJ, and post-baking at 150° C. for 1 hour were carried out to form an upper clad with a thickness of 50 μm from the core, and thus, an optical waveguide 50 constituted by the cores 51a to 51d and the clad 52 were prepared.

Thereafter, a dicing process was carried out on both ends of the optical waveguide 50 by using #3000 blade with 90 degrees to form an optical path conversion mirror which converts an optical path to 90 degrees. Here, the transmission loss in the optical path conversion mirror thus formed was 1.2 dB.

Figure 18D:
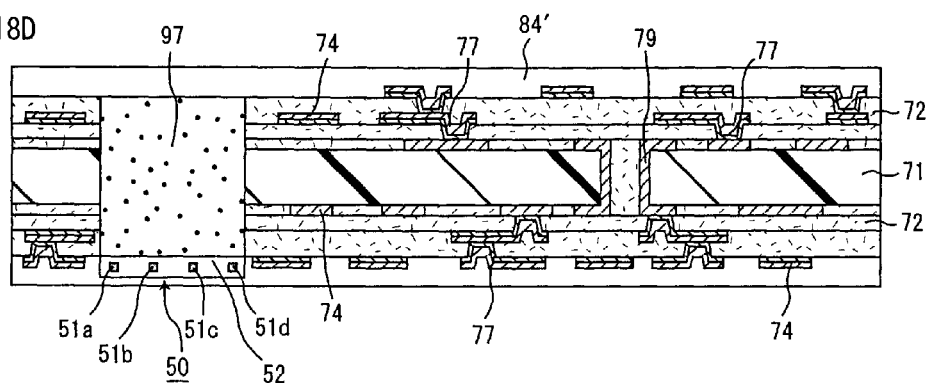

(20) Next, a solder resist composition was prepared in the same manner as the process (19) of Example 1, and the solder resist composition was then applied with a thickness of 30 μm to each of both surfaces of the substrate, and then drying treatment at 70° C. for 20 minutes and at 70° C. for 30 minutes was carried out, such that a layer 84' of the solder resist composition was formed (see FIG. 18D)

(21) After that, a 5 mm-thick photomask having patterns of openings for forming solder bumps drawn thereon, was made in close contact with the layer 84' of the solder resist composition on the opposite side from the side on which the optical waveguide 50 was formed, an exposure with ultraviolet rays at 1000 mJ/cm$^2$ and a development with DMTG solution were carried out to form openings 98 for forming solder bumps.

Further, the layer of the solder resist composition was cured by heating treatment under conditions at 80° C. for one hour, at 100° C. for one hour, at 120° C. for one hour and at 150° C. for 3 hours so that a solder resist layer 84 with a thickness of 20 μm having openings 99 for forming solder bumps and opening 81b for optical paths was formed (see FIG. 21A).

(22) Next, on the substrate with the solder resist layer 34 formed thereon, solder pads 86 were formed by using the same processes as those in the process (22) of Example 1.

(23) Next, microlenses 96a to 96d were provided on the solder resist layer 84 that was formed on the side opposite to the side where the optical waveguide was formed in the same manner as in the process (22) of Example 1.

Figure 19A:
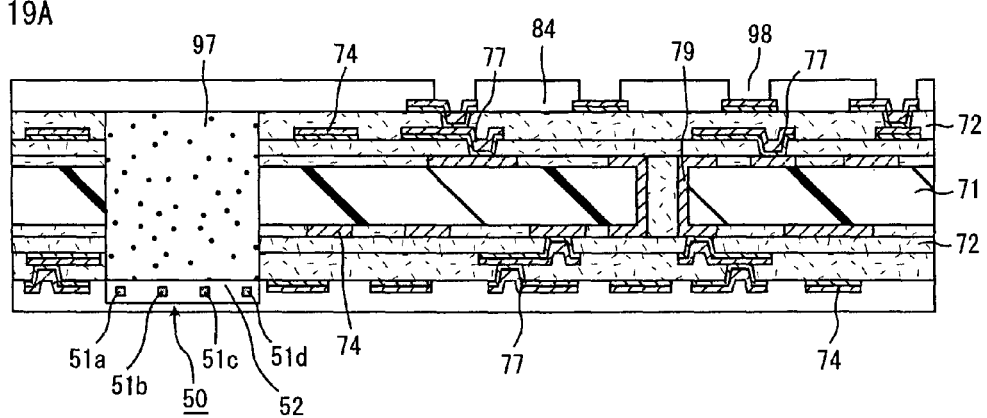
FIGS. 19A and 19B are cross-sectional views that schematically show a part of the method for manufacturing a substrate for motherboard which constitutes a device for optical communication according to one embodiment of the present invention.
Figure 19B:
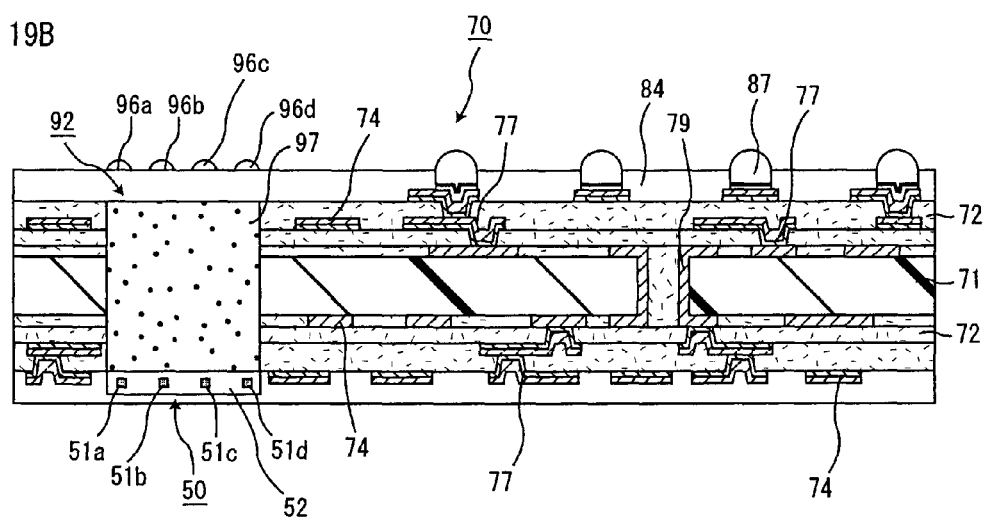

(24) Next, solder paste was printed on the openings 98B for forming solder bumps formed in the solder resist layer 84, such that solder bumps 87 were formed; thus, a substrate for a motherboard was obtained (see FIG. 19B).

D. Manufacture of Device for Optical Communication

An IC chip was mounted on each of the package substrates which were manufactured in Examples 1 and 2, and furthermore, the IC chip was sealed with a resin and after that, this package substrate was placed in a predetermined location so as to face the substrate for a motherboard manufactured in the above-described process C, and then, reflow was carried out at 200° C., and thereby, the solder bumps on the two substrates were connected to each other so that solder connection portions were formed.

Subsequently, 60% by weight of pulverized silica having a particle size distribution from 0.1 μm to 0.8 μm was added to an epoxy based resin (transmittance: 90%/mm, CTE: 73 ppm) so that a resin for an underfill having a transmittance of 80%/mm, a CTE of 30 ppm and a viscosity of 50 cps was prepared, and after that, this resin for an underfill was applied to the surroundings around the package substrate and left to penetrate into the gap (300 μm) between the package substrate and the solder resist layer, and furthermore, this resin for an underfill was hardened under the conditions of 120° C. for one hour and 150° C. for two hours, and thereby, an underfill was formed.

A device for optical communication was obtained through the above-described processes.

Comparative Example 3

A substrate for a motherboard was manufactured in the same manner as in Example 1, except that an opening connecting to the through hole for an optical path was created at the same time as the creation of openings for forming solder bumps in the process corresponding to the process (21) of Example 3.

Here, in the present comparative example, the opening that was created in the solder resist layer so as to connect to the through hole for an optical path was to function as a portion of the optical path for transmitting an optical signal in the substrate for a motherboard.

With regard to the devices for optical communication according to Example 3 and Comparative Example 3, the optical signal transmission performance was evaluated in accordance with the following method.

That is to say, light was emitted from the light emitting element on the substrate on which an IC chip was mounted, and an optical signal that was transmitted via an optical path for transmitting an optical signal on the package substrate, an optical path for transmitting an optical signal on the substrate for a motherboard, the optical waveguide, the other optical path for transmitting an optical signal on the substrate for a motherboard and the other optical path for transmitting an optical signal on the package substrate was received by the light receiving element on the package substrate, and thus, the eye pattern (1-pattern) of the electrical ( ) signal passed through the receiver IC was observed.

As a result of this, transmission of 1.25 Gbps and transmission of 2.5 Gbps could both be carried out in the devices for optical communication according to Example 3 and Comparative Example 3.

Next, with regard to the devices for optical communication according to Example 3 and Comparative Example 3, a liquid phase temperature cycle test where one cycle consists of three minutes at −55° C. and three minutes at 125° C. were carried out on each device for optical communication in 250 cycles, 500 cycles and 1000 cycles. After that, the transmissivity of an optical signal was evaluated for each device for optical communication using the above-described method. As a result, it was found that a desired optical signal could be detected even after 1000 cycles in the device for optical communication according to Example 3, while the number of devices for optical communication which could not transmit an optical signal gradually increased as the number of cycles increased in the device for optical communication according to Comparative Example 3.

In addition, after 1000 cycles were carried out in the liquid phase temperature cycle test, the device for optical communication was cut crosswise (cross-section) and when the periphery of the optical path for transmitting an optical signal in the substrate for a motherboard was observed, no peeling and no cracking was observed in the interface between the resin composite and the insulating layer within the optical path for transmitting an optical signal in the substrate for a motherboard that forms the device for optical communication according to Example 3. Meanwhile, peeling was observed in the interface between the resin composite and the insulating layer within the optical path for transmitting an optical signal in the substrate for a motherboard which forms the device for optical communication according to the Comparative Example 2, and cracking was also observed within the resin composite. Thus, presumably, this was considered to be the cause of obstruction in the transmission of an optical signal.

In addition, the transmissivity of an optical signal was evaluated in accordance with the following method for the package substrate or the solder resist layer used in the device for optical communication according to the embodiments of the present invention.

Here, a substrate for measuring transmission loss which has the same configuration as of the device for optical communication according to the embodiments of the present invention was manufactured through the below described processes (1) to (5).

(1) A substrate having copper layers pasted and formed on the entirety of both sides thereof with a thickness of 1 mm was used as a starting material, and a through hole for an optical path was drilled in this substrate where copper was pasted to both sides.

After that, the through hole for an optical path was filled in with a resin composite, and furthermore, a polishing treatment was carried out so that the surfaces of the above-described substrate and the end portions of the resin composite filled in the through hole for an optical path was flattened.

(2) A resist film for forming a pattern was laminated on a surface (including an end portion of the above-described resin composite) of the substrate where copper was pasted to both sides, and furthermore, light exposing and development process was carried out, and thereby, a resist mask was formed on the above-described substrate where copper was pasted to both sides. Subsequently, the solid copper layers on the portions where the resist mask was not formed were removed entirely through etching, and thus, conductor circuits (electrodes for mounting an optical element and a circuit pattern) were formed. After that, the above-described resist mask was peeled and removed using an alkaline solution.

(3) A solder resist composition was applied to both sides of the substrate where copper was pasted to both sides having conductor circuits formed thereon, and furthermore, light exposing and development processes as well as a hardening process were carried out, and thus, a solder resist layer having openings for forming soldier bumps was formed.

(4) Next, a light emitting element (VCSEL) and a light receiving element (PD) were mounted through flip chip bonding using solder connections on the substrate on which a solder resist layer was formed, and driving IC's (driver IC and amplifying IC) were mounted and connected through wire bonding, and furthermore, resistors and capacitors were mounted at predetermined portions. After that, a transparent underfill was provided beneath the optical elements (light receiving element and light emitting element) and hardened.

(5) Finally, an optical waveguide in film form made of an epoxy resin which is formed of a core and a clad, and furthermore, has reflective mirrors formed of an Au/Cr vapor deposition film (layer) on the two end portions thereof, was pasted to a predetermined location on the solder resist layer on the side opposite to the side where optical elements were mounted in the above-described process (4) using an optical adhesive (made of a UV setting epoxy resin).

Here, positioning of the optical waveguide was carried out while making the light emitting element emit light, and then the optical waveguide was attached to a location where the power of light received by the light receiving element became maximum.

Figure 20:
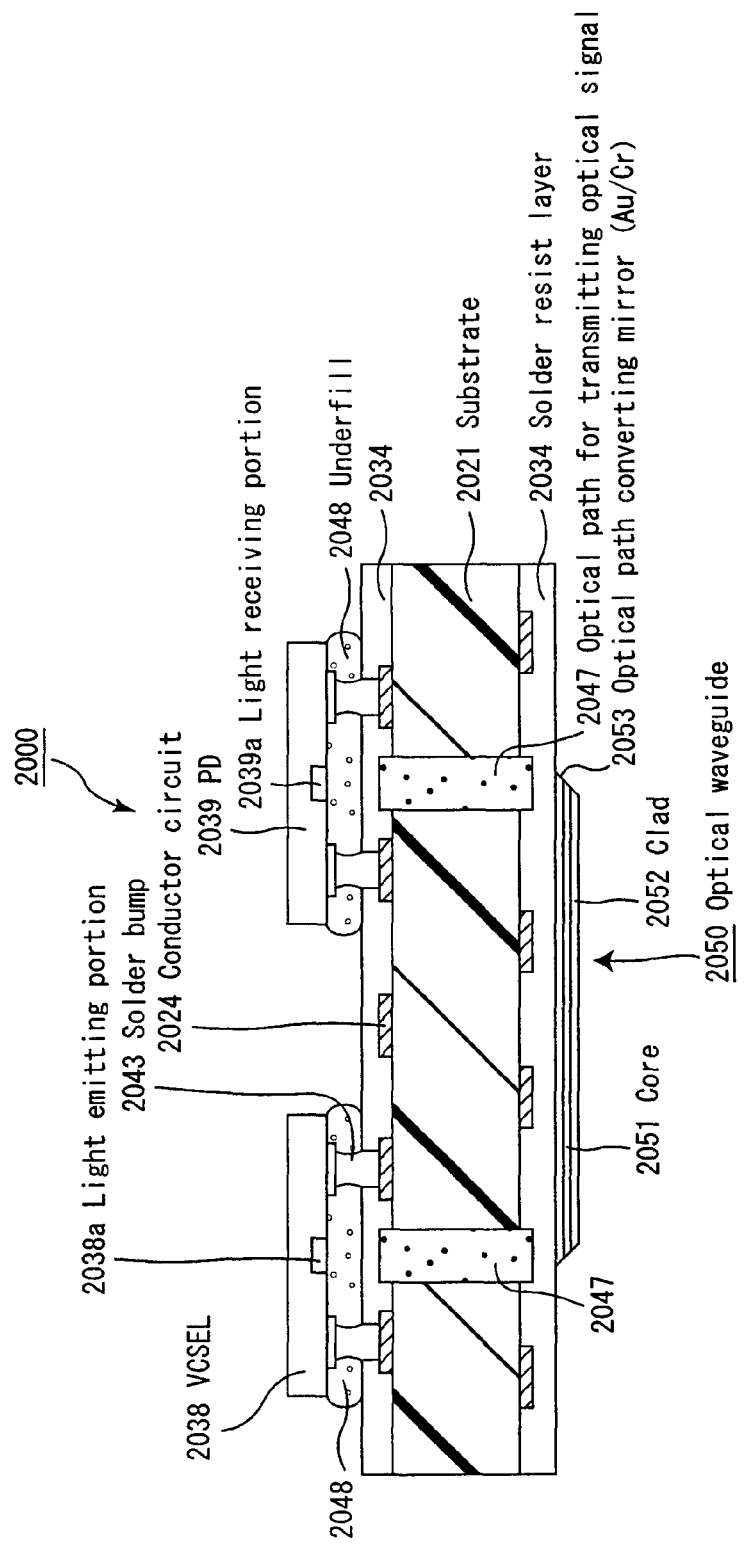
FIG. 20 is a cross sectional diagram schematically showing a substrate for measuring transmission loss.

A substrate for measuring transmission loss 2000 as shown in FIG. 20 was prepared through the above-described processes.

Here, FIG. 20 is a cross sectional diagram schematically showing the above-described substrate for measuring transmission loss.

Here, the VCSEL and the PD mounted on the substrate for measuring transmission loss 2000 were commercially available in the general market and the output of the VCSEL was 3 dBm and the PD could receive light at −15 dBm.

Accordingly, in the case where light is transmitted from the VCSEL to the PD in the substrate for measuring transmission loss 2000 at a rate of 2.5 Gbps, light can be transmitted even when the transmission loss is 18 dB, and the bit error is supposed to be $1.0 \times 10^{-12}$ or less in the optical transmission of this case.

In addition, in the case where light is transmitted from the VCSEL to the PD at a rate of 10 Gbps, light can be transmitted even when the transmission loss is 14 dB, and the bit error is supposed to be $1.0 \times 10^{-12}$ or less in the optical transmission of this case.

In this substrate for measuring transmission loss 2000, loss was calculated in the case where an optical signal emitted from the light emitting portion 2038a of the VCSEL 2038 could be received by the light receiving portion 2039 of the PD 2039 after the optical signal (850 nm) transmitted via the transparent underfill 2048, a solder resist layer 2034, an optical path for transmitting an optical signal 2047 which was filled in with a resin composite, the other solder resist layer 2034, the optical waveguide 2050, the solder resist layer 2034, the other optical path of transmitting an optical signal which is filled in with the resin composite 2047, the solder resist layer 2034 and the transparent underfill 2048.

The transmittance of the transparent underfill 2048 formed in the substrate for measuring transmission loss 2000 was 91%/mm for light having a wavelength of 850 nm, and the distance between the surface of the solder resist layer and each of the light receiving surfaces and the light emitting surfaces was 50 μm. Accordingly, in the light transmission via this underfill, it can be presumed that a transmission loss of 0.02 dB occurs every time light transmits the underfill.

In addition, the transmittance of the optical path for transmitting an optical signal 2047 which is filled in with a resin composite was 91%/mm for light having a wavelength of 850 nm and the thickness of the substrate where copper was pasted to both sides was 1 mm. Accordingly, in the light transmission via this optical path for transmitting an optical signal, it can be presumed that a transmission loss of 0.41 dB occurs every time light transmits the optical path for transmitting an optical signal.

In addition, the transmission loss of the optical waveguide 2050 made of an epoxy resin was 0.1 dB/cm. Accordingly, it can be presumed that, in the case where the optical waveguide is 50 cm, a transmission loss of 5 dB occurs through the optical transmission via this optical waveguide, and in the case where the optical waveguide is 100 cm, a transmission loss of 10 dB occurs.

In addition, the transmission loss of a optical path converting mirror 2053 which was formed in the optical waveguide 2050 (Cr was vapor deposited on a dicing cut surface, and furthermore, on the surface, an Au vapor deposited mirror surface was formed) was 1.0 dB. Accordingly, it can be presumed that a transmission loss of 1.0 dB occurs every time when a light is reflected from a mirror.

In this substrate for measurement, the maximum transmission loss that could be allowed for a solder resist layer was as follows.

That is to say, in the optical transmission at a rate of 2.5 Gbps, the maximum transmission loss is calculated to be 2.535 dB in the case where the length of the optical waveguide is 50 cm, the maximum transmission loss is calculated to be 1.910 dB in the case where the length of the optical waveguide is 75 cm, and the maximum transmission loss is calculated to be 1.285 dB in the case where the length of the optical waveguide is 100 cm. In addition, in the optical transmission at a rate of 10 Gbps, the maximum transmission loss is calculated to be 1.535 dB in the case where the length of the optical waveguide is 50 cm, the maximum transmission loss is calculated to be 0.910 dB in the case where the length of the optical waveguide is 75 cm, and the maximum transmission loss is calculated to be 0.285 dB in the case where the length of the optical waveguide is 100 cm. Here, the maximum transmission loss was calculated by ignoring the transmission loss, which was about 0.01 dB to 0.2 dB, caused by the positional difference of the optical elements and the optical path for transmitting an optical signal (about several μm to 20 μm) and the positional difference of the optical path for transmitting an optical signal and the optical path converting mirror (about several μm to 20 μm), as well as the transmission loss, which was about 0.2 dB, caused by the reflection from the resin composite filled in the optical path for transmitting an optical signal.

Here, since the transmission loss allowable as a whole in optical transmission at a rate of, for example, 2.5 Gbps is generally considered to be 18 dB, the above-mentioned allowable maximum transmission loss was calculated by subtracting the sum of the transmission loss in the constituent members other than the solder resist layers (underfill, optical path for transmitting an optical signal, optical waveguide (including optical path converting mirrors)) from 18 dB. In the same manner, calculation of the maximum transmission loss was carried out in the case of an optical transmission at a rate of 10 Gbps.

Whether or not an optical signal could be transmitted from the light emitting element (VCSEL) to the light receiving element (PD) was evaluated in each of the cases where one of solder resist layers having a variety of transmittances was formed in a substrate for measurement 2000 as described above. The results are as shown in Table 1. In Table 1, the symbol "○" indicates that the corresponding solder resist is considered to be unable to transmit an optical signal, and the symbol "x", indicates that the corresponding solder resist is considered to be able to transmit an optical signal.

In more specific, the evaluation was carried out on each of the cases where a solder resist layer of which the transmittance for light having a wavelength of 850 nm was (a) 89%/1 mm, (b) 68%/1 mm, (c) 90%/30 μm, (d) 78%/30 μm, (e) 69%/30 μm, (f) 58%/30 μm, (g) 53%/30 μm or (h) 20%/30 μm or less was formed and laminated on both sides of the substrate.

Here, "%/1 mm" means the transmittance of a solder resist layer at a thickness of 1 mm and "%/30 μm" means the transmittance of a solder resist layer at a thickness of 30 μm.

In addition, as the material for the solder resist layers, for the above-described solder resist layers (a) and (b), the same resin composite as the resin composite used for the clad of the optical waveguide was used, and for the above-described solder resist layers (c) to (h), a resin composite used for the formation of a transparent underfill (having the transmittance of 91% for light having a wavelength of 850 nm at a thickness of 30 μm and the refractive index of 1.582) to which silica particles having a refractive index different from that of this resin composite was added was used. At this time, the amount of silica particles added was adjusted so that the transmittance of the added solder resist layer was adjusted.

TABLE 1

| kind of solder resist layer | transmission loss in solder resist layer having thickness of 30 μm (dB) | transmission rate: 2.5 Gbps length of optical waveguide | | | transmission rate: 10 Gbps length of optical waveguide | | |
|---|---|---|---|---|---|---|---|
| | | 50 cm | 75 cm | 100 cm | 50 cm | 75 cm | 100 cm |
| (a) | 0.015 | ○ | ○ | ○ | ○ | ○ | ○ |
| (b) | 0.050 | ○ | ○ | ○ | ○ | ○ | ○ |
| (c) | 0.460 | ○ | ○ | ○ | ○ | ○ | X |
| (d) | 1.070 | ○ | ○ | ○ | ○ | ○ | X |
| (e) | 1.610 | ○ | ○ | X | ○ | X | X |
| (f) | 2.360 | ○ | X | X | X | X | X |
| (g) | 2.750 | X | X | X | X | X | X |
| (h) | 6.990 | X | X | X | X | X | X |

The results of calculation of transmission loss as shown in Table 1 demonstrates the following.

That is to say, in the device for optical communication according to the embodiments of the present invention:

(1) it is considered to be clear that, when the transmittance for light having a wavelength of 850 nm in the solder resist layers having a thickness of 30 μm is 60% or more, optical transmission via an optical waveguide of 50 cm is possible at a transmission rate of 2.5 Gbps;

(2) it is considered to be clear that, when the transmittance for light having a wavelength of 850 nm in the solder resist layers having a thickness of 30 μm is 70% or more, optical transmission via an optical waveguide of 50 cm or 75 cm is possible at a transmission rate of 2.5 Gbps, and optical transmission via an optical waveguide of 50 cm is possible at a transmission rate of 10 Gbps;

(3) it is considered to be clear that, when the transmittance for light having a wavelength of 850 nm in the solder resist layers having a thickness of 30 μm is 80% or more, optical transmission via an optical waveguide of 50 cm, 75 cm or 100 cm is possible at a transmission rate of 2.5 Gbps, and optical transmission via an optical waveguide of 50 cm or 75 cm is possible at a transmission rate of 10 Gbps; and (4) it is considered to be clear that, when the transmittance for light having a wavelength of 850 nm in the solder resist layers having a thickness of 1 mm is 70% or more, optical transmission via an optical waveguide of 50 cm, 75 cm, or 100 cm is possible at a transmission rate of 2.5 Gbps, and optical transmission via an optical waveguide of 50 cm is possible at a transmission rate of 10 Gbps.

In addition, when the transmissivity of the above-described solder resist layers for an optical signal was evaluated in accordance with the same method as the method used in the process (19) in Example 3 using the resin for forming a core and the resin for forming a clad as the solder resist layer, transmission loss in the solder resist layers having a thickness of 30 μm had about the same value as that for the above-described resin (a), and accordingly, it is considered to be clear that, when the resin for forming an optical waveguide is used for the solder resist layers, optical transmission via an optical waveguide of 50 cm, 75 cm or 100 cm is possible at a transmission rate of 2.5 Gbps or 10 Gbps.

What is claimed as new and desired to be secured by Letters Patent of the United States is:

1. A package substrate comprising:
   a laminated body comprising a conductor circuit and an insulating layer;
   a plurality of solder resist layers formed and laminated on both sides of the laminated body, respectively;
   an optical element; and
   an optical path for transmitting an optical signal,
   wherein at least one of the solder resist layers formed and laminated on said laminated body comprises an outermost layer which has a transmittance for light having a wavelength for communication of about 60% or more at a thickness of 30 μm.

2. The package substrate according to claim 1, wherein a refractive index of said outermost layer and a refractive index of said optical path are almost the same.

3. The package substrate according to claim 1, wherein each of said solder resist layers has a thickness of at least about 10 μm and at most about 40 μm.

4. The package substrate according to claim 1, wherein said outermost layer contains inorganic particles.

5. The package substrate according to claim 4, wherein said inorganic particles comprise silica, titania, or alumina.

6. The package substrate according to claim 1, wherein said solder resist layers comprise a solder resist composition comprising at least one resin selected from the group consisting of a polyphenylene ether resin, a polyolefin resin, a fluorine resin, a thermoplastic elastomer, an epoxy resin, a polyimide resin and an acrylic resin, as a resin component.

7. The package substrate according to claim 1, wherein each of the sides of the laminated body has two or more of the solder resist layers formed and laminated.

8. The package substrate according to claim 1, wherein each of the sides of the laminated body has two or more of the solder resist layers formed and laminated, and the optical path is formed in the solder resist layers except said outermost layer so as to penetrate through the solder resist layers.

9. The package substrate according to claim 1, wherein the solder resist layers formed and laminated as the outermost layer on both sides of said laminated body have a transmittance for light having a wavelength for communication of about 60% or more at a thickness of 30 μm.

10. The package substrate according to claim 1, wherein said laminated body comprises a substrate; and said conductor circuit and said insulating layer are provided in a plurality and formed and laminated on both sides of the substrate, the conductor circuits having said substrate therebetween are connected to each other via a through hole, said conductor circuits includes conductor circuits formed and laminated on said insulating layers, and the conductor circuits having one of said insulating layers therebetween are connected to each other via a via hole.

11. A package substrate comprising:
   a laminated body comprising a conductor circuit and an insulating layers;
   a plurality of solder resist layers formed and laminated on both sides of the laminated body, respectively;

an optical element; and an optical path for transmitting an optical signal, wherein a gap between said optical element and the solder resist layer is filled in with an underfill, and at least one of the solder resist layers formed and laminated on said laminated body comprises an outermost layer which has a transmittance for light having a wavelength for communication of about 60% or more at a thickness of 30 µm.

12. The package substrate according to claim 11, wherein said underfill has a transmittance for light having a wavelength for communication of about 70%/mm or more.

13. The package substrate according to claim 11, wherein the outermost layer is formed and laminated on one of the sides of the laminated body where said optical element is mounted, and a refractive index of said outermost layer and a refractive index of said underfill are substantially a same.

14. The package substrate according to claim 11, wherein particles are mixed in said underfill.

15. The package substrate according to claim 14, wherein an amount of the mixed particles is at least about 20% by weight and at most about 70% by weight.

16. The package substrate according to claim 11, wherein each of the solder resist layers comprises the outermost layer formed and laminated on said laminated body.

17. A package substrate comprising:
a laminated body comprising a conductor circuit and an insulating layer;
a plurality of solder resist layers formed and laminated on both sides of the laminated body, respectively;
an optical element; and
an optical path for transmitting an optical signal,
wherein an end portion of said optical path is covered with one of said solder resist layers, and at least one of the solder resist layers formed and laminated on said laminated body comprises an outermost layer which has a transmittance for light having a wavelength for communication of about 60% or more at a thickness of 30 µm.

18. The package substrate according to claim 17, wherein said optical path has a collective through hole structure, an individual through hole structure, or a recess shape.

19. The package substrate according to claim 18, wherein said optical path has a collective through hole structure, and a planar shape of the optical path is substantially a rectangle, a racetrack or an ellipse, the planar shape having a size of at least about 100 µm and at most about 5 mm with respect to each of a length and a width thereof.

20. The package substrate according to claim 18, wherein said optical path has an individual through hole structure, and a planar shape of the optical path is substantially a circle with a diameter of at least about 100 µm and at most about 500 µm.

21. The package substrate according to claim 18, wherein said optical element is a multi-channel optical element having a pitch between respective channels of 250 µm, said optical path has the individual through hole structure, and the planar shape of the optical path is substantially a circle with a diameter of at least about 150 µm and at most about 200 µm in diameter.

22. The package substrate according to claim 18, wherein said optical element is a multi-channel optical element having a pitch between respective channels of 500 µm, said optical path has the individual through hole structure, and the planar shape of the optical path is substantially a circle having a size of at least about 150 µm and at most about 450 µm in diameter.

23. The package substrate according to claim 17, wherein said optical path has a transmittance for light having a wavelength for communication of about 70%/mm or more.

24. The package substrate according to claim 17, wherein a conductor layer is formed on a wall surface of said optical path.

25. The package substrate according to claim 17, wherein the solder resist layers formed and laminated as the outermost layer on both sides of said laminated body have each a transmittance for light having a wavelength for communication of about 60% or more at a thickness of 30 µm.

26. A package substrate comprising:
a laminated body comprising a conductor circuit and an insulating layer;
a plurality of solder resist layers formed and laminated on both sides of the laminated body, respectively;
an optical element; and
an optical path for transmitting an optical,
wherein at least a portion of said optical path is formed of a resin composite, an end portion of said optical path is covered with one of said solder resist layers, and at least one of the solder resist layers formed and laminated on said laminated body comprises an outermost layer which has a transmittance for light having a wavelength for communication of about 60% or more at a thickness of 30 µm.

27. The package substrate according to claim 26, wherein said optical path has a transmittance for light having a wavelength for communication of about 70%/mm or more.

28. The package substrate according to claim 26, wherein each of the solder resist layers formed and laminated on said laminated body has a transmittance for light having a wavelength for communication of about 60% or more at a thickness of 30 µm.

29. A package substrate comprising:
a laminated body comprising a conductor circuit and an insulating layer;
a plurality of solder resist layers formed and laminated on both sides of the laminated body, respectively;
an optical element; and
an optical path for transmitting an optical signal,
wherein at least one of the solder resist layers formed and laminated on said laminated body comprises an outermost layer which has a transmittance for light having a wavelength for communication of about 60% or more at a thickness of 30 µm, and a microlens is provided on said outermost layer.

30. The package substrate according to claim 29, wherein the at least one of the solder resist layers formed and laminated as the outermost layer is on an opposite side of a side where said optical element is mounted, and said microlens is provided on said outermost layer.

31. The package substrate according to claim 29, wherein said microlens has a transmittance for light having a wavelength for communication of about 70%/mm or more.

32. The package substrate according to claim 29, wherein the at least one of said solder resist layers formed and laminated as the outermost layer is on one of the sides where said optical element is mounted, a gap between said optical element and the outermost layer is filled in with an underfill, and a refractive index of said microlens is greater than a refractive index of said underfill.

33. The package substrate according to claim 29, wherein said microlens is provided on said outermost layer directly or by interposing an adhesive agent.

34. The package substrate according to claim 29, wherein said microlens is provided on said outermost layer by interposing a lens marker processed with a water repellent treatment or a hydrophilic treatment.

35. The package substrate according to claim 29, wherein said optical element is a multi-channel optical element having a pitch between respective channels of 250 μm, said optical path has a collective through hole structure, and a diameter of said microlens is at least about 100 μm and at most about 240 μm.

36. The package substrate according to claim 29, wherein said optical element is a multi-channel optical element having a pitch between respective channels of 500 μm, said optical path has a collective through hole structure, and a diameter of said microlens is at least about 100 μm and at most about 490 μm.

37. The package substrate according to claim 29, wherein said optical element is a multi-channel optical element having a pitch between respective channels of 250 μm, said optical path has an individual through hole structure, and a diameter of said microlens is at least about 100 μm and at most about 190 μm.

38. The package substrate according to claim 29, wherein said optical element is a multi-channel optical element having a pitch between respective channels of 500 μm, said optical path has an individual through hole structure, and a diameter of said microlens is at least about 100 μm and at most about 490 μm.

39. The package substrate according to claim 29, wherein each of the solder resist layers formed and laminated as the outermost layer on said laminated body has a transmittance for light having a wavelength for communication of about 60% or more at a thickness of 30 μm.

* * * * *